(12) United States Patent
Takahashi

(10) Patent No.: US 10,516,522 B2
(45) Date of Patent: Dec. 24, 2019

(54) RECEIVER, TRANSMITTER, AND COMMUNICATION SYSTEM

(71) Applicant: Sony Corporation, Tokyo (JP)

(72) Inventor: Hiroo Takahashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 107 days.

(21) Appl. No.: 15/316,714

(22) PCT Filed: Jun. 23, 2015

(86) PCT No.: PCT/JP2015/003136
§ 371 (c)(1),
(2) Date: Dec. 6, 2016

(87) PCT Pub. No.: WO2016/006178
PCT Pub. Date: Jan. 14, 2016

(65) Prior Publication Data
US 2017/0195111 A1    Jul. 6, 2017

(30) Foreign Application Priority Data

Jul. 7, 2014    (JP) .................................. 2014-139812

(51) Int. Cl.
*H04L 7/00* (2006.01)
*G06F 13/42* (2006.01)
(Continued)

(52) U.S. Cl.
CPC .............. *H04L 7/0041* (2013.01); *G06F 1/12* (2013.01); *G06F 13/42* (2013.01);
(Continued)

(58) Field of Classification Search
None
See application file for complete search history.

(56) References Cited

U.S. PATENT DOCUMENTS 5,712,882 A * 1/1998 Miller .............. G01R 31/31922
                                                 327/153
6,414,527 B1 * 7/2002 Seno ......................... G06F 1/10
                                                 327/158
(Continued)

FOREIGN PATENT DOCUMENTS

CN           1212399 A      3/1999
CN         101840725 A      9/2010
(Continued)

OTHER PUBLICATIONS

Japanese Office Action dated Dec. 5, 2017 for corresponding Japanese Application No. 2014-139812.
(Continued)

*Primary Examiner* — Paul Yen
(74) *Attorney, Agent, or Firm* — Michael Best & Friedrich LLP

(57) ABSTRACT

A receiver includes a first receiving circuit that receives a first data including a first symbol transmitted using three signals over a first data lane, the first data lane including three signal lines respectively corresponding to the three signals. The first receiving circuit includes a delay adjustment circuit configured to adjust a delay amount of at least one of the three signals.

20 Claims, 36 Drawing Sheets

(51) Int. Cl.
*G06F 1/12* (2006.01)
*H03K 5/159* (2006.01)
*H04L 1/00* (2006.01)
*H03K 5/00* (2006.01)

(52) U.S. Cl.
CPC ......... *G06F 13/4291* (2013.01); *H03K 5/159* (2013.01); *H04L 1/0067* (2013.01); *H03K 2005/00019* (2013.01)

(56) References Cited

U.S. PATENT DOCUMENTS

| | | | | |
|---|---|---|---|---|
| 6,944,692 | B2* | 9/2005 | Smith | G06F 11/24 710/106 |
| 2004/0125902 | A1* | 7/2004 | Nishimura | H03K 5/082 375/371 |
| 2007/0168841 | A1* | 7/2007 | Lakkis | H03M 13/1505 714/781 |
| 2007/0219911 | A1* | 9/2007 | Abe | G06F 21/10 705/51 |
| 2008/0212709 | A1 | 9/2008 | Wiley | |
| 2012/0274564 | A1* | 11/2012 | Cronjaeger | G06F 1/3259 345/166 |
| 2013/0241759 | A1 | 9/2013 | Wiley et al. | |

FOREIGN PATENT DOCUMENTS

| | | |
|---|---|---|
| CN | 101848334 A | 9/2010 |
| CN | 103678218 A | 3/2014 |
| JP | 2004-193817 A | 7/2004 |
| JP | 2007-318807 A | 12/2007 |
| JP | 2007-329870 A | 12/2007 |
| JP | 2008-278518 A | 11/2008 |
| JP | 2008-294795 A | 12/2008 |
| JP | 2012-124716 A | 6/2012 |
| JP | 2013-183425 A | 9/2013 |
| JP | 2013-251877 A | 12/2013 |
| WO | WO-2012/147258 A1 | 11/2012 |
| WO | 2009/086078 A1 | 7/2019 |

OTHER PUBLICATIONS

European Communication Pursuant to Article 94 (3) EPC dated Jan. 24, 2018 in corresponding European Application No. 15 739 342.2.
Chinese Office Action dated Apr. 22, 2019 for corresponding Chinese Application No. 2015800357581.
European Patent Office communication for Summons to Attend Oral Proceedings Pursuant to Rule 115(1) EPC dated Jun. 12, 2019 for corresponding European Application No. 15739342.2.

* cited by examiner

[ FIG. 1 ]
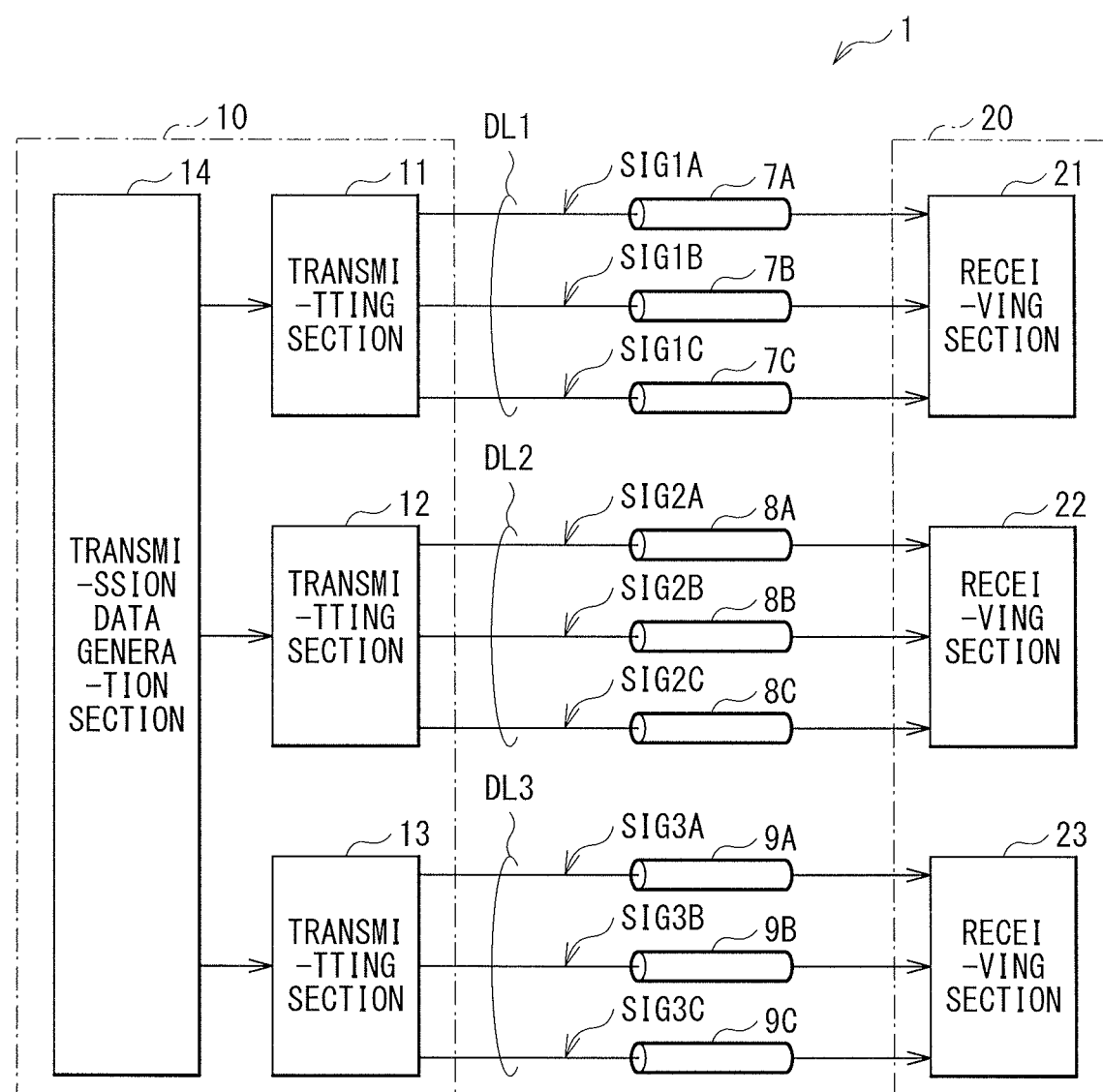

[FIG. 2]
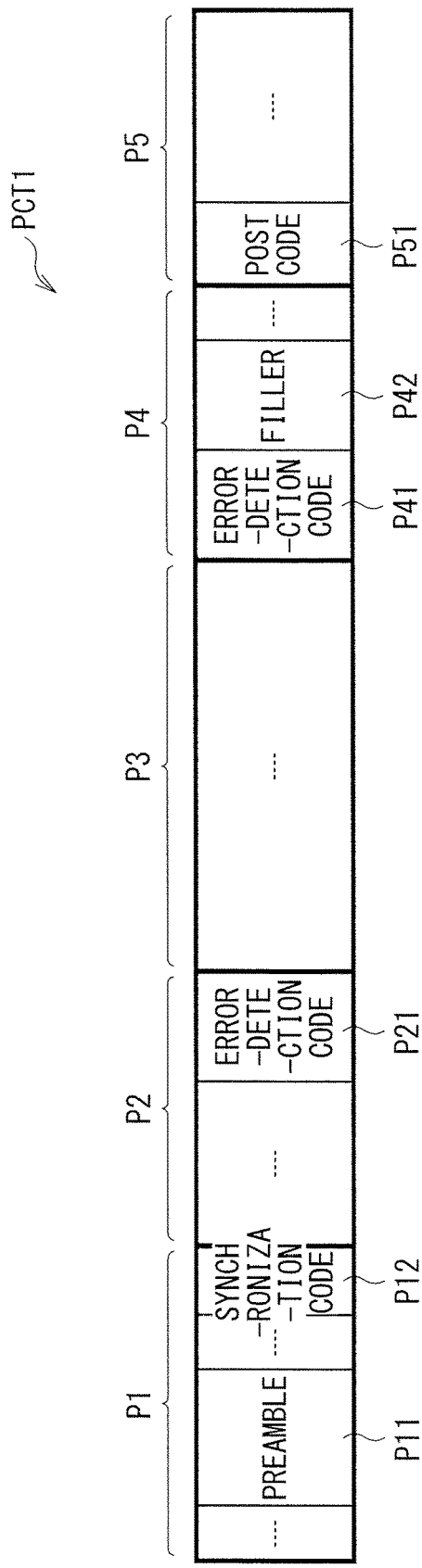

[ FIG. 3 ]
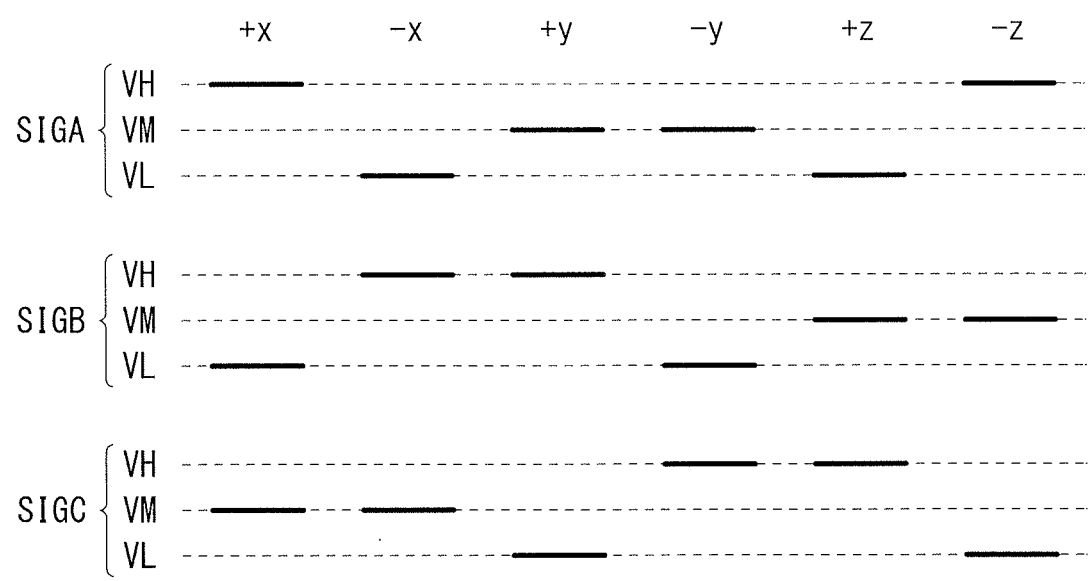

[FIG. 4]
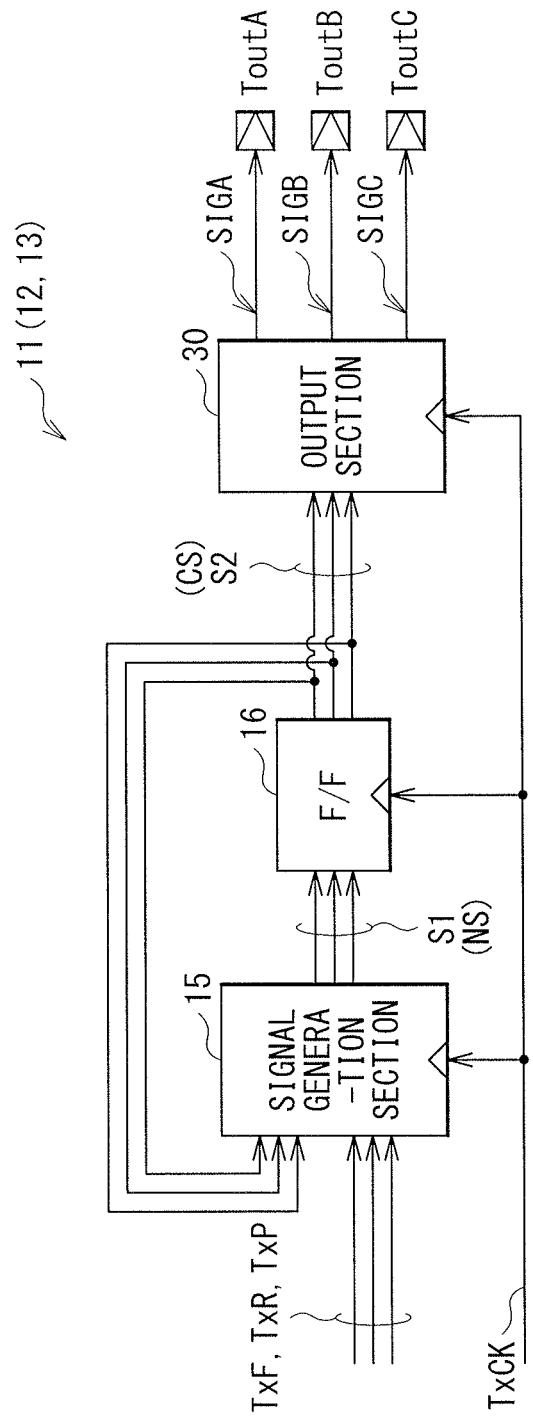

[ FIG. 5 ]
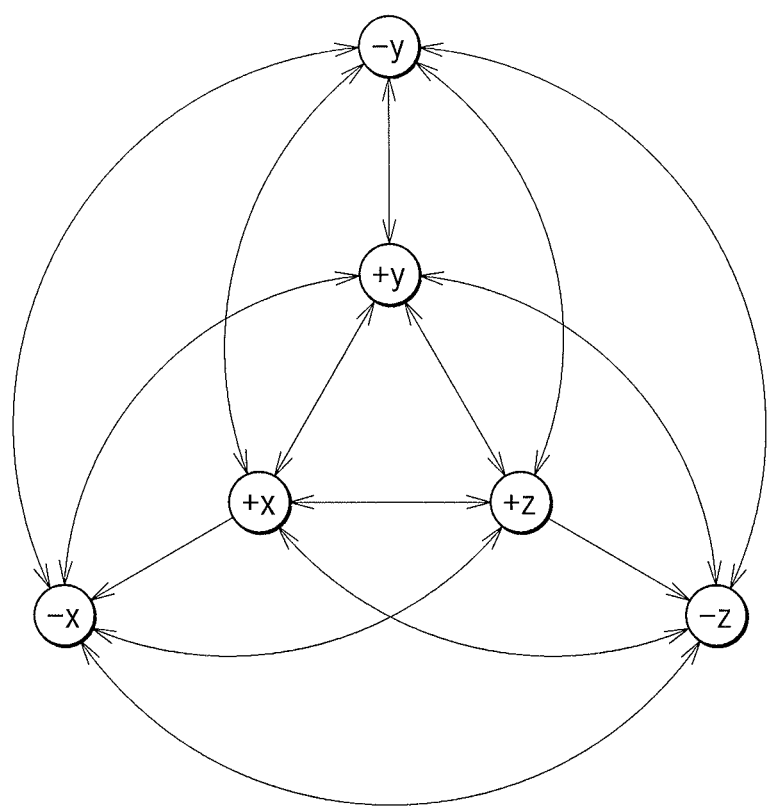

[ FIG. 6 ]
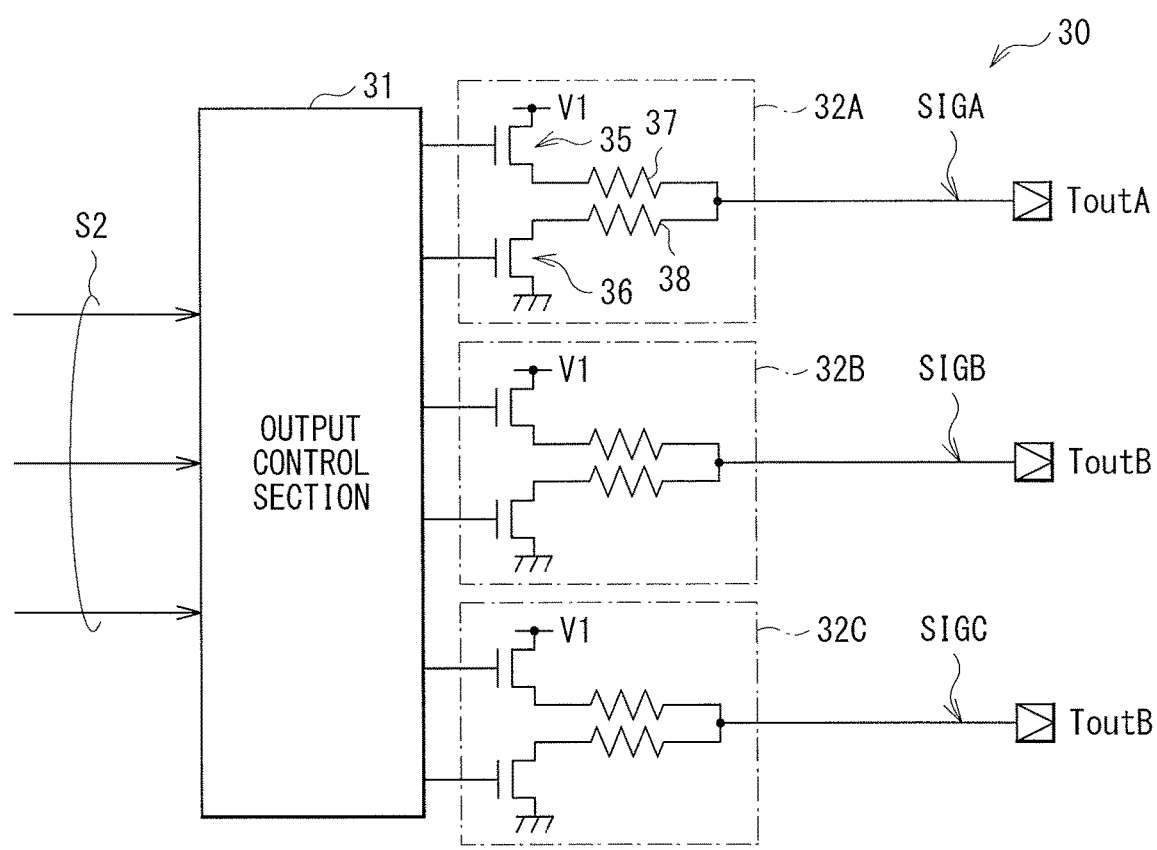

[FIG. 7]
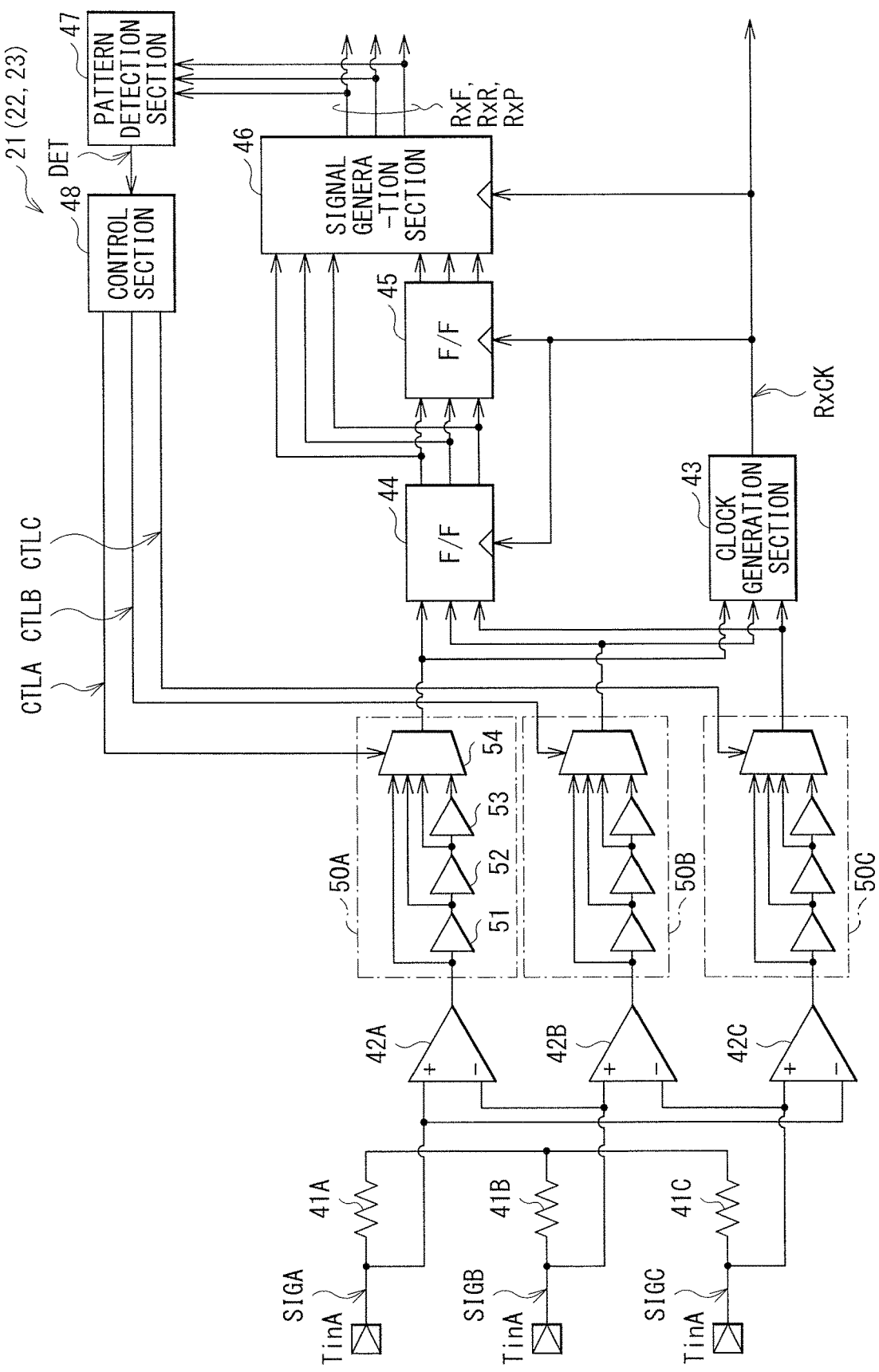

[ FIG. 8 ]
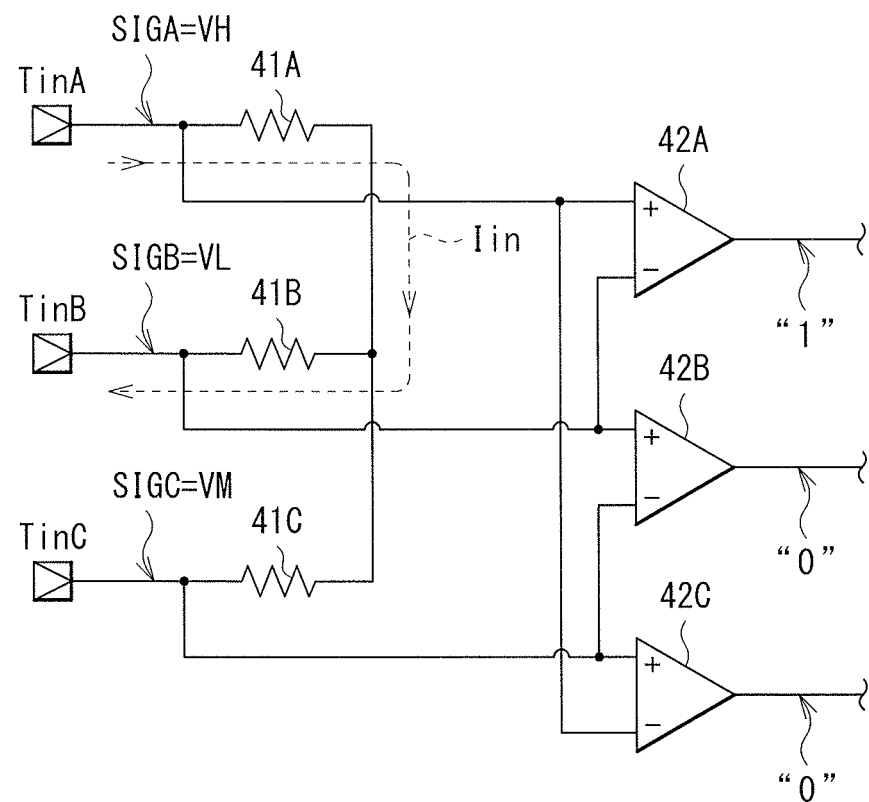

[ FIG. 9 ]
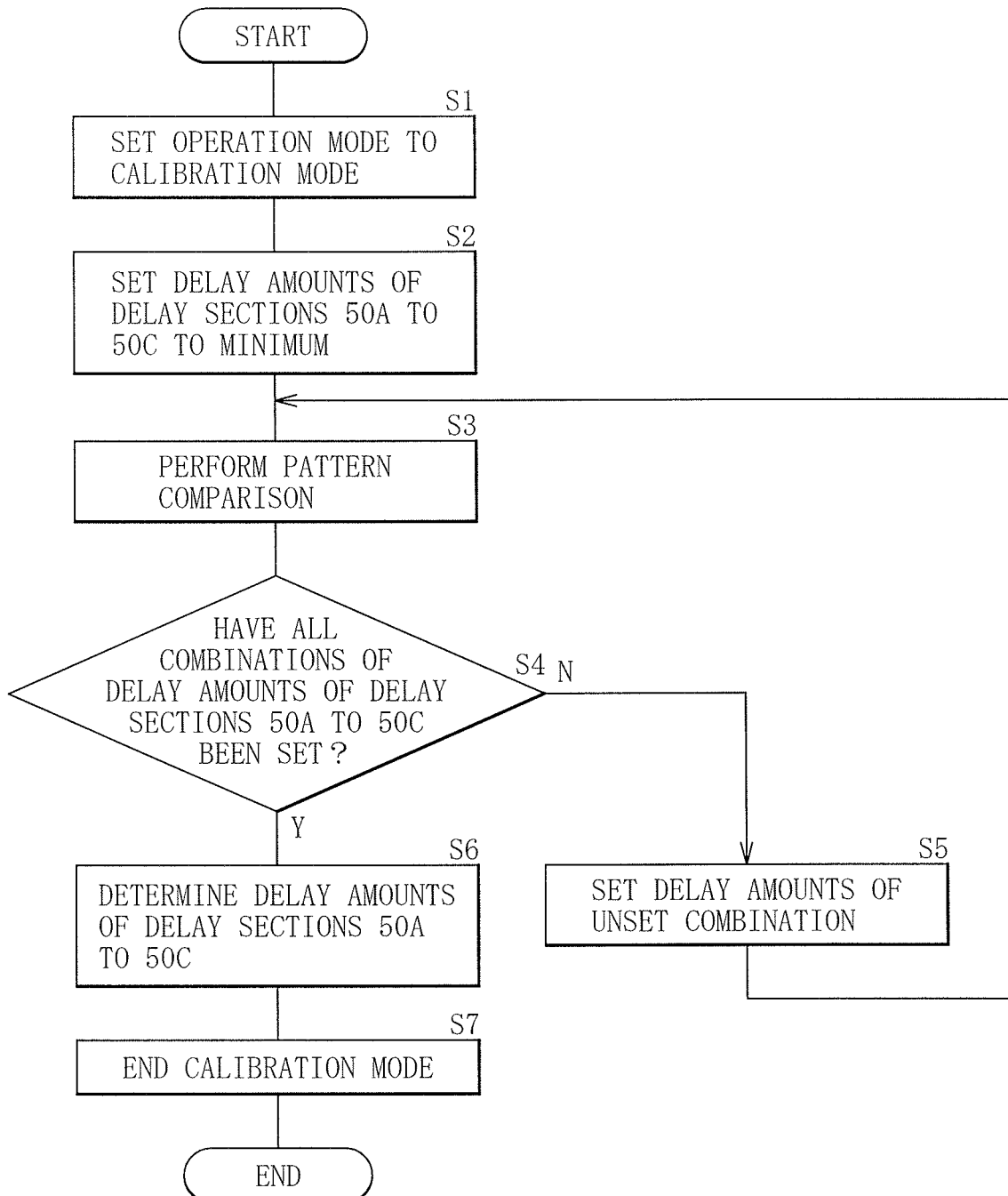

[ FIG. 10A ]
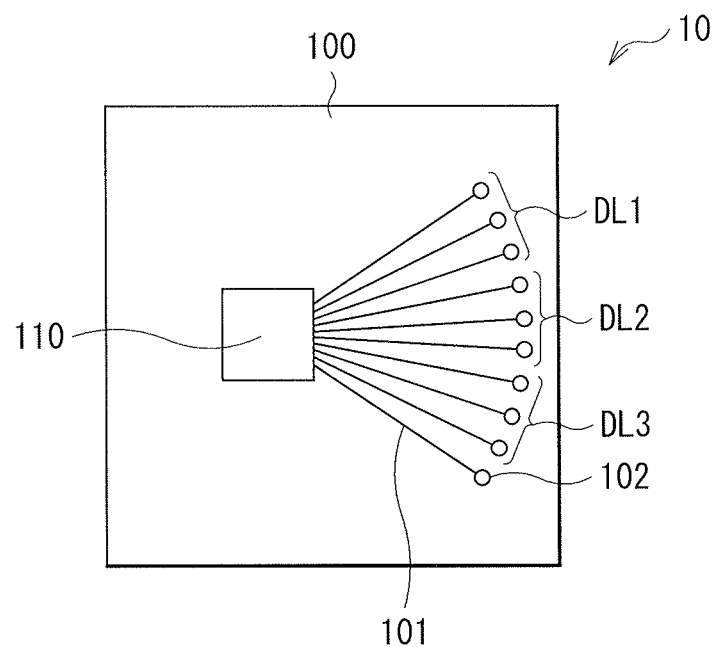
[ FIG. 10B ]
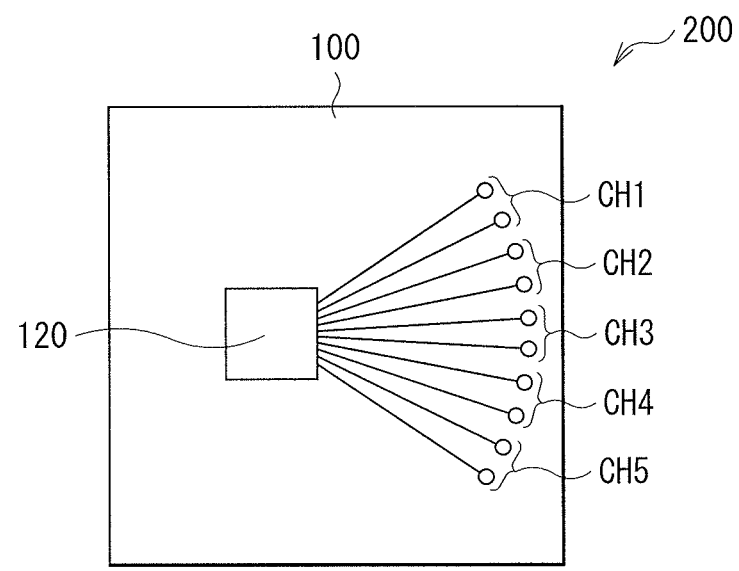

[ FIG. 11 ]
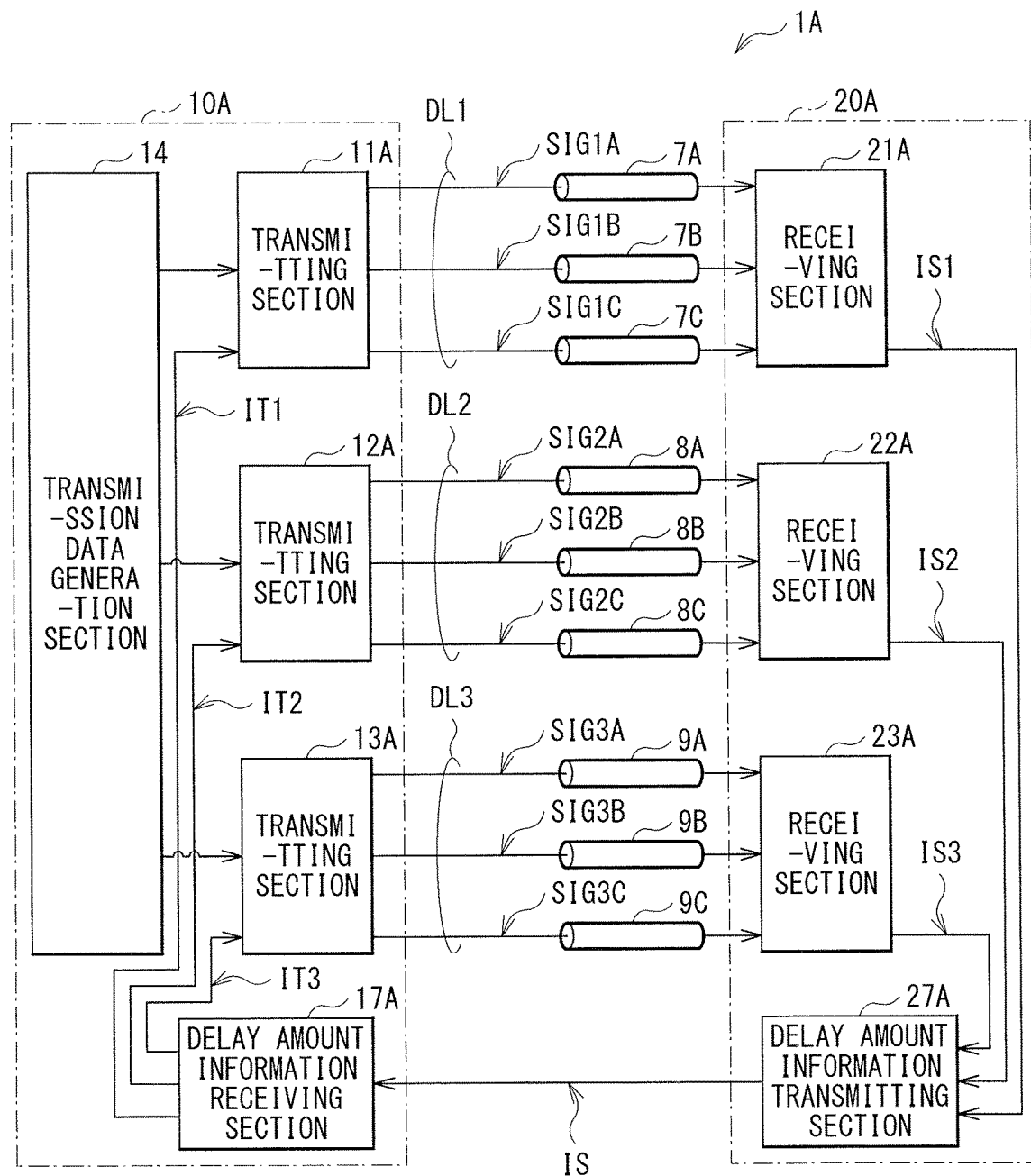

[FIG. 12]
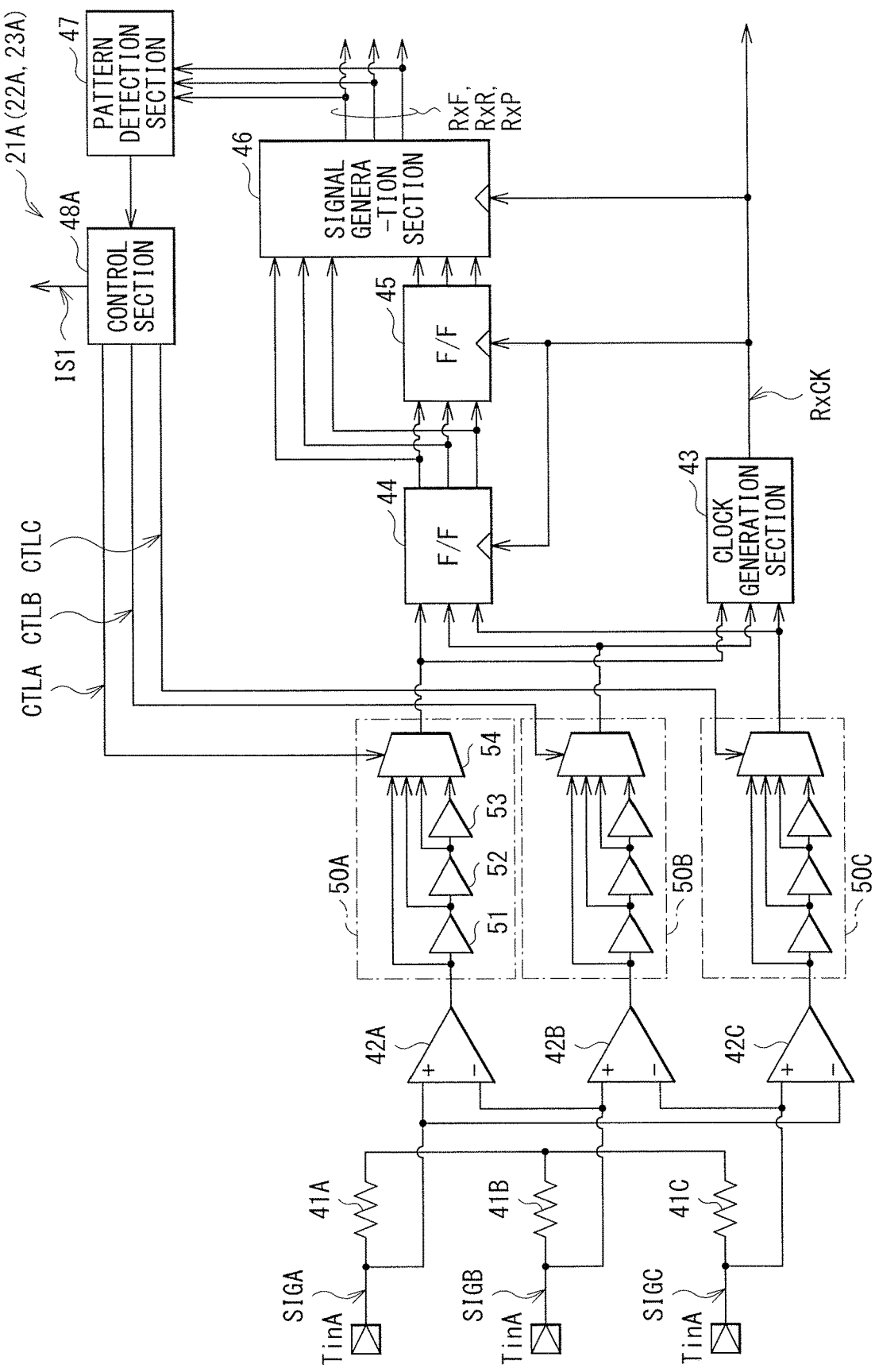

[ FIG. 13 ]
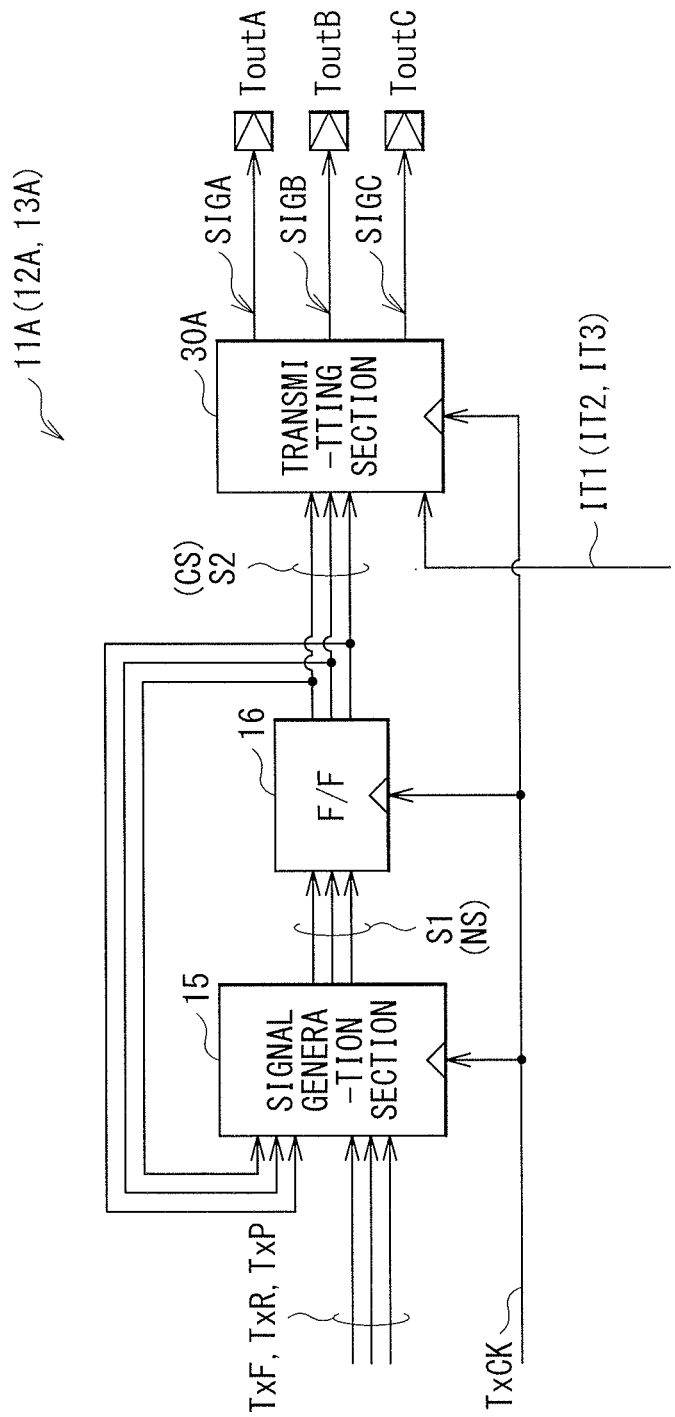

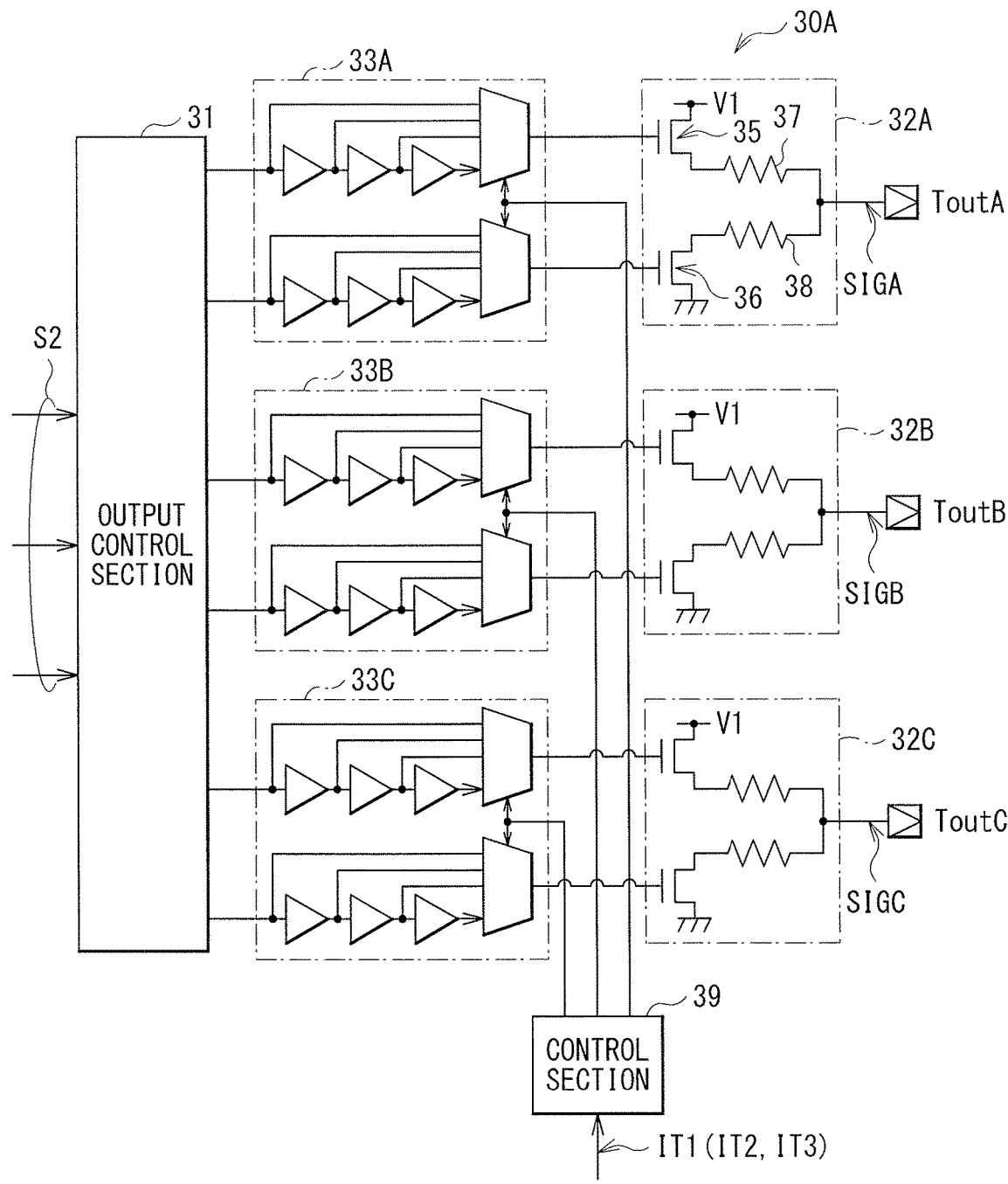
[FIG. 14]

[ FIG. 15 ]
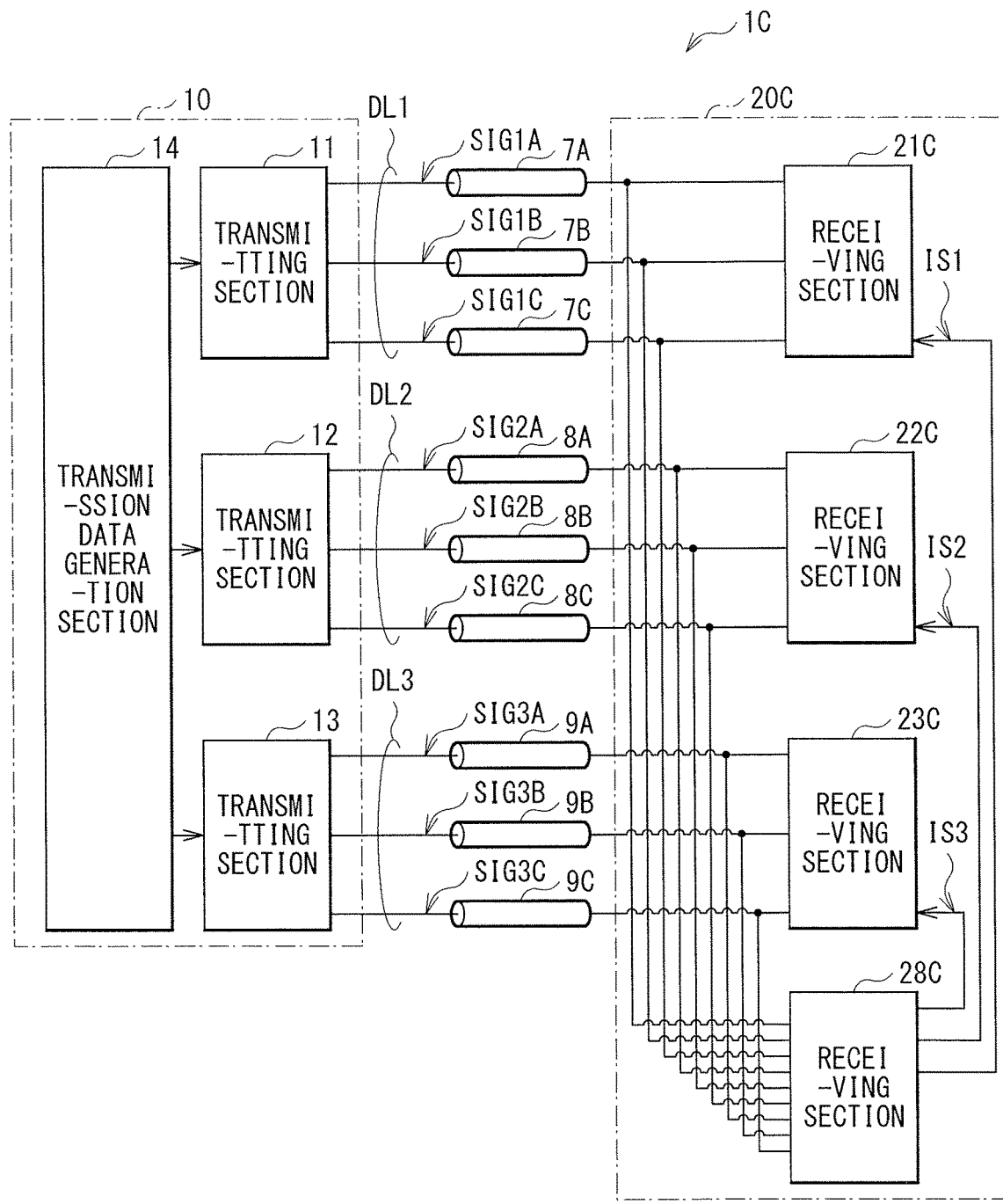

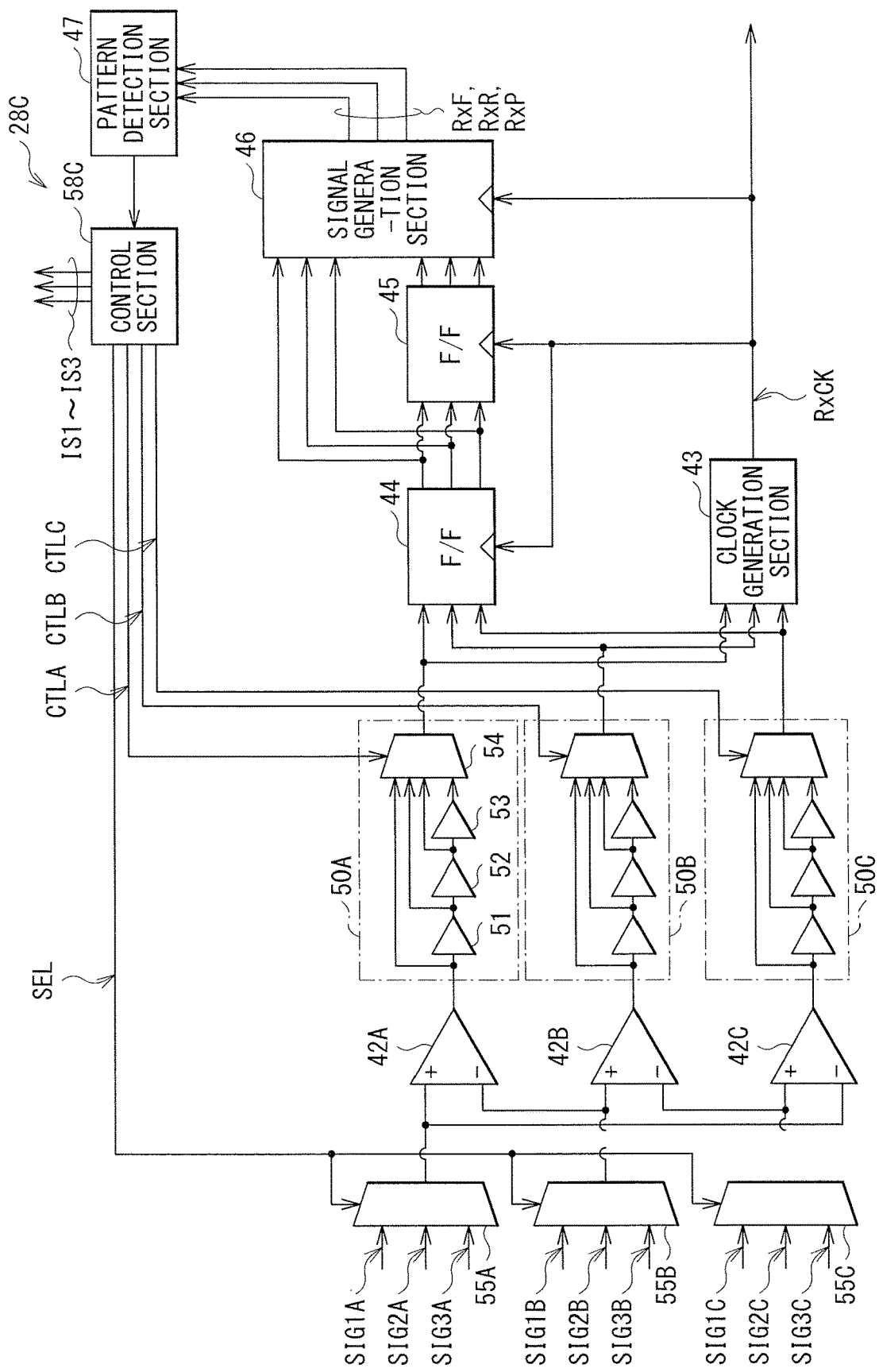
[FIG. 16]

[FIG. 17]
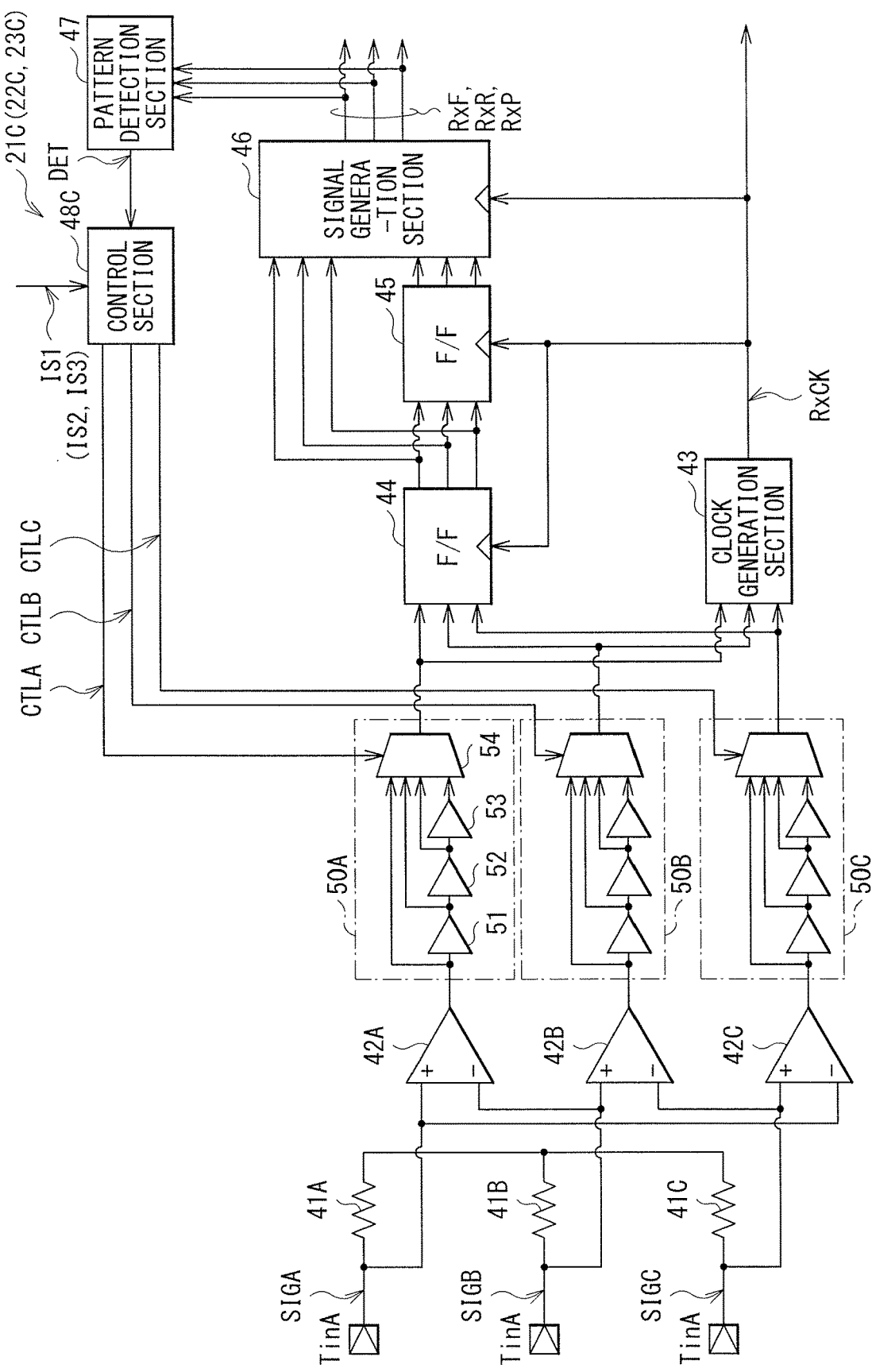

[ FIG. 18 ]
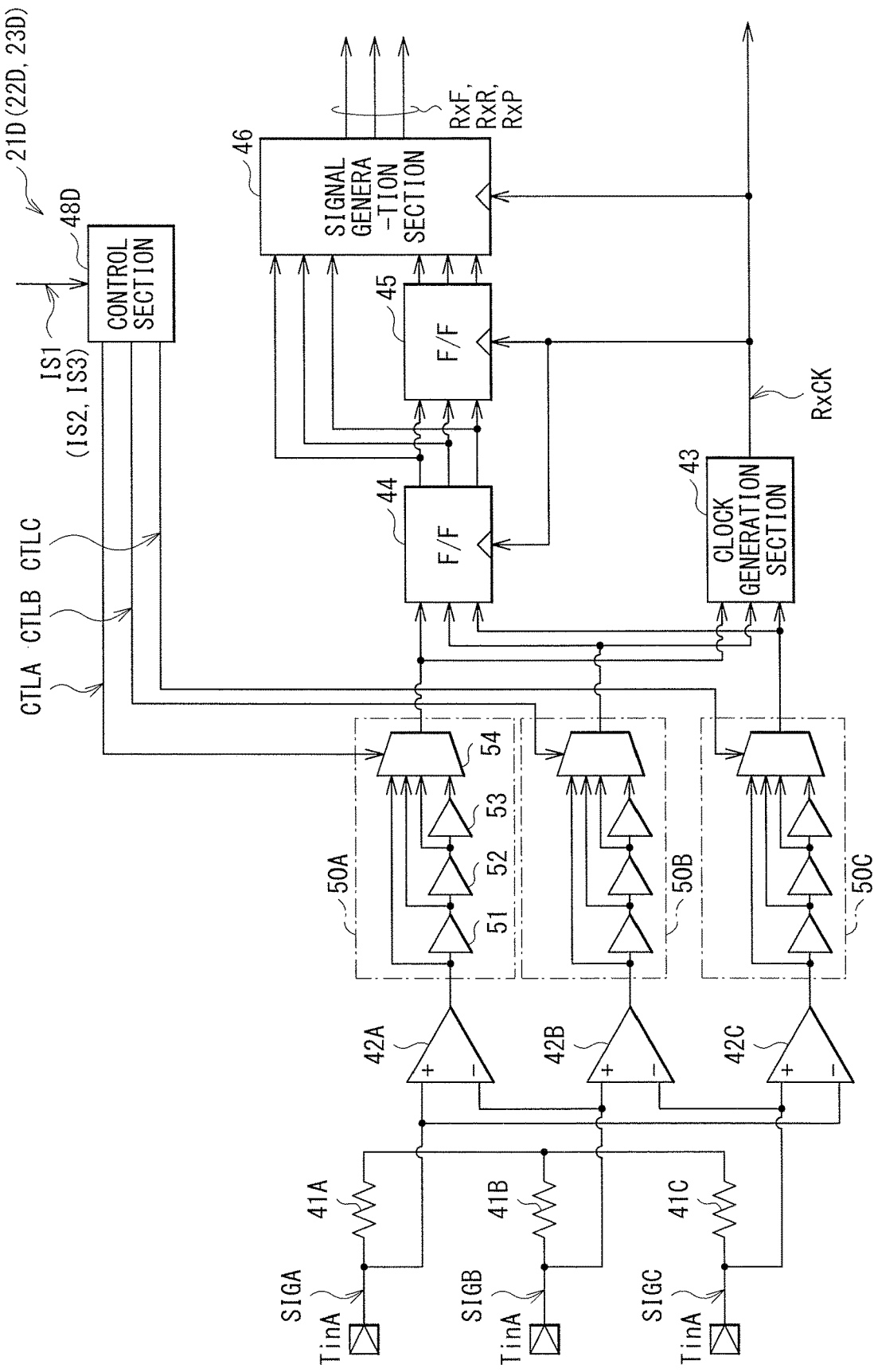

[FIG. 19]
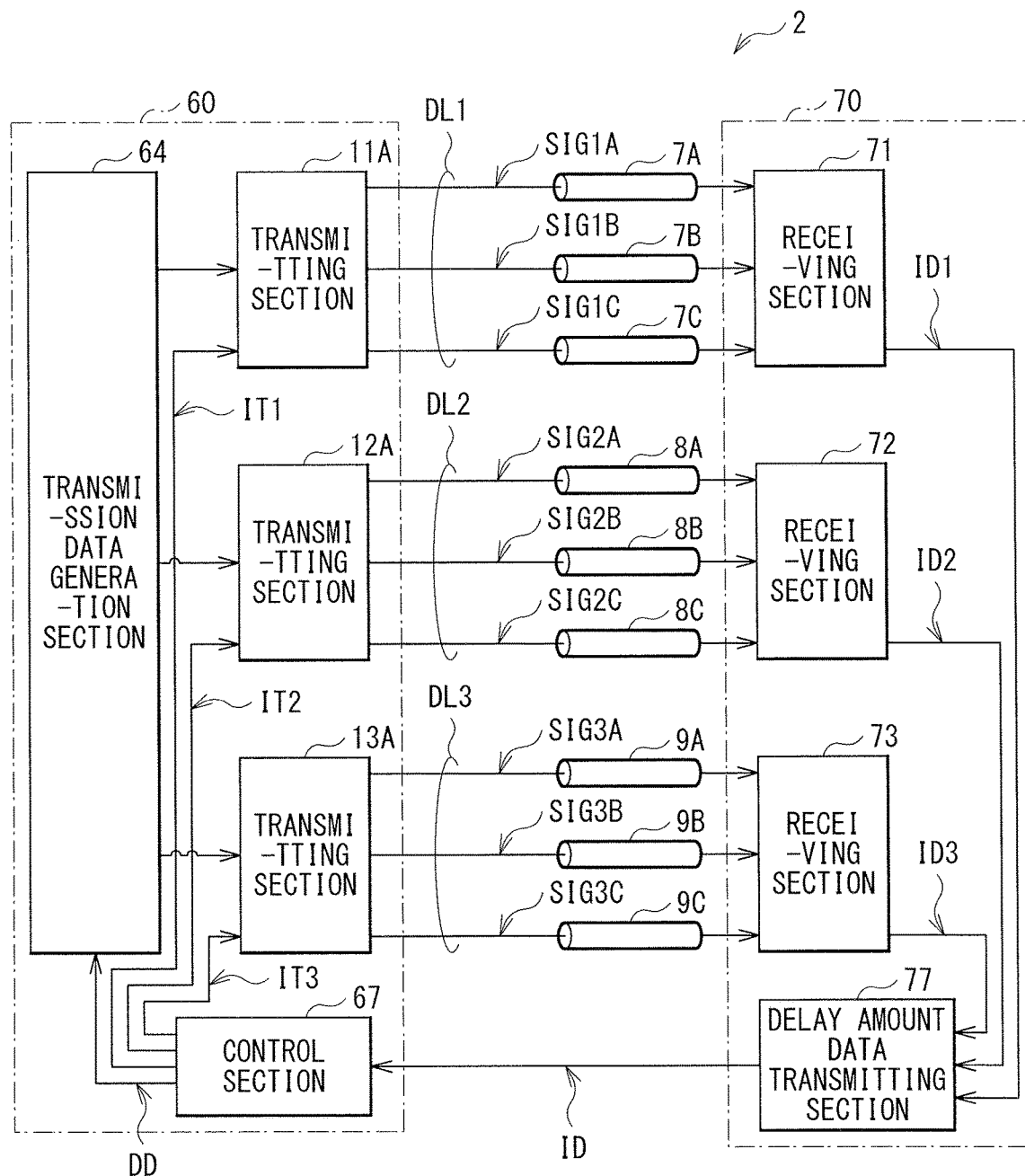

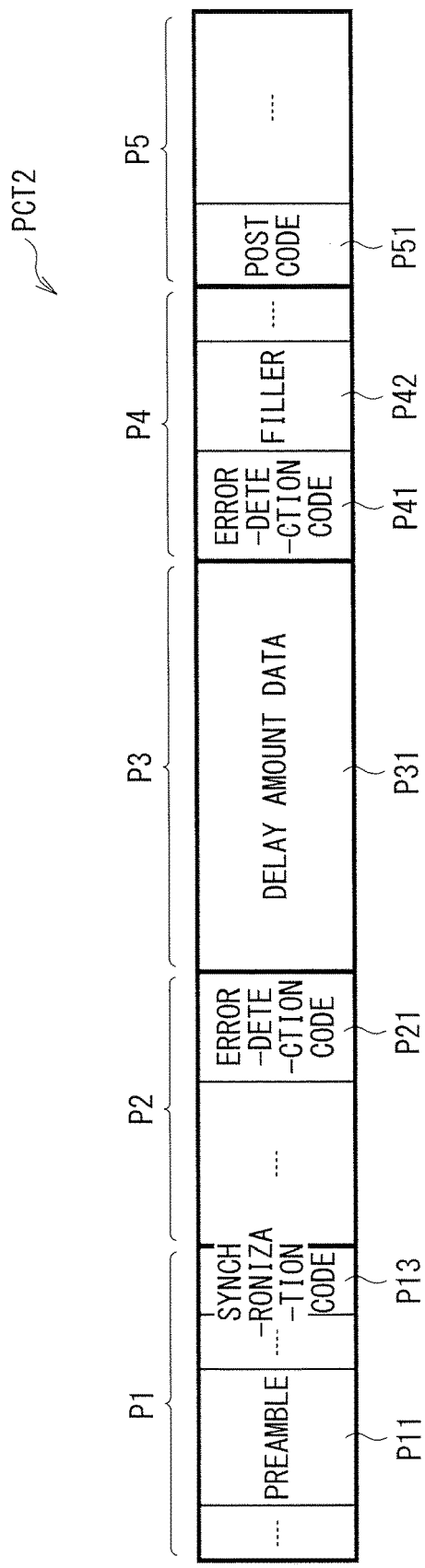
[ FIG. 20 ]

[FIG. 21]
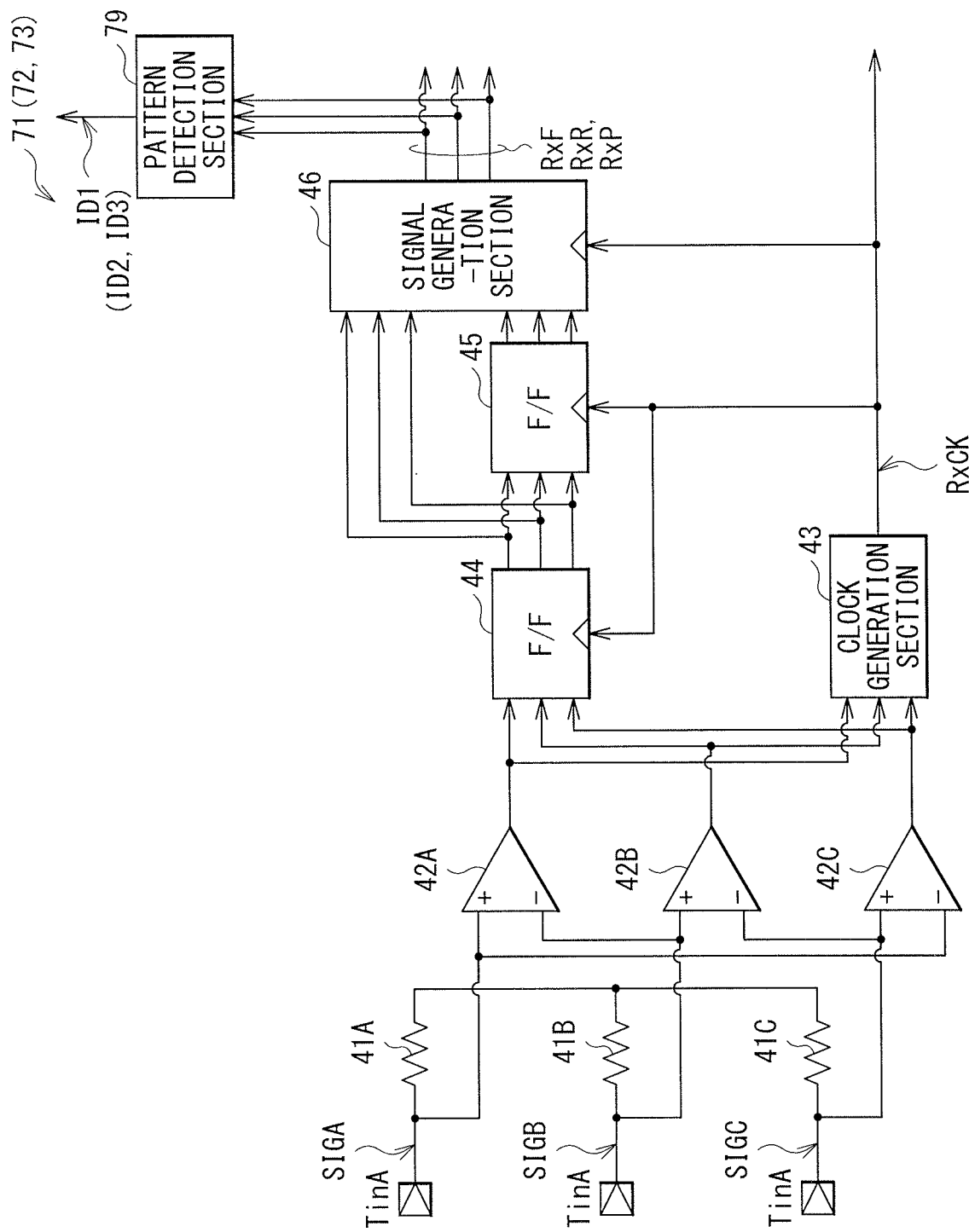

[ FIG. 22 ]
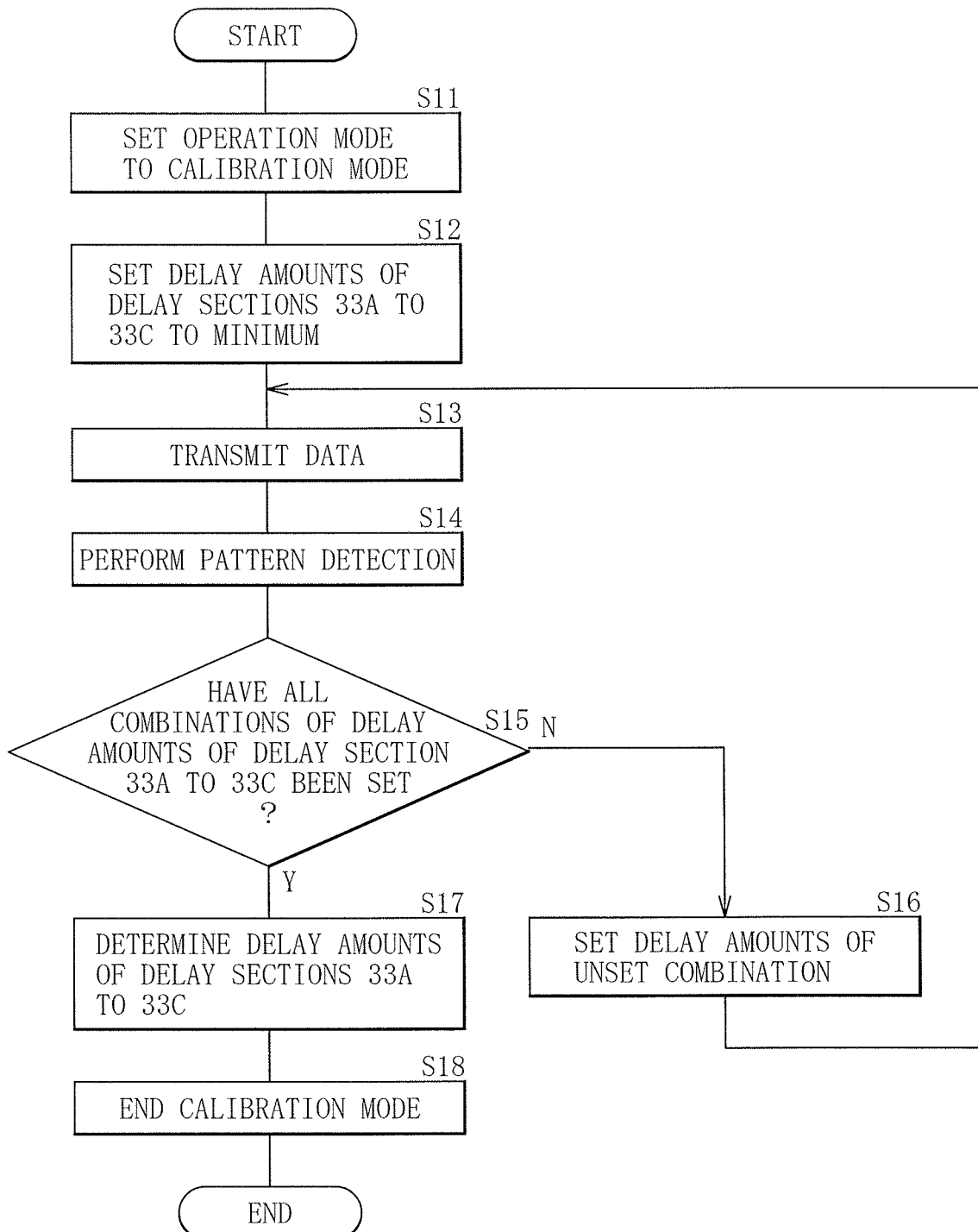

[ FIG. 23 ]
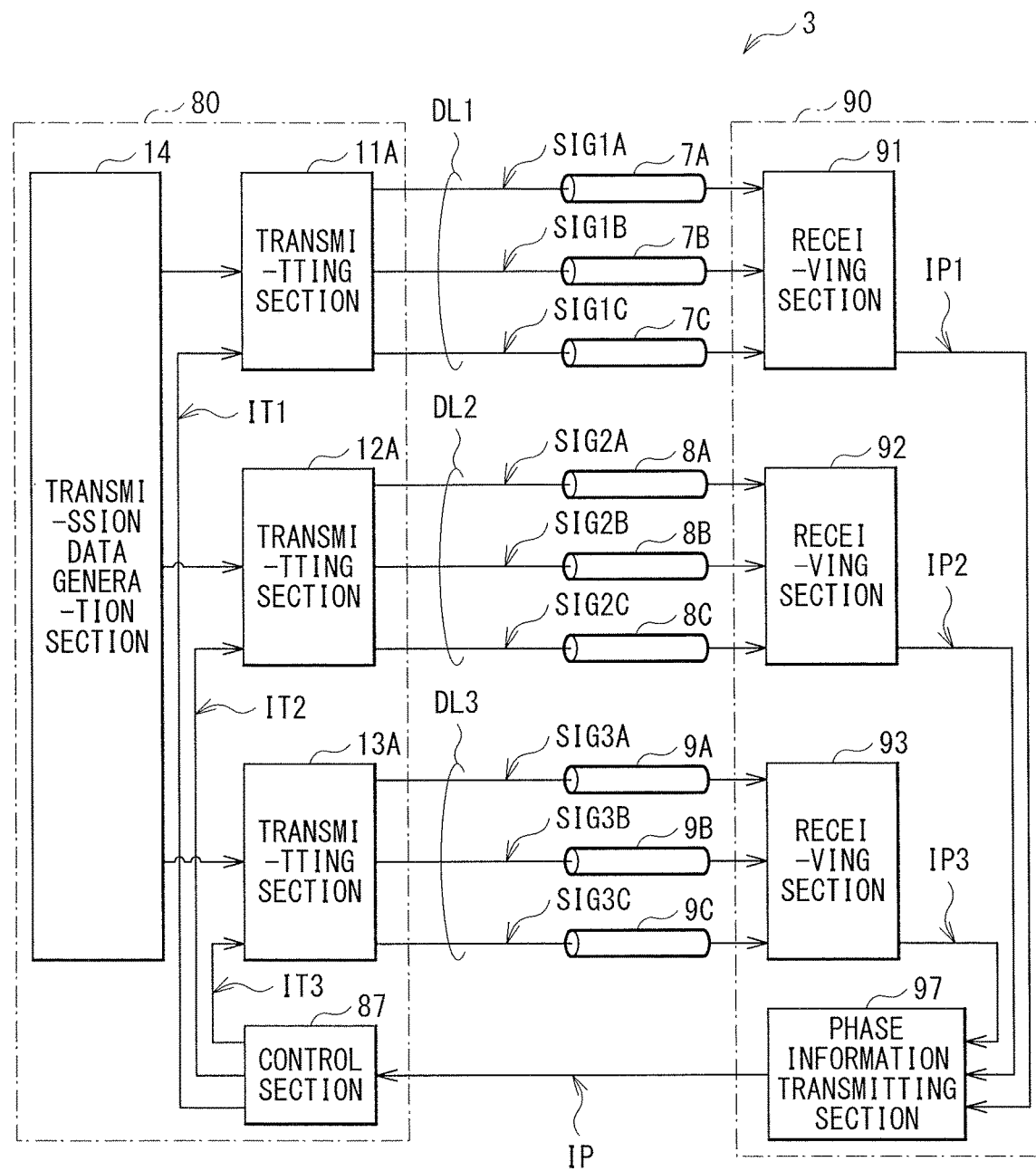

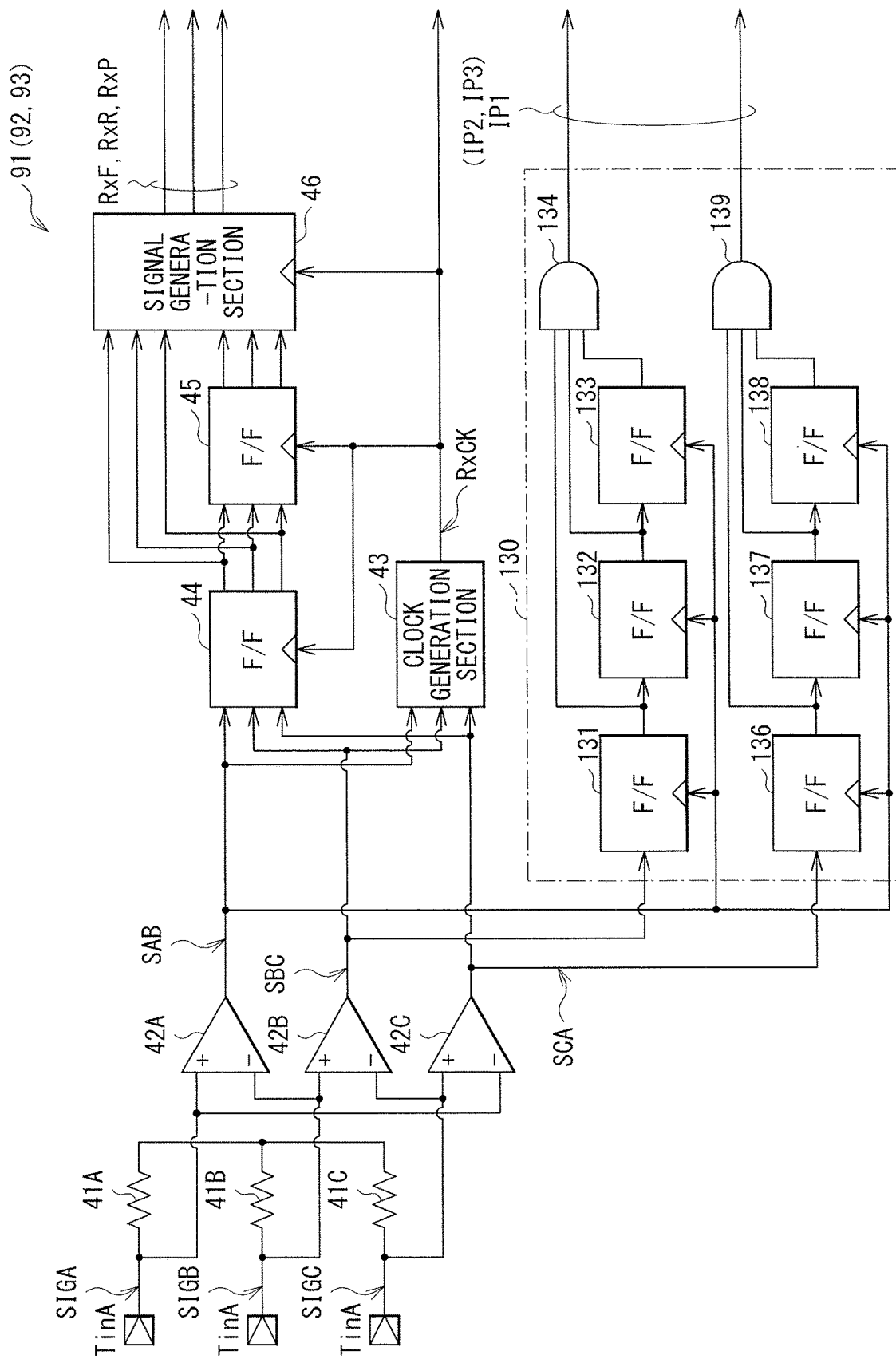
[FIG. 24]

[ FIG. 25 ]
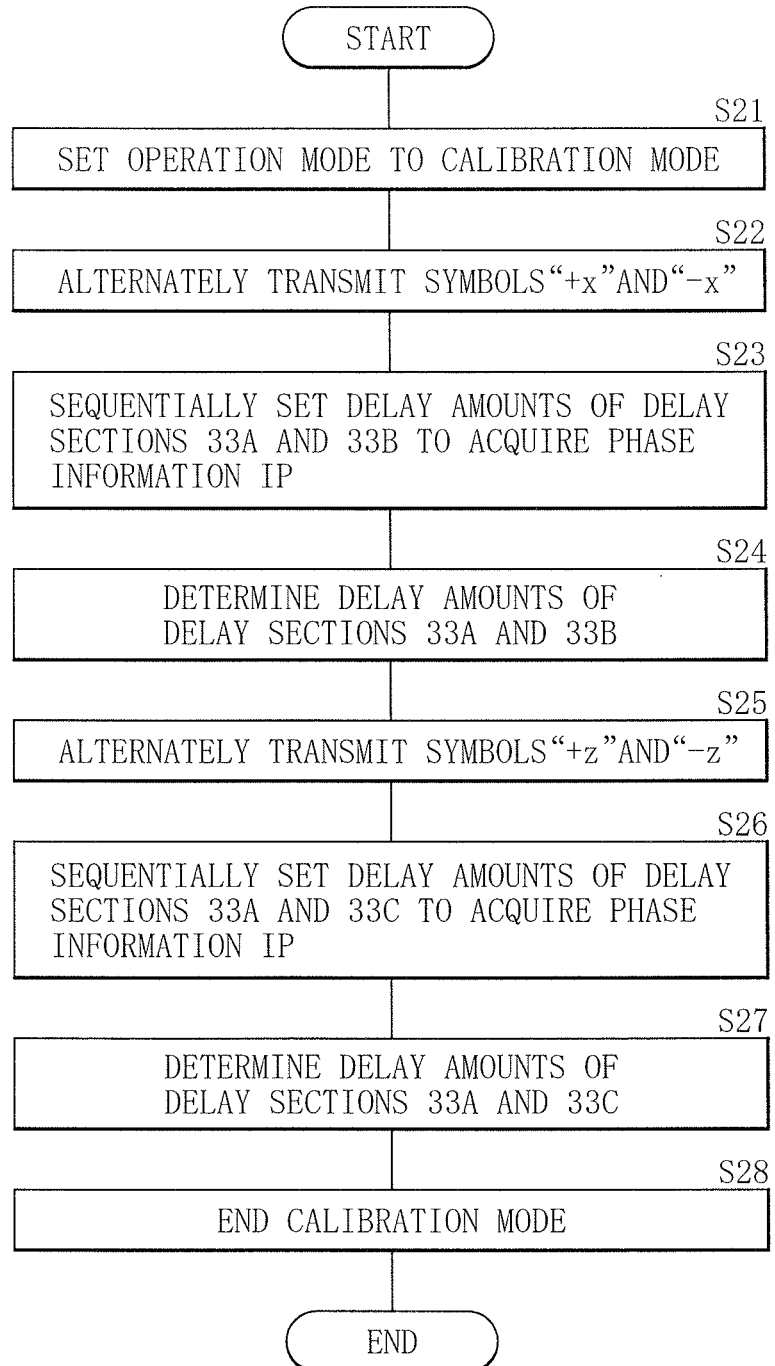

[ FIG. 26 ]
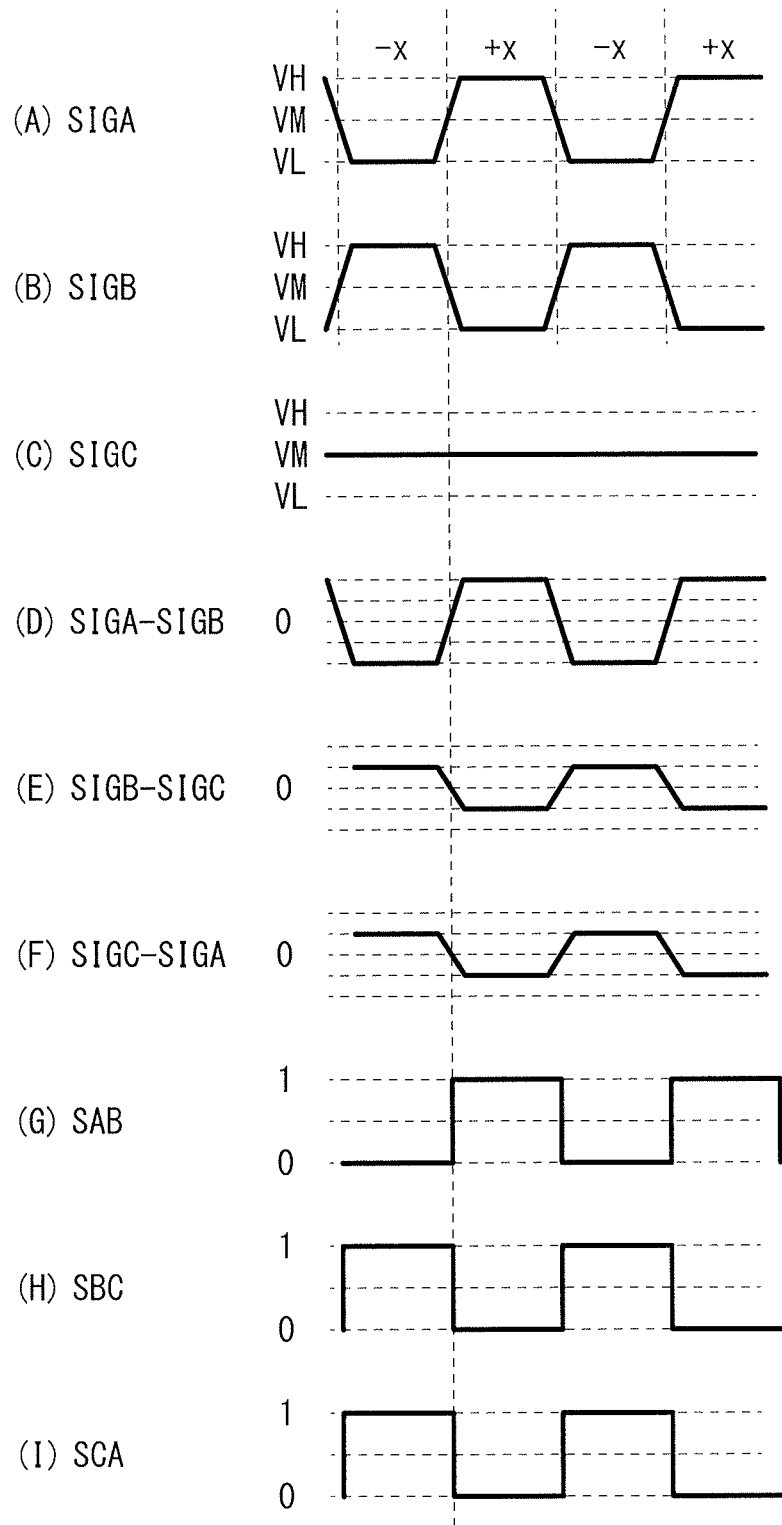

[ FIG. 27 ]
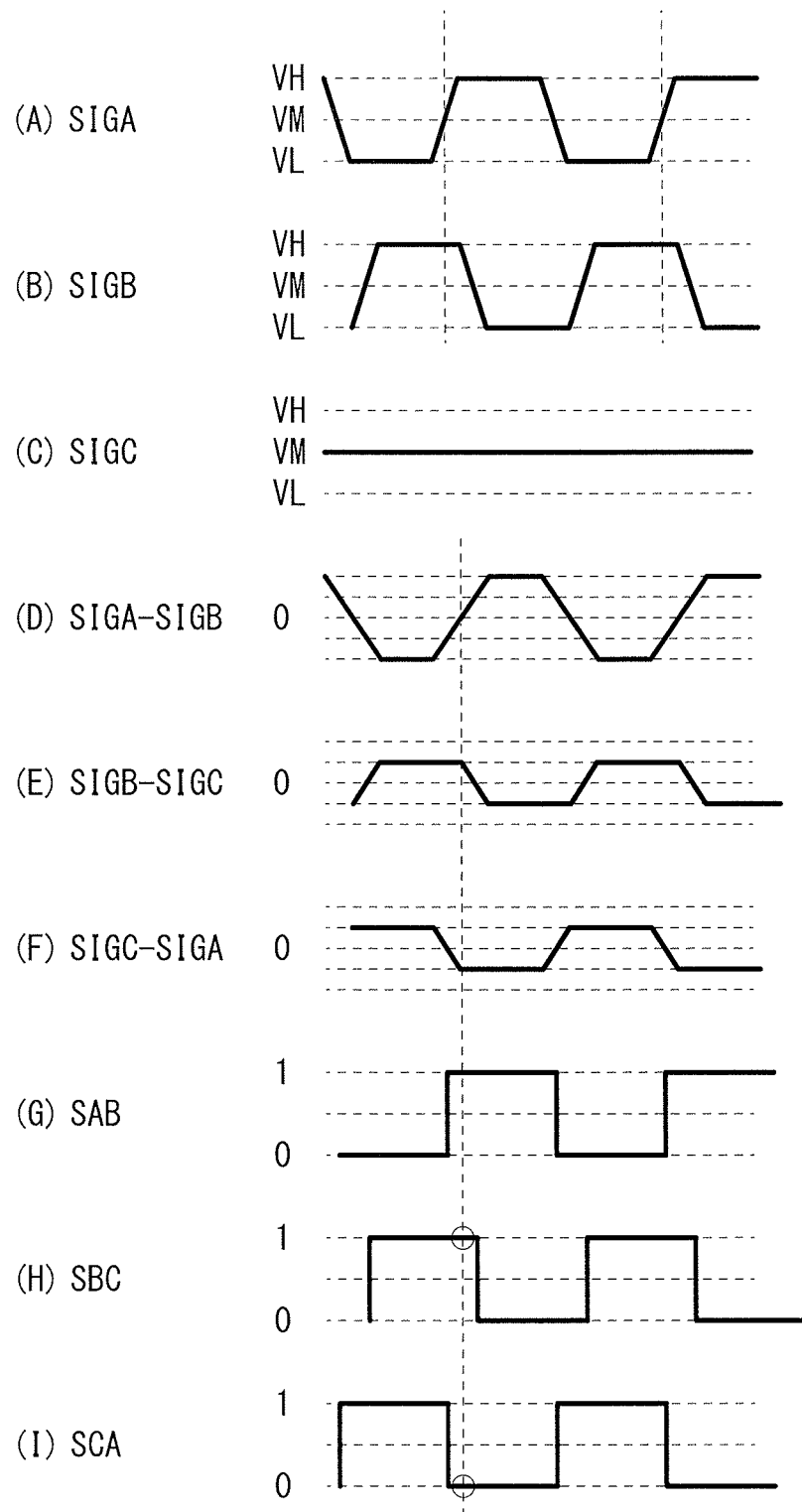

[ FIG. 28 ]
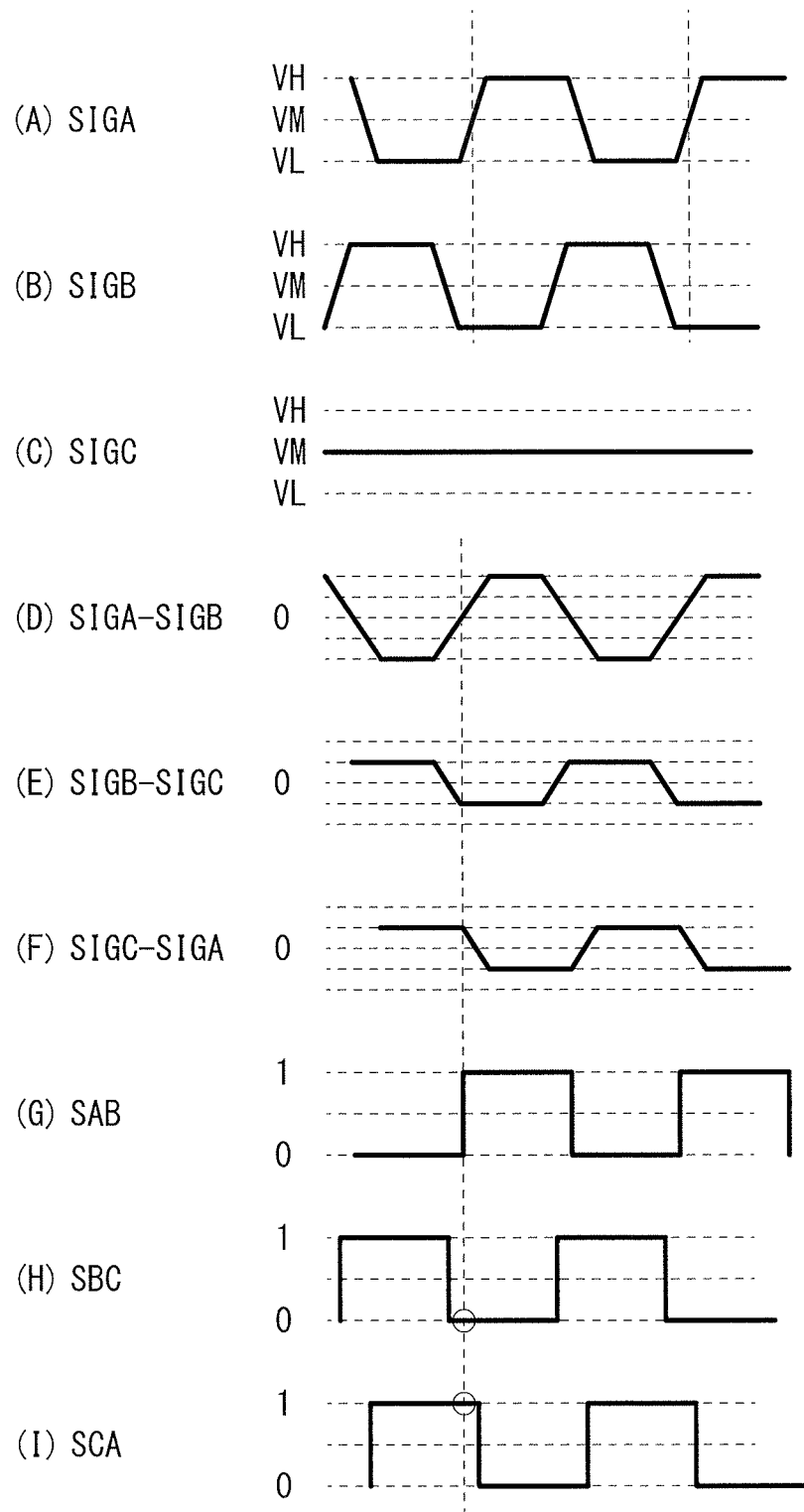

[ FIG. 29 ]
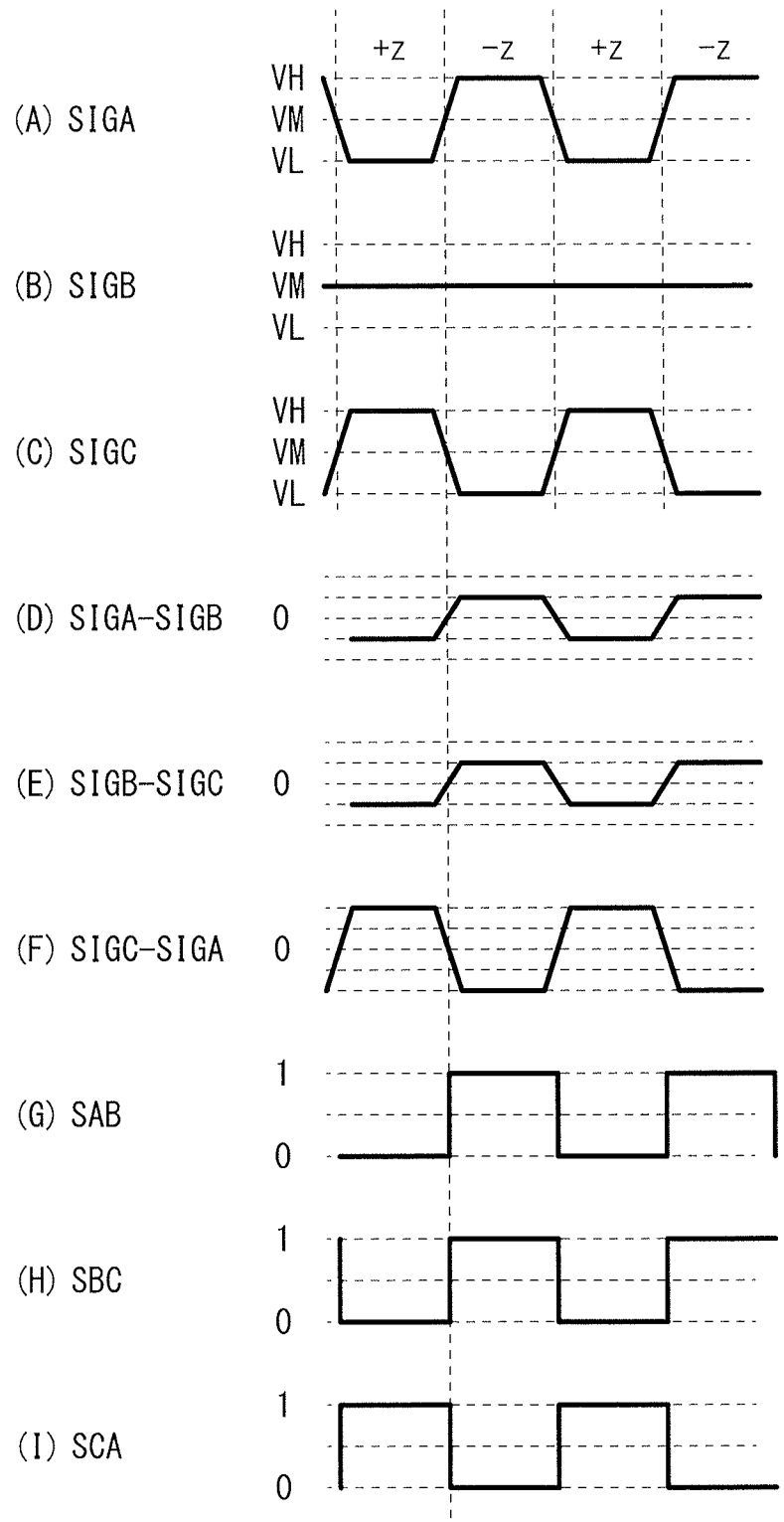

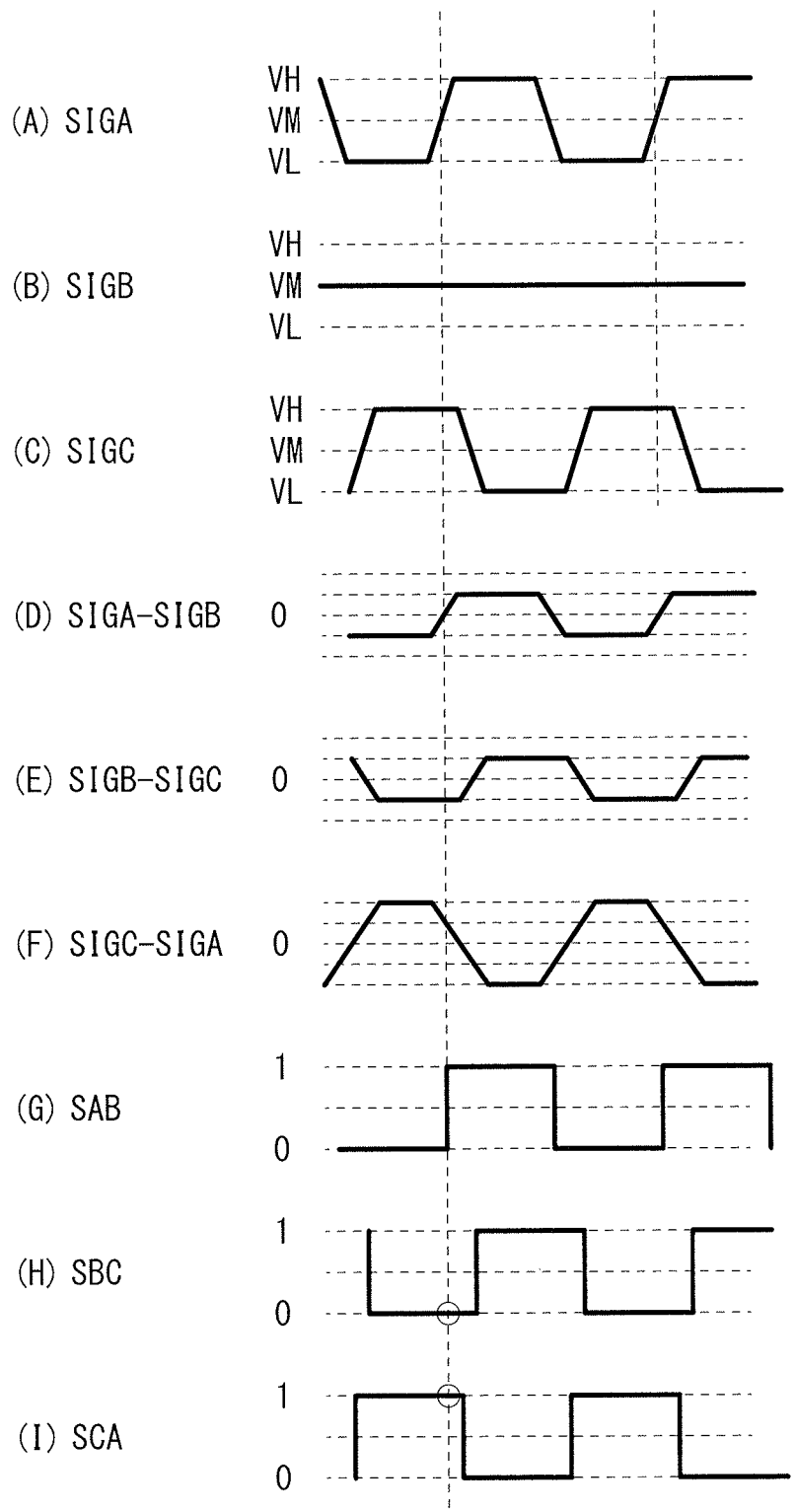
[ FIG. 30 ]

[FIG. 31]
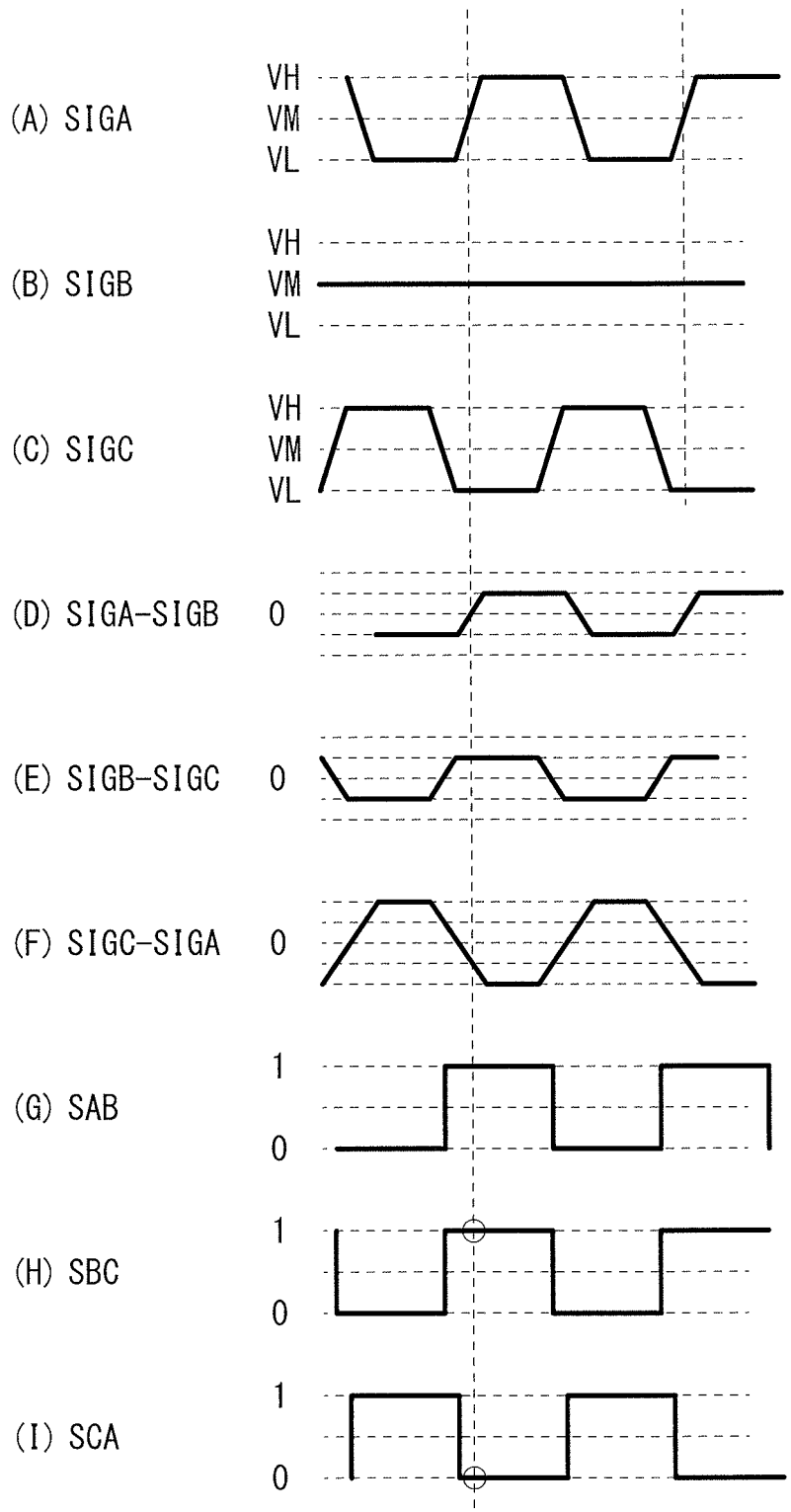

[ FIG. 32 ]
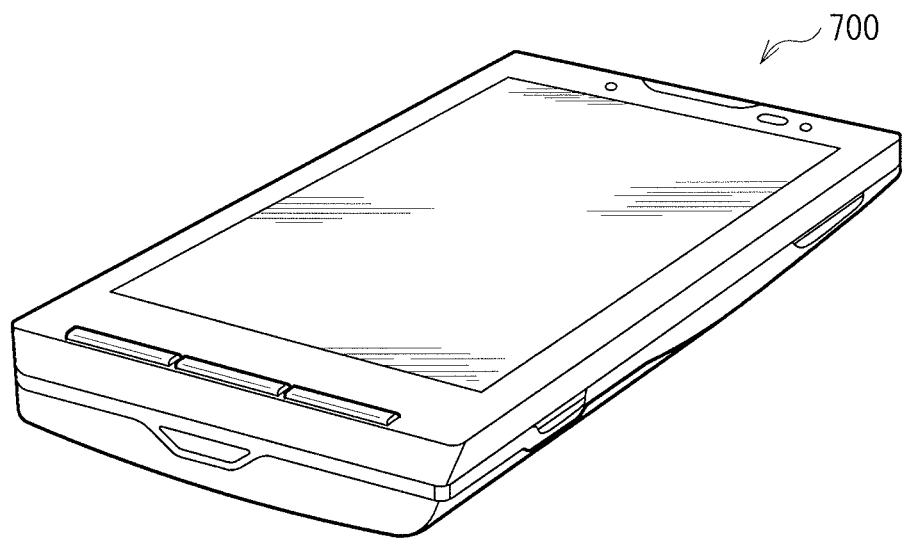

[ FIG. 33 ]
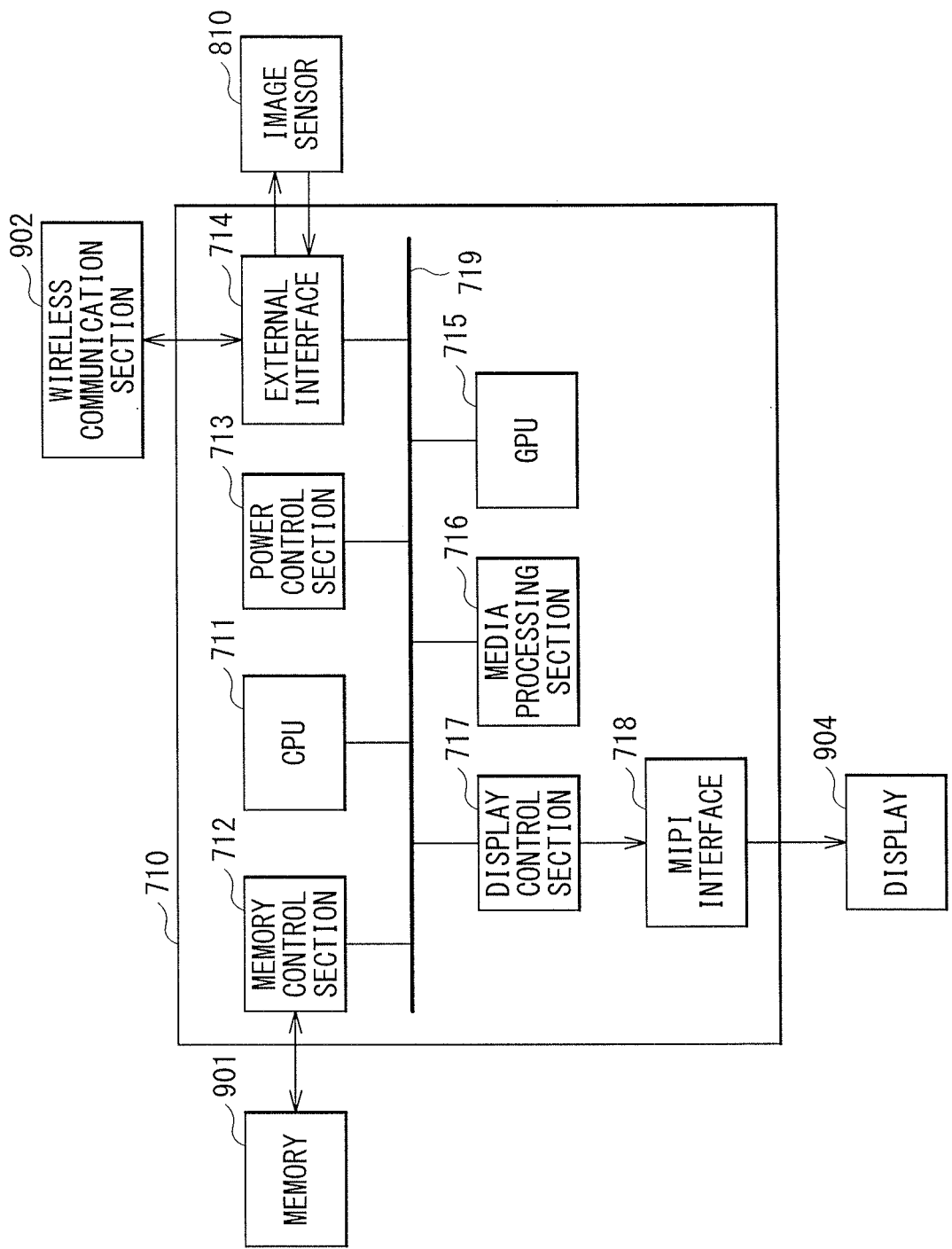

[ FIG. 34 ]
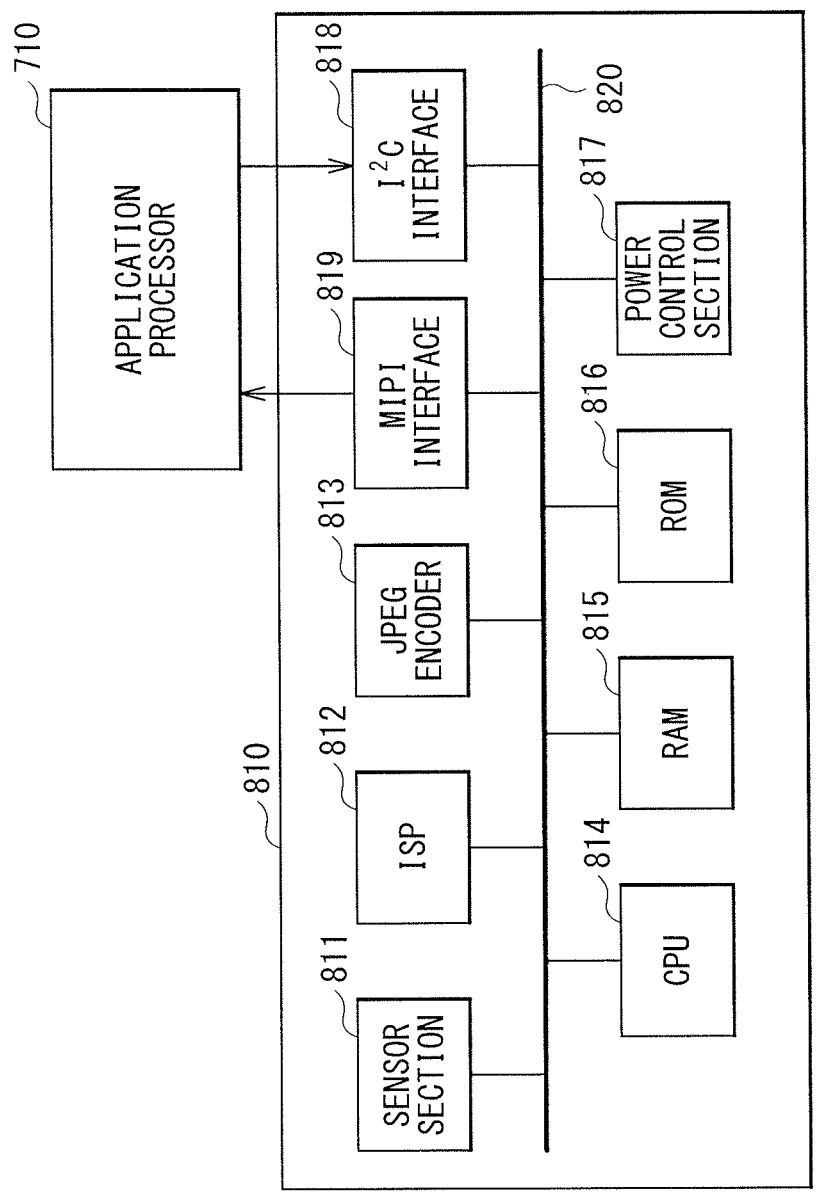

[ FIG. 35 ]
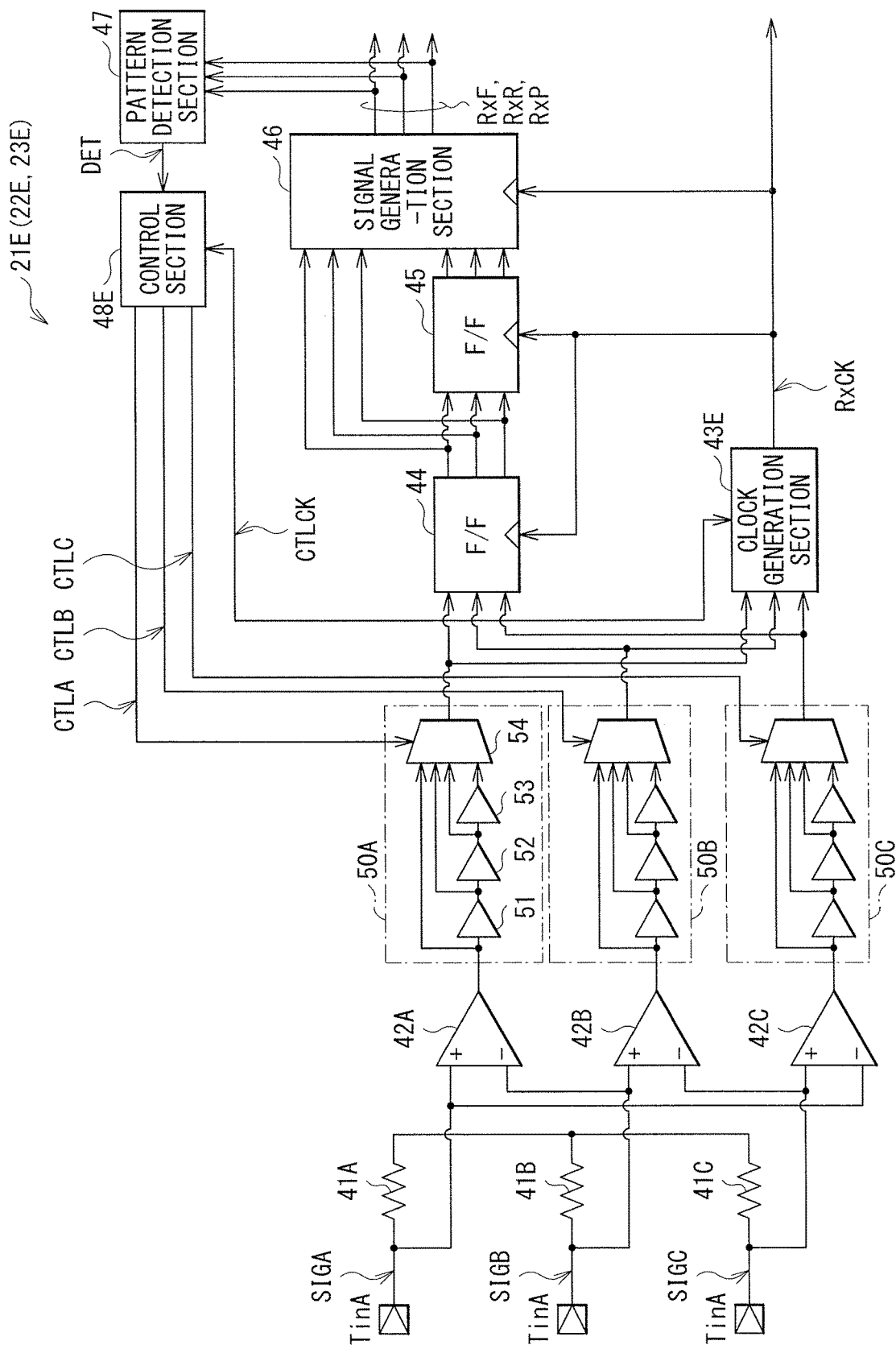

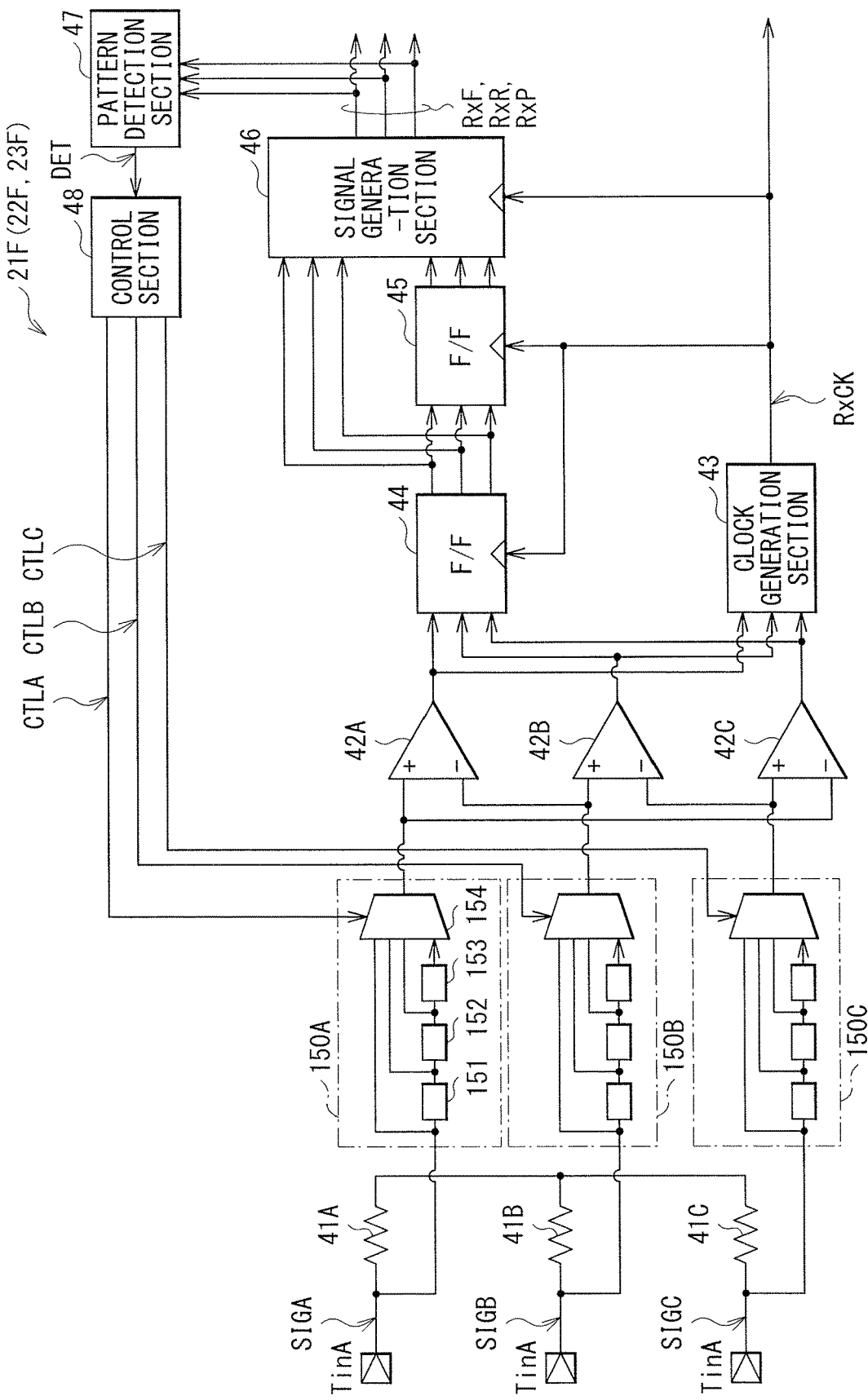
[FIG. 36]

RECEIVER, TRANSMITTER, AND COMMUNICATION SYSTEM

CROSS REFERENCE TO RELATED APPLICATIONS

This application claims the benefit of Japanese Priority Patent Application JP 2014-139812 filed Jul. 7, 2014, the entire contents of which are incorporated herein by reference.

TECHNICAL FIELD

The present disclosure relates to a receiver receiving a signal, to a transmitter transmitting a signal, and to a communication system transmitting and receiving a signal.

BACKGROUND ART

In association with high functionality and multi-functionality of an electronic apparatus in recent years, various devices such as a semiconductor chip, a sensor, and a display device are mounted on the electronic apparatus. A lot of data are exchanged between these devices, and an amount of the data is increased in response to high functionality and multi-functionality of the electronic apparatus. Therefore, for example, the data are often exchanged with use of a high-speed interface that is adapted to transmit and receive data at several Gbps.

To improve communication performance in a high-speed interface, skew is often adjusted. For example, in PTL 1, a skew adjusting circuit that is adapted to adjust skew between a differential data signal and a differential clock signal is disclosed.

CITATION LIST

Patent Literature

PTL 1: WO2012/147258

SUMMARY

Technical Problem

As described above, high communication performance is desired and further improvement of the communication performance is expected in a communication system.

It is desirable to provide a receiver, a transmitter, and a communication system that make it possible to enhance communication performance.

Solution to Problem

In one exemplary aspect of the present disclosure, a receiver comprises a first receiving circuit configured to receive a first data including a first symbol transmitted using three signals over a first data lane, the first data lane including three signal lines respectively corresponding to the three signals, wherein the first receiving circuit includes a delay adjustment circuit configured to adjust a delay amount of at least one of the three signals.

This exemplary aspect of the present disclosure may further comprise a second receiving circuit configured to receive a second data including a second symbol transmitted using three signals over a second data lane, the second data lane including three signal lines respectively corresponding to the three signals; and a third receiving circuit configured to receive a third data including a third symbol transmitted using three signals over a third data lane, the third data lane including three signal lines respectively corresponding to the three signals.

In another exemplary aspect of the present disclosure, a transmitter comprises a first transmitting circuit configured to transmit a first data including a first symbol transmitted using three signals over a first data lane, the first data lane including three signal lines respectively corresponding to the three signals, wherein the first transmitting circuit includes a delay adjustment circuit configured to adjust a delay amount of at least one of the three signals.

This exemplary aspect of the present disclosure may further comprise a second transmitting circuit configured to transmit a second data including a second symbol transmitted using three signals over a second data lane, the second data lane including three signal lines respectively corresponding to the three signals; and a third transmitting circuit configured to transmit a third data including a third symbol transmitted using three signals over a third data lane, the third data lane including three signal lines respectively corresponding to the three signals.

In yet another exemplary aspect of the present disclosure, a communication system comprises a transmitter including a first transmitting circuit configured to transmit a first data including a first symbol transmitted using three signals over a first data lane, the first data lane including three signal lines respectively corresponding to the three signals; a receiver including a first receiving circuit configured to receive the first data over the first data lane; and a delay adjustment circuit configured to adjust a delay amount of at least one of the three signals.

This exemplary aspect of the present disclosure may further comprise a second receiving circuit configured to receive a second data including a second symbol transmitted using three signals over a second data lane, the second data lane including three signal lines respectively corresponding to the three signals; and a third receiving circuit configured to receive a third data including a third symbol transmitted using three signals over a third data lane, the third data lane including three signal lines respectively corresponding to the three signals.

Moreover, this exemplary aspect of the present disclosure may further comprise a second transmitting circuit configured to transmit a second data including a second symbol transmitted using three signals over a second data lane, the second data lane including three signal lines respectively corresponding to the three signals; and a third transmitting circuit configured to transmit a third data including a third symbol transmitted using three signals over a third data lane, the third data lane including three signal lines respectively corresponding to the three signals.

In still another exemplary aspect of the present disclosure, a method of communicating data comprises a first data including a first symbol transmitted using three signals over a first data lane, the first data lane including three signal lines respectively corresponding to the three signals; and adjusting a delay amount of at least one of the three signals.

The above exemplary aspects of the present disclosure may further include a first delay circuit, a second delay circuit, and a third delay circuit.

The above exemplary aspects of the present disclosure may further include a control section configured to control and/or adjust a delay amount of at least one of the first delay circuit, the second delay circuit, and the third delay circuit.

The above exemplary aspects of the present disclosure may be capable of operating in a calibration mode to perform various operations to determine and/or set a relative delay amount of at least one of the three signals.

The above exemplary aspects of the present disclosure may be part of an imaging system also comprising a CMOS image sensor.

Additionally or alternatively, the above exemplary aspects of the present disclosure may be part of a mobile communication device also comprising a wireless communication circuit.

Incidentally, effects described here are non-limiting. Effects achieved by the technology may be one or more of effects described in the present disclosure.

It is to be understood that both the foregoing general description and the following detailed description are exemplary, and are provided to provide further explanation of the technology as claimed.

BRIEF DESCRIPTION OF DRAWINGS

The accompanying drawings are included to provide a further understanding of the technology, and are incorporated in and constitute a part of this specification. The drawings illustrate embodiments and, together with the specification, serve to explain the principles of the technology.

FIG. 1 is a block diagram illustrating a configuration example of a communication system according to a first embodiment of the disclosure.

FIG. 2 is an explanatory diagram illustrating a configuration example of a packet that is transmitted and received by the communication system illustrated in FIG. 1.

FIG. 3 is an explanatory diagram illustrating a voltage state of a signal that is transmitted and received by the communication system illustrated in FIG. 1.

FIG. 4 is a block diagram illustrating a configuration example of a transmitting section illustrated in FIG. 1.

FIG. 5 is an explanatory diagram illustrating transition of a symbol that is transmitted and received by the communication system illustrated in FIG. 1.

FIG. 6 is a circuit diagram illustrating a configuration example of a driver illustrated in FIG. 4.

FIG. 7 is a block diagram illustrating a configuration example of a receiving section illustrated in FIG. 1.

FIG. 8 is an explanatory diagram illustrating an example of receiving operation of the receiving section illustrated in FIG. 7.

FIG. 9 is a flowchart illustrating an operation example of the communication system illustrated in FIG. 1.

FIG. 10A is an explanatory diagram illustrating a mounting example of a transmitter illustrated in FIG. 1.

FIG. 10B is an explanatory diagram illustrating a mounting example of other transmitter.

FIG. 11 is a block diagram illustrating a configuration example of a communication system according to a modification of the first embodiment.

FIG. 12 is a block diagram illustrating a configuration example of a receiving section illustrated in FIG. 11.

FIG. 13 is a block diagram illustrating a configuration example of a transmitting section illustrated in FIG. 11.

FIG. 14 is a circuit diagram illustrating a configuration example of a driver illustrated in FIG. 13.

FIG. 15 is a block diagram illustrating a configuration example of a communication system according to another modification of the first embodiment.

FIG. 16 is a block diagram illustrating a configuration example of a receiving section illustrated in FIG. 15.

FIG. 17 is a block diagram illustrating a configuration example of the receiving section illustrated in FIG. 15.

FIG. 18 is a block diagram illustrating another configuration example of the receiving section illustrated in FIG. 15.

FIG. 19 is a block diagram illustrating a configuration example of a communication system according to a second embodiment.

FIG. 20 is an explanatory diagram illustrating a configuration example of a packet that is transmitted and received by the communication system illustrated in FIG. 19.

FIG. 21 is a block diagram illustrating a configuration example of a receiving section illustrated in FIG. 19.

FIG. 22 is a flowchart illustrating an operation example of the communication system illustrated in FIG. 19.

FIG. 23 is a block diagram illustrating a configuration example of a communication system according to a third embodiment.

FIG. 24 is a block diagram illustrating a configuration example of a receiving section illustrated in FIG. 23.

FIG. 25 is a flowchart illustrating an operation example of the communication system illustrated in FIG. 23.

FIG. 26 is a waveform chart illustrating an example of signals in the communication system illustrated in FIG. 23.

FIG. 27 is a waveform chart illustrating another example of the signals in the communication system illustrated in FIG. 23.

FIG. 28 is a waveform chart illustrating still another example of the signals in the communication system illustrated in FIG. 23.

FIG. 29 is a waveform chart illustrating still another example of the signals in the communication system illustrated in FIG. 23.

FIG. 30 is a waveform chart illustrating still another example of the signals in the communication system illustrated in FIG. 23.

FIG. 31 is a waveform chart illustrating still another example of the signals in the communication system illustrated in FIG. 23.

FIG. 32 is a perspective view illustrating an appearance configuration of a smartphone to which the communication system according to any of the embodiments is applied.

FIG. 33 is a block diagram illustrating a configuration example of an application processor to which the communication system according to any of the embodiments is applied.

FIG. 34 is a block diagram illustrating a configuration example of an image sensor to which the communication system according to any of the embodiments is applied.

FIG. 35 is a block diagram illustrating a configuration example of a receiving section according to a modification.

FIG. 36 is a block diagram illustrating a configuration example of a receiving section according to a modification.

DESCRIPTION OF EMBODIMENTS

Embodiments of the disclosure will be described in detail below with reference to drawings. Note that description will be given in the following order.

1. First embodiment
2. Second embodiment
3. Third embodiment
4. Application example <1. First Embodiment>
(Configuration Example)
(Entire Configuration Example)

FIG. 1 illustrates a configuration example of a communication system to which a receiver according to a first embodiment is applied. In a communication system 1, a receiver 20 detects skew and adjusts the skew (deskews). The communication system 1 includes a transmitter 10 and the receiver 20.

The transmitter 10 includes a transmission data generation section 14 and three transmitting sections 11, 12, and 13. The transmission data generation section 14 generates transmission data, divides the transmission data into three pieces, and supplies the three pieces of transmission data to the transmitting sections 11, 12, and 13. The transmitting section 11 transmits data to the receiver 20 through a data lane DL1, the transmitting section 12 transmits data to the receiver 20 through a data lane DL2, and the transmitting section 13 transmits data to the receiver 20 through a data lane DL3. At this time, the transmitting sections 11, 12, and 13 each use a packet PCT1 to transmit the data.

FIG. 2 illustrates a configuration example of the packet PCT1. The packet PCT1 includes a start of transmission (SoT) part P1, a header part P2, a payload part P3, a footer part P4, and an end of transmission (EoT) part P5.

The SoT part P1 defines start of the packet PCT1, and may include, for example, a preamble P11 and a synchronization code P12. The preamble P11 includes a fixed pattern common to all of the packets PCT1. The synchronization code P12 is used for synchronization in the communication system 1, and includes a fixed pattern.

The header part P2 may include, for example, an error detection code P21. The error detection code P21 is a code used to perform error check of the header part P2, and is a cyclic redundancy check (CRC) code in this example. The error detection code is not limited thereto, and alternatively, for example, the error detection code may be a hamming code or a check sum code.

The payload part P3 includes a main body of the data to be transmitted.

The footer part P4 may include, for example, an error detection code P41 and a filler P42. The error detection code P41 is a code used to perform error check of the payload part P3, and is a cyclic redundancy check code in this example. The filler P42 adjusts difference of data amount between the data lanes DL1, DL2, and DL3, and is inserted by a data lane unit as necessary.

The EoT part P5 defines end of the packet PCT1, and may include, for example, a post code P51. The post code P51 has a fixed pattern corresponding to last data of the footer part P4.

The transmitting section 11 transmits the packet PCT1 to the receiver 20. At this time, the transmitting section 11 uses three signals SIG1A, SIG1B, and SIG1C to transmit the packet PCT1 to the receiver 20. Likewise, the transmitting section 12 uses three signals SIG2A, SIG2B, and SIG2C to transmit the packet PCT1 to the receiver 20. Also, the transmitting section 13 uses three signals SIG3A, SIG3B, and SIG3C to transmit the packet PCT1 to the receiver 20. Characteristic impedance of transmission paths 7A to 7C, 8A to 8C, and 9A to 9C transmitting these signals is 50 ohm in this example.

The signals SIG1A to SIG1C, SIG2A to SIG2C, and SIG3A to SIG3C each transit between three voltage levels (high level voltage VH, middle level voltage VM, and low level voltage VL). Hereinafter, a signal SIGA is properly used to indicate any one of the signals SIG1A, SIG2A, and SIG3A, a signal SIGB is properly used to indicate any one of the signals SIG1B, SIG2B, and SIG3B, and a signal SIGC is properly used to indicate any one of the signals SIG1C, SIG2C, and SIG3C.

FIG. 3 illustrates voltage states of the signals SIGA, SIGB, and SIGC. Each of the transmitting sections 11, 12, and 13 uses the three signals SIGA, SIGB, and SIGC to transmit six symbols "+x", "−x", "+y", "−y", "+z", and "−z". For example, when transmitting the symbol "+x", the transmitting section 11 sets the signal SIGA to the high level voltage VH, sets the signal SIGB to the low level voltage VL, and sets the signal SIGC to the middle level voltage VM. When transmitting the symbol "−x", the transmitting section 11 sets the signal SIGA to the low level voltage VL, sets the signal SIGB to the high level voltage VH, and sets the signal SIGC to the middle level voltage VM. When transmitting the symbol "+y", the transmitting section 11 sets the signal SIGA to the middle level voltage VM, sets the signal SIGB to the high level voltage VH, and sets the signal SIGC to the low level voltage VL. When transmitting the symbol "−y", the transmitting section 11 sets the signal SIGA to the middle level voltage VM, sets the signal SIGB to the low level voltage VL, and sets the signal SIGC to the high level voltage VH. When transmitting the symbol "+z", the transmitting section 11 sets the signal SIGA to the low level voltage VL, sets the signal SIGB to the middle level voltage VM, and sets the signal SIGC to the high level voltage VH. When transmitting the symbol "−z", the transmitting section 11 sets the signal SIGA to the high level voltage VH, sets the signal SIGB to the middle level voltage VM, and sets the signal SIGC to the low level voltage VL.

The receiver 20 includes three receiving sections 21, 22, and 23. The receiving section 21 receives the signals SIG1A, SIG1B, and SIG1C, the receiving section 22 receives the signals SIG2A, SIG2B, and SIG2C, and the receiving section 23 receives the signals SIG3A, SIG3B, and SIG3C.

(Transmitting Sections 11, 12, and 13)

FIG. 4 illustrates a configuration example of the transmitting section 11. Note that the same applies to the transmitting sections 11 and 12. The transmitting section 11 includes a signal generation section 15, a flip-flop (F/F) 16, and an output section 30.

The signal generation section 15 determines a symbol NS based on a symbol CS, signals TxF, TxR, and TxP, and a clock TxCK. Each of the symbols CS and NS indicates any one of the six symbols "+x", "−x", "+y", "−y", "+z", and "−z". The symbol CS is a currently transmitted symbol (current symbol), and the symbol NS is a subsequently transmitted symbol (next symbol).

FIG. 5 illustrates operation of the signal generation section 15. FIG. 5 illustrates the six symbols "+x", "−x", "+y", "−y", "+z", and "−z" and transition therebetween.

The signal TxF allows the symbol to transit between "+x" and "−x", allows the symbol to transit between "+y" and "−y", and allows the symbol to transit between "+z" and "−z". Specifically, when the signal TxF is "1", the transition is so performed as to change polarity of the symbol (for example, from "+x" to "−x"), and when the signal TxF is "0", such transition is not performed.

The signals TxR and TxP each allows the symbol to transit between "+x" and other than "+x", between "+y" and other than "+y", and between "+z" and other than "+z" when the signal TxF is "0". Specifically, when the signals TxR and TxP are "1" and "0", respectively, the transition is performed clockwise in FIG. 5 while keeping the polarity of the symbol (for example, from "+x" to "−x"), and when the signals TxR and TxP are "1" and "1", respectively, the transition is performed clockwise in FIG. 5 while changing the polarity of the symbol (for example, from "+x" to "−y"). Moreover, when the signals TxR and TxP are "0" and "0", respectively, the transition is performed counterclockwise in FIG. 5 while keeping the polarity of the symbol (for example, from "+x" to "+z"), and when the signals TxR and TxP are "0" and "1", respectively, the transition is performed counterclockwise in FIG. 5 while changing the polarity of the symbol (for example, from "+x" to "−z").

In this way, in the signal generation section 15, the transition direction of the symbol is determined by the signals TxF, TxR, and TxP. Therefore, the signal generation section 15 determines the next symbol NS based on the current symbol CS and these signals TxF, TxR, and TxP. Then, the signal generation section 15 supplies the symbol NS to the flip-flop 16 with use of a three-bit signal S1 in this example.

The flip-flop 16 delays the signal S1 by one clock of the clock TxCK and outputs the delayed signal S1 as a three-bit signal S2. In other words, the flip-flop 16 delays the next symbol NS indicated by the signal S1 by one clock of the clock TxCK to generate the current symbol CS. Then, the flip-flop 16 supplies the signal S2 to the signal generation section 15 and the output section 30.

The output section 30 generates the signals SIGA, SIGB, and SIGC, based on the signal S2.

FIG. 6 illustrates a configuration example of the output section 30. The output section 30 includes an output control section 31 and drivers 32A, 32B, and 32C.

The output control section 31 supplies a control signal to each of the drivers 32A, 32B, and 32C based on the signal S2 to control operation of the drivers 32A, 32B, and 32C.

The driver 32A sets the voltage state of the signal SIGA to any of the three voltage levels (the high level voltage VH, the middle level voltage VM, and the low level voltage VL) based on the control signal supplied from the output control section 31. The driver 32B sets the voltage state of the signal SIGB to any of the three voltage levels based on the control signal supplied from the output control section 31. The driver 32C sets the voltage state of the signal SIGC to any of the three voltage levels based on the control signal supplied from the output control section 31.

With this configuration, the output section 30 is allowed to set each of the signals SIGA, SIGB, and SIGC to the three voltage levels corresponding to the symbol CS, based on the symbol CS indicated by the signal S2, as illustrated in FIG. 3.

Then, the driver 32A of the output section 30 is described in more detail. Note that the same applies to the drivers 32B and 32C.

The driver 32A includes transistors 35 and 36 and resistors 37 and 38. The transistors 35 and 36 are N-channel metal oxide semiconductor (MOS) field effect transistors (FETs) in this example. A gate of the transistor 35 is supplied with the control signal from the output control section 31, a drain thereof is supplied with the voltage V1, and a source thereof is connected to a first end of the resistor 37. A gate of the transistor 36 is supplied with the control signal from the output control section 31, a drain thereof is connected to a first end of the resistor 38, and a source thereof is grounded. Each of the resistors 37 and 38 functions as a terminal resistor. The first end of the resistor 37 is connected to the source of the transistor 35, and a second end thereof is connected to a second end of the resistor 38 and an output terminal ToutA. The first end of the resistor 38 is connected to the drain of the transistor 36, and the second end thereof is connected to the second end of the resistor 37 and the output terminal ToutA.

For example, when the signal SIGA is set to the high level voltage VH, the output control section 31 supplies the high-level control signal to the transistor 35, and supplies the low-level control signal to the transistor 36. As a result, the transistor 35 is put into ON state and the transistor 36 is put into OFF state, an output current flows through the transistor 35, and the signal SIGA is set to the high level voltage VH. For example, when the signal SIGA is set to the low level voltage VL, the output control section 31 supplies the low-level control signal to the transistor 35, and supplies the high-level control signal to the transistor 36. As a result, the transistor 35 is put into the OFF state and the transistor 36 is put into the ON state, the output current flows through the transistor 36, and the signal SIGA is set to the low level voltage VL. For example, when the signal SIGA is set to the middle level voltage VM, the output control section 31 supplies the low-level control signal to the transistors 35 and 36. As a result, the transistors 35 and 36 are put into the OFF state, and the signal SIGA is set to the middle voltage VM by resistors 41A, 41B, and 41C (described later) of the receiving sections 21, 22, and 23.

(Receiving Sections 21, 22, and 23)

FIG. 7 illustrates a configuration example of the receiving section 21. Note that the same applies to the receiving sections 22 and 23. The receiving section 21 includes the resistors 41A, 41B, and 41C, amplifiers 42A, 42B, and 42C, delay sections 50A, 50B, and 50C, a clock generation section 43, flip-flops (F/Fs) 44 and 45, a signal generation section 46, a pattern detection section 47, and a control section 48.

Each of the resistors 41A, 41B, and 41C functions as a terminal resistor in the communication system 1. A first end of the resistor 41A is connected to an input terminal TinA and is supplied with the signal SIGA, and a second end thereof is connected to second ends of the respective resistors 41B and 41C. A first end of the resistor 41B is connected to an input terminal TinB and is supplied with the signal SIGB, and the second end thereof is connected to the second ends of the respective resistors 41A and 41C. A first end of the resistor 41C is connected to an input terminal TinC and is supplied with the signal SIGC, and the second end thereof is connected to the second ends of the respective resistors 41A and 41B.

Each of the amplifiers 42A, 42B, and 42C outputs a signal corresponding to difference between a signal at a positive input terminal and a signal at a negative input terminal. A positive input terminal of the amplifier 42A is connected to a negative input terminal of the amplifier 42C and the first end of the resistor 41A, and is supplied with the signal SIGA. A negative input terminal of the amplifier 42A is connected to a positive input terminal of the amplifier 42B and the first end of the resistor 41B, and is supplied with the signal SIGB. The positive input terminal of the amplifier 42B is connected to the negative input terminal of the amplifier 42A and the first end of the resistor 41B, and is supplied with the signal SIGB. A negative input terminal of the amplifier 42B is connected to a positive input terminal of the amplifier 42C and the first end of the resistor 41C, and is supplied with the signal SIGC. The positive input terminal of the amplifier 42C is connected to the negative input terminal of the amplifier 42B and the first end of the resistor 41C, and is supplied with the signal SIGC. The negative input terminal of the amplifier 42C is connected to the positive input terminal of the amplifier 42A and the first end of the resistor 41A, and is supplied with the signal SIGA.

With this configuration, the amplifier 42A outputs a signal corresponding to difference between the signal SIGA and the signal SIGB, the amplifier 42B outputs a signal corresponding to difference between the signal SIGB and the signal SIGC, and the amplifier 42C outputs a signal corresponding to difference between the signal SIGC and the signal SIGA.

FIG. 8 illustrates an operation example of the amplifiers 42A, 42B, and 42C. In this example, the signal SIGA is set to the high level voltage VH, and the signal SIGB is set to the low level voltage VL. At this time, the voltage of the signal SIGC is set to the middle level voltage VM by the resistors 41A, 41B, and 41C. In this case, a current Iin flows through the input terminal TinA, the resistor 41A, the resistor 41B, and the input terminal TinB in order. The positive input terminal of the amplifier 42A is supplied with the high level voltage VH and the negative input terminal thereof is supplied with the low level voltage VL, and the difference therebetween accordingly becomes positive. Therefore, the amplifier 42A outputs "1". The positive input terminal of the amplifier 42B is supplied with the low level voltage VL and the negative input terminal thereof is supplied with the middle level voltage VM, and the difference therebetween accordingly becomes negative. Therefore, the amplifier 42B outputs "0". Further, the positive input terminal of the amplifier 42C is supplied with the middle level voltage VM and the negative input terminal thereof is supplied with the high level voltage VH, and the difference therebetween accordingly becomes negative. Therefore, the amplifier 42C outputs "0".

The delay section 50A sets a delay amount based on a delay control signal CTLA, and delays the output signal of the amplifier 42A and outputs the delayed signal. The delay section 50A includes delay buffers 51 to 53, and a selector 54. An input terminal of the delay buffer 51 is connected to an output terminal of the amplifier 42A and a first input terminal of the selector 54. An output terminal of the delay buffer 51 is connected to an input terminal of the delay buffer 52 and a second input terminal of the selector 54. The input terminal of the delay buffer 52 is connected to the output terminal of the delay buffer 51 and the second input terminal of the selector 54. An output terminal of the delay buffer 52 is connected to an input terminal of the delay buffer 53 and a third input terminal of the selector 54. The input terminal of the delay buffer 53 is connected to the output terminal of the delay buffer 52 and the third input terminal of the selector 54. An output terminal of the delay buffer 53 is connected to a fourth input terminal of the selector 54. The selector 54 selects and outputs one of a signal input to the first input terminal, a signal input to the second input terminal, a signal input to the third input terminal, and a signal input to the fourth input terminal, based on the delay control signal CTLA. With this configuration, the delay section 50A adjusts the delay amount of the output signal of the amplifier 42A in four levels, based on the delay control signal CTLA.

Likewise, the delay section 50B sets the delay amount based on a delay control signal CTLB, and delays the output signal of the amplifier 42B and outputs the delayed signal. The delay section 50C sets the delay amount based on a delay control signal CTLC, and delays the output signal of the amplifier 42C and outputs the delayed signal.

With this configuration, the delay sections 50A, 50B, and 50C of the receiving section 21 adjust skew of the signals SIG1A, SIG1B, and SIG1C of the data lane DL1, respectively. The delay sections 50A, 50B, and 50C of the receiving section 22 adjust skew of the signals SIG2A, SIG2B, and SIG2C of the data lane DL2, respectively. Also, the delay sections 50A, 50B, and 50C of the receiving section 23 adjust skew of the signals SIG3A, SIG3B, and SIG3C of the data lane DL3, respectively.

The clock generation section 43 generates a clock RxCK, based on the output signals of the delay sections 50A, 50B, and 50C.

The flip-flop 44 delays the output signals of the delay sections 50A, 50B, and 50C by one clock of the clock RxCK, and outputs the resultant signals. In other words, each of the output signals of the flip-flop 44 indicates a current symbol CS2. Here, the current symbol SC2 indicates any one of the six symbols "+x". "−x", "+y", "−y", "+z", and "−z", similarly to the symbols CS and NS.

The flip-flop 45 delays the three output signals of the flip-flop 44 by one clock of the clock RxCK, and outputs the resultant signals. In other words, the flip-flop 45 delays the current symbol CS2 by one clock of the clock RxCK to generate a symbol PS2. The symbol PS2 is a previously received symbol (previous symbol), and indicates any one of the six symbols "+x". "−x", "+y", "−y", "+z", and "−z", similarly to the symbols CS, NS, and CS2.

The signal generation section 46 generates signals RxF, RxR, and RxP, based on the output signals of the flip-flops 44 and 45 and the clock RxCK. The signals RxF, RxR, and RxP generated by the signal generation section 46 of the receiving section 21 correspond to the signals TxF, TxR, and TxP in the transmitting section 11, respectively. The signals RxF, RxR, and RxP generated by the signal generation section 46 of the receiving section 22 correspond to the signals TxF, TxR, and TxP in the transmitting section 12, respectively. The signals RxF, RxR, and RxP generated by the signal generation section 46 of the receiving section 23 correspond to the signals TxF, TxR, and TxP in the transmitting section 13, respectively. In other words, these signals RxF, RxR, and RxP indicate transition of the symbols, similar to the signals TxF, TxR, and TxP. The signal generation section 46 identifies the transition of the symbol (FIG. 5), based on the current symbol CS2 indicated by the output signal of the flip-flop 44 and the previous symbol PS2 indicated by the output signal of the flip-flop 45, to generate the signals RxF, RxR, and RxP.

The pattern detection section 47 detects pattern, based on the signals RxF, RxR, and RxP. Specifically, the pattern detection section 47 compares the synchronization code P12 in the SoT part P1 of the received packet PCT1 with a known pattern, and detects an error with use of the error detection code P21 in the header part P2, in a calibration mode. Then, when an error is not detected, the pattern detection section 47 informs the control section 48 of the comparison result of the patterns through a signal DET. In other words, the synchronization code P12 is a fixed pattern included in each packet PCT1 and is known. Therefore, the pattern detection section 47 compares the synchronization code P12 of the received packet PCT1 with such a known pattern. At this time, when the skew adjustment by the delay sections 50A, 50B, and 50C is sufficient, the patterns are coincident with each other, and when the skew adjustment is insufficient, the patterns are not coincident with each other. The pattern detection section 47 informs the control section 48 of such a comparison result.

The control section 48 determines the delay amounts of the delay sections 50A, 50B, and 50C in the calibration mode. Specifically, the control section 48 sequentially sets the delay amounts of the delay sections 50A, 50B, and 50C through the delay control signals CTLA, CTLB, and CTLC, respectively, in the calibration mode, and determines the delay amounts of the delay sections 50A, 50B, and 50C based on the comparison result (the signal DET) by the pattern detection section 47. The calibration mode may be set, for example, at a time when the power of the communication system 1 is turned on. Further, the calibration mode may be so configured as to be set up periodically.

As described above, in the communication system 1, in the calibration mode, the delay sections 50A, 50B, and 50C of the receiving section 21 adjust skew of the signals SIG1A, SIG1B, and SIG1C in the data lane DL1, respectively. The delay sections 50A, 50B, and 50C of the receiving section 22 adjust skew of the signals SIG2A, SIG2B, and SIG2C in the data lane DL2, respectively. The delay sections 50A, 50B, and 50C of the receiving section 23 adjust skew of the signals SIG3A, SIG3B, and SIG3C in the data lane DL3, respectively. As a result, in the communication system 1, it is possible to enhance communication performance.

Here, the amplifiers 42A to 42C correspond to a specific but non-limiting example of "first amplifier section" in the disclosure. The delay sections 50A to 50C correspond to a specific but non-limiting example of "first delay section" in the disclosure. The flip-flops 44 and 45, the signal generation section 46, the pattern detection section 47, and the control section 48 are correspond to a specific but non-limiting example of "control section" in the disclosure.

(Operation and Function)

Subsequently, operation and a function of the communication system 1 according to the first embodiment will be described.

(General Operation Outline)

First, with reference to FIGS. 1, 4, 7, and the like, general operation outline of the communication system 1 is described. The transmission data generation section 14 generates the transmission data, divides the transmission data into three pieces, and supplies the three pieces of transmission data to the transmitting sections 11, 12, and 13. The transmitting section 11 transmits the signals SIG1A, SIG1B, and SIG1C to the receiving section 21, the transmitting section 12 transmits the signals SIG2A, SIG2B, and SIG2C to the receiving section 22, and the transmitting section 13 transmits the signals SIG3A, SIG3B, and SIG3C to the receiving section 23.

In each of the transmitting sections 11, 12, and 13, the signal generation section 15 determines the next symbol NS based on the current symbol CS and the signals TxF, TxR, and TxP, and outputs the next symbol NS as the signal S1. The flip-flop 16 delays the signal S1 by one clock of the clock TxCK, and outputs the delayed signal S1 as the signal S2. The output section 30 generates the signals SIGA, SIGB, and SIGC based on the signal S2.

In each of the receiving sections 21, 22, and 23, the amplifier 42A outputs the signal corresponding to the difference between the signal SIGA and the signal SIGB, the amplifier 42B outputs the signal corresponding to the difference between the signal SIGB and the signal SIGC, and the amplifier 42C outputs the signal corresponding to the difference between the signal SIGC and the signal SIGA. The delay section 50A sets the delay amount based on the delay control signal CTLA to delay the output signal of the amplifier 42A, the delay section 50B sets the delay amount based on the delay control signal CTLB to delay the output signal of the amplifier 42B, and the delay section 50C sets the delay amount based on the delay control signal CTLC to delay the output signal of the amplifier 42C. The clock generation section 43 generates the clock RxCK based on the output signals of the delay sections 50A, 50B, and 50C. The flip-flop 44 delays the output signals of the delay sections 50A, 50B, and 50C by one clock of the clock RxCK and outputs the resultant signals. The flip-flop 45 delays the three output signals of the flip-flop 44 by one clock of the clock RxCK and outputs the resultant signals. The signal generation section 46 generates the signals RxF, RxR, and RxP based on the output signals of the flip-flops 44 and 45 and the clock RxCK. The pattern detection section 47 detects pattern based on the signals RxF, RxR, and RxP. Specifically, the pattern detection section 47 compares the synchronization code P12 of the received packet PCT1 with a known pattern and detects an error with use of the error detection code P21 in the calibration mode. Then, when an error is not detected, the pattern detection section 47 informs the control section 48 of the comparison result of the patterns through the signal DET. The control section 48 determines the delay amounts of the delay sections 50A, 50B, and 50C in the calibration mode.

(Detailed Operation of Receiving Sections 21, 22, and 23)

FIG. 9 illustrates an operation example of the receiving section 21. Note that the same applies to the receiving sections 22 and 23. The control section 48 sequentially switches over the delay control signals CTLA, CTLB, and CTLC to sequentially set the delay amounts of the delay sections 50A, 50B, and 50C, and acquires the comparison result by the pattern detection section 47, in the calibration mode. Then, the control section 48 determines the delay mounts of the delay sections 50A, 50B, and 50C based on the comparison result. The operation will be described in detail below.

First, the control section 48 of the receiving section 21 sets the operation mode to the calibration mode (step S1).

Then, the control section 48 sets the delay amounts of the delay sections 50A, 50B, and 50C to minimum (step S2). Specifically, the control section 48 controls the selector 54 in each of the delay sections 50A, 50B, and 50C to select and output a signal input to the first input terminal with use of the delay control signals CTLA, CTLB, and CTLC.

Then, the pattern detection section 47 performs pattern comparison (step S3). Specifically, the pattern detection section 47 compares the synchronization code P12 of the received packet PCT1 with a known pattern, and detects an error with use of the error detection code P21. Then, when an error is not detected, the pattern detection section 47 informs the control section 48 of the comparison result of the patterns through the signal DET.

Subsequently, the control section 48 confirms whether all combinations of the delay amounts of the delay sections 50A, 50B, and 50C have been set (step S4).

When it is not confirmed that all combinations of the delay amounts of the delay sections 50A, 50B, and 50C have been set at the step S4 ("N" at the step S4), the control section 48 sets the delay amount of unset combination out of all combinations of the delay amounts of the delay sections 50A, 50B, and 50C (step S5), and the process returns to the step S3. Then, the processes at the steps S3 to S5 are repeated until all combinations of the delay amounts of the delay sections 50A, 50B, and 50C are set. In other words, in this example, since the delay amount of each of the delay sections 50A, 50B, and 50C is set in four levels, the pattern detection section 47 performs the pattern comparison 64 times.

When it is confirmed that all combinations of the delay amounts of the delay sections 50A, 50B, and 50C have been set at the step S4 ("Y" at the step S4), the control section 48 determines the delay amounts of the delay sections 50A, 50B, and 50C (step S6). Specifically, the control section 48 selects the delay amounts of the delay sections 50A, 50B, and 50C so that the synchronization code P12 is coincident with the known pattern, based on the pattern comparison result acquired at the steps S3 to S5. There are a plurality of combinations of the delay amounts in which the synchronization code P12 is coincident with the known pattern, for example, the control section 48 may select a combination having a large margin that is expected to allow communication while suppressing influence of skew even if the skew is further generated by temperature variation, power voltage variation, or the like. Then, the control section 48 instructs the delay sections 50A, 50B, and 50C to delay the input signals by the corresponding delay amount determined at the step S6, through the delay control signals CTLA, CTLB, and CTLC, respectively.

Then, the control section 44 ends the calibration mode (step S7).

In this way, the flow is ended. After that, the delay sections 50A, 50B, and 50C delay the signals SIGA, SIGB, and SIGC, respectively, by the delay amount determined at the step S6. This allows the receiving sections 21, 22, and 23 to receive the data transmitted from the transmitting sections 11, 12, and 13, respectively, while suppressing influence of skew. Accordingly, it is possible to enhance communication performance in the communication system 1.

Moreover, in the communication system 1, it is possible to simplify the configuration because skew is adjusted with use of the synchronization code P12 of the received packet PCT1. In a communication system, typically, a fixed code for synchronization of communication such as the synchronization code P12 is often used. In the communication system 1, the pattern comparison is performed with use of such a known fixed code. Therefore, it is unnecessary to provide a circuit generating a specific code for the skew adjustment, which makes it possible to simplify the configuration.

In addition, in the communication system 1, skew is adjusted in this way. Therefore, members such as a printed circuit board (PCB) of the transmitter 10 and a printed circuit board of the receiver 20 are applicable to various applications.

FIG. 10A illustrates a mounting example of the transmitter 10. In this example, a chip 110 in which the transmission data generation section 14, the transmitting sections 11, 12, and 13, and the like are integrated is mounted on a printed circuit board 100. The printed circuit board 100 includes ten pattern wirings 101. A first end of each of the pattern wirings 101 is connected to the chip 110, and a second end thereof is mounted with a connector 102. Out of the ten pattern wirings 101, nine pattern wirings 101 correspond to the data lanes DL1, DL2, and DL3. Remaining one pattern wiring 101 is not used in this example. Lengths of the three pattern wirings in each of the data lanes DL1, DL2, and DL3 may be desirably equal to one another.

FIG. 10B illustrates a mounting example of a transmitter 200 according to another application using the printed circuit board 100. In this example, a chip 120 is mounted on the printed circuit board 100. The chip 120 is configured by integrating circuits outputting five pairs of differential signals (channels CH1 to CH5) in this example. In each of the channels CH1 to CH5, lengths of two pattern wirings may be desirably equal to each other.

As illustrated in FIGS. 10A and 10B, when the same printed circuit board 100 is used in two applications, for example, the lengths of the ten pattern wirings may be desirably equal to one another. However, such pattern layout is often difficult actually. In such a case, for example, there is a case where priority is given to the application illustrated in FIG. 10B, and the lengths of the two pattern wirings in each of the channels CH1 to CH5 are made equal to each other. In the case where such a printed circuit board 100 is used in the transmitter 10, the lengths of the three pattern wirings are not equal to one another in each of the data lanes DL1, DL2, and DL3, which may cause skew. In particular, when the data transfer rate is high, the skew becomes remarkable. In the communication system 1, skew is adjusted as described above. Therefore, it is possible to perform communication while suppressing influence of skew in such a case.

Incidentally, in this example, the printed circuit board 100 is applied to the plurality of applications. However, this is non-limiting. For example, when a chip in which both of the functions of the chip 110 and the chip 120 are achievable by switching over is prepared, a module in which such a chip is mounted on the printed circuit board 100 is also applicable to a plurality of applications. In this way, various members are applicable to various applications.

(Effects)

As described above, in the first embodiment, the three delay sections are provided in the receiving section. Therefore, it is possible to enhance communication performance, and members such as a printed circuit board are applicable to various applications.

In the first embodiment, skew is adjusted with use of a synchronization code. Therefore, it is possible to simplify the configuration.

(Modification 1-1)

In the above-described embodiment, skew is adjusted in the receiving sections 21, 22, and 23. However, the configuration is not limited thereto, and skew may be adjusted further in the transmitting section. The present modification will be described in detail below.

FIG. 11 illustrates a configuration example of a communication system 1A according to the present modification. The communication system 1A includes a receiver 20A and a transmitter 10A.

The receiver 20A includes receiving sections 21A, 22A, and 23A, and a delay amount information transmitting section 27A. The receiving section 21A receives the signals SIG1A, SIG1B, and SIG1C and generates delay amount information IS1. The receiving section 22A receives the signals SIG2A, SIG2B, and SIG2C and generates delay amount information IS2. The receiving section 23A receives the signals SIG3A, SIG3B, and SIG3C and generates delay amount information IS3.

FIG. 12 illustrates a configuration example of the receiving section 21A. Note that the same applies to the receiving sections 22A and 23A. The receiving section 21A includes a control section 48A. The control section 48A determines the delay amounts of the delay sections 50A, 50B, and 50C in the calibration mode, similarly to the control section 48 according to the above-described embodiment. In addition, the control section 48A also has a function of outputting information about the determined delay amount as the delay amount information IS1.

The delay amount information transmitting section 27A transmits the delay amount information IS1, IS2, and IS3 that are supplied from the receiving sections 21A, 22A, and 23A, respectively, to the transmitter 10A as delay amount information IS. The delay amount information IS may be transmitted through a prepared dedicated signal line. Alternatively, for example, the delay amount information IS may be transmitted through unused data lane out of the data lanes DL1 to DL3.

The transmitter 10A includes a delay amount information receiving section 17A and transmitting sections 11A, 12A, and 13A. The delay amount information receiving section 17A receives the delay amount information IS that is supplied from the receiver 20A. Then, the delay amount information receiving section 17A generates a control signal IT1 that instructs delay amounts of delay sections 33A, 33B, and 33C (described later) of the transmitting section 11A, generates a control signal IT2 that instructs delay amounts of delay sections 33A, 33B and 33C (described later) of the transmitting section 11B, and generates a control signal IT3 that instructs delay amounts of delay sections 33A, 33B, and 33C (described later) of the transmitting section 11C, based on the received delay amount information IS. The transmitting section 11A transmits data to the receiving section 21A through the data lane DL1 based on the control signal IT1. The transmitting section 12A transmits data to the receiving section 22A through the data lane DL2 based on the control signal IT2. The transmitting section 13A transmits data to the receiving section 23A through the data lane DL3 based on the control signal IT3.

FIG. 13 illustrates a configuration example of the transmitting section 11A. FIG. 14 illustrates a configuration example of an output section 30A of the transmitting section 11A. Note that the same applies to the transmitting sections 12A and 13A. The output section 30A includes a control section 39 and the delay sections 33A, 33B, and 33C. The control section 39 controls the delay amounts of the delay sections 33A, 33B, and 33C based on the control signal IT1. The delay section 33A is interposed between the output control section 31 and the driver 32A. The delay section 33A delays two control signals supplied from the output control section 31 based on the delay control signal supplied from the control section 39, and supplies the delayed control signals to the driver 32A. The delay section 33B is interposed between the output control section 31 and the driver 32B. The delay section 33B delays two control signals supplied from the output control section 31 based on the delay control signal supplied from the control section 39, and supplies the delayed control signals to the driver 32B. The delay section 33C is interposed between the output control section 31 and the driver 32C. The delay section 33C delays two control signals supplied from the output control section 31 based on the delay control signal supplied from the control section 39, and supplies the delayed signals to the driver 32C. In this example, the configuration of each of the delay sections 33A, 33B, and 33C is similar to the configuration of the delay section 50A, or the like. With this configuration, the delay sections 33A, 33B, and 33C of the transmitting section 11A adjust skew of the signals SIG1A, SIG1B, and SIG1C of the data lane DL1, respectively. The delay sections 33A, 33B, and 33C of the transmitting section 12A adjust skew of the signals SIG2A, SIG2B, and SIG2C of the data lane DL2, respectively. The delay sections 33A, 33B, and 33C of the transmitting section 13A adjust skew of the signals SIG3A, SIG3B, and SIG3C of the data lane DL3, respectively.

In this way, in the communication system 1A, skew is adjusted in not only the receiving sections 21, 22, and 23 but also the transmitting sections 11A, 12A, and 13A. Therefore, it is possible to address larger skew. Specifically, for example, even if skew is further generated due to temperature variation, power voltage variation, or the like in addition to skew caused by difference of lengths of the paths through which the three signals SIGA, SIGB, and SIGC are transmitted, it is possible to perform communication while suppressing influence of the skew.

(Modification 1-2)

In the above-described embodiment, skew is adjusted in the receiving sections 21, 22, and 23. The configuration is not limited thereto, and alternatively, for example, the transmitting section may adjust skew. Specifically, for example, in the communication system 1A (FIGS. 11 to 14) according to the modification 1-1, the delay sections 50A, 50B, and 50C may be omitted from the receiving sections 21A, 22A, and 23A. Even when the communication system is configured in this way, effects similar to those of the communication system 1 according to the above-described embodiments are obtainable.

(Modification 1-3)

In the above-described embodiment, the delay amounts of the delay sections 50A, 50B, and 50C in the receiving section 21 are determined based on the reception result of the receiving section 21, the delay amounts of the delay sections 50A, 50B, and 50C in the receiving section 22 are determined based on the reception result of the receiving section 22, and the delay amounts of the delay sections 50A, 50B, and 50C in the receiving section 23 are determined based on the reception result of the receiving section 23. However, the configuration is not limited thereto, and alternatively, for example, a redundant receiving section that determines the delay amounts of the delay sections 50A, 50B, and 50C in each of the receiving sections 21, 22, and 23 may further provided. A communication system 1C according to the present modification will be described in detail below.

FIG. 15 illustrates a configuration example of the communication system 1C. The communication system 1C includes a receiver 20C. The receiver 20C includes a receiving section 28C, and receiving sections 21C, 22C, and 23C. The receiving section 28C generates the delay amount information IS1, IS2, and IS3, based on the signals SIG1A to SIG1C, SIG2A to SIG2C, and SIG3A to SIG3C.

FIG. 16 illustrates a configuration example of the receiving section 28C. The receiving section 28C includes selectors 55A, 55B, and 55C, and a control section 58C.

The selector 55A selects and outputs one of the signals SIG1A, SIG2A, and SIG3A based on a data lane selection signal SEL. The selector 55B selects and outputs one of the signals SIG1B, SIG2B, and SIG3B based on the data lane selection signal SEL. The selector 55C selects and outputs one of the signals SIG1C, SIG2C, and SIG3C based on the data lane selection signal SEL. In other words, the selectors 55A, 55B, and 55C each select the signal SIGA, SIGB, or SIGC relating to one of the data lanes DL1 to DL3, based on the data lane selection signal SEL.

The control section 58C selects one of the data lanes DL1, DL2, and DL3 through the data lane selection signal SEL, and determines the delay amounts of the delay sections 50A, 50B, and 50C based on the three signals corresponding to the selected data lane, similarly to the control section 48 according to the above-described embodiment. Then, the control section 58C outputs the delay amounts that are determined based on the three signals SIG1A, SIG1B, and SIG1B corresponding to the data lane DL1, as the delay amount information IS1, outputs the delay amounts that are determined based on the three signals SIG2A, SIG2B, and SIG2C corresponding to the data lane DL2, as the delay amount information IS2, and outputs the delay amounts that are determined based on the three signals SIG3A, SIG3B, and ISG3C corresponding to the data lane DL3, as the delay amount information IS3.

The receiving section 21C receives the signals SIG1A, SIG1B, and SIG1C based on the delay amount information IS1. The receiving section 22C receives the signals SIG2A, SIG2B, and SIG2C based on the delay amount information IS2 based on the delay amount information IS2. The receiving section 23C receives the signals SIG3A, SIG3B, and SIG3C based on the delay amount information IS3.

FIG. 17 illustrates a configuration example of the receiving section 21C. Note that the same applies to the receiving sections 22C and 23C. The receiving section 21C includes a control section 48C. The control section 48C determines the delay amounts of the delay sections 50A, 50B, and 50C in the calibration mode, similarly to the control section 48 according to the above-described embodiment. Further, the control section 48C also has a function of setting the delay amounts of the delay sections 50A, 50B, and 50C based on the delay amount information IS1 in a normal operation mode.

With this configuration, in the communication system 1C, first, the receiving sections 21C, 22C, and 23C operate in the calibration mode at the time when the power is turned on, and adjust skew. Then, after the calibration mode is ended, the receiving sections 21C, 22C, and 23C operate in the normal operation mode, and receive data transmitted from the transmitting sections 11, 12, and 13, respectively. Then, the receiving section 28C sequentially selects one of the data lanes DL1, DL2, and DL3, determines the delay amounts of the delay sections 50A, 50B, and 50C based on the three signals corresponding to the selected data lane to generate the delay amount information IS1, IS2, and IS3. The receiving section 21C readjusts the skew based on the delay amount information IS1, the receiving section 22C readjusts the skew based on the delay amount information IS2, and the receiving section 23C readjusts the skew based on the delay amount information IS3.

In this way, in the communication system 1C, the receiving section 28C sequentially examines skews of the three signals in each of the data lanes DL1, DL2, and DL3 while the receiving sections 21C, 22C, and 23C receive data transmitted from the transmitting sections 11, 12, and 13, respectively. As a result, in the communication system 1C, it is possible to adjust skew without stopping communication even if the skew is varied due to temperature variation, power voltage variation, or the like.

Incidentally, in this example, the receiving sections 21C, 22C, and 23C each adjust skew by itself in the calibration mode, and adjust the skew based on the delay amount information IS1, IS2, and IS3, respectively, after the calibration mode is ended. However, the configuration is not limited thereto. For example, the calibration mode may not be provided and the receiving sections 21C, 22C, and 23C may adjust skew constantly based on the delay amount information IS1, IS2, and IS3, respectively. FIG. 18 illustrates a configuration example of a receiving section 21D in this case. Note that the same applies to receiving sections 22D and 23D. The receiving section 21D is configured by omitting the pattern detection section 47 and replacing the control section 48C with a control section 48D in the receiving section 21 according to the above-described modification. The control section 48D sets the delay amounts of the delay sections 50A, 50B, and 50C based on the skew information IS1. In this configuration, the receiving sections 21D, 22D, and 23D do not perform skew adjustment by itself, and perform the skew adjustment based on the delay amount information IS1, IS2, and IS3, respectively, that are generated by the receiving section 28C.

(Modification 1-4)

In the above-described embodiment, the control section 48 sequentially changes the delay amounts of the three delay sections 50A, 50B, and 50C. However, the configuration is not limited thereto, and for example, the control section 48 may sequentially change the delay amounts of one or two of the three delay sections 50A, 50B, and 50C. Specifically, for example, when the wiring length of one of the pattern wirings of the printed circuit board is different from the wiring lengths of the other pattern wirings, only the delay amount of the delay section relating to the wiring length of the one of the pattern wirings may be adjusted.

(Modification 1-5)

In the above-described embodiment, for example, when the voltage of the output terminal Tout1 is set to the middle level voltage VM, the transistors 35 and 36 are put into the OFF state. However, the configuration is not limited thereto, and alternatively, the transistors 35 and 36 may be put into the ON state. This realizes Thevnin termination, and it is possible to set the voltage of the output terminal Tout1 to the middle level voltage VM.

(Other Modification)

Two or more of these modifications may be combined.

<2. Second Embodiment>

Next, a communication system 2 according to a second embodiment is described. In the second embodiment, a packet dedicated for the skew adjustment is provided. Note that like numerals are used to designate substantially like components of the communication system 1 according to the above-described first embodiment, and the description thereof is appropriately omitted.

FIG. 19 illustrates a configuration example of the communication system 2. The communication system 2 includes a transmitter 60 and a receiver 70. The transmitter 60 includes the transmitting sections 11A, 12A, and 13A, a control section 67, and a transmission data generation section 64.

As illustrated in FIGS. 13 and 14, the transmitting section 11A sets the delay amounts of the delay sections 33A, 33B, and 33C based on the control signal IT1, and transmits data to the receiver 70 through the data lane DL1. Likewise, the transmitting section 12A sets the delay amounts of the delay sections 33A, 33B, and 33C based on the control signal IT2, and transmits data to the receiver 70 through the data lane DL2, and the transmitting section 13A sets the delay amounts of the delay sections 33A, 33B, and 33C based on the control signal IT3, and transmits data to the receiver 70 through the data lane DL3.

The control section 67 generates the control signal IT1 that instructs the delay amounts of the delay sections 33A, 33B, and 33C of the transmitting section 11A, generates the control signal IT2 that instructs the delay amounts of the delay sections 33A, 33B, and 33C of the transmitting section 12A, generates the control signal IT3 that instructs the delay amounts of the delay sections 33A, 33B, and 33C of the transmitting section 13A, and generates delay amount data DD including information about these delay amounts, in the calibration mode. Moreover, the control section 67 also has a function of generating the control signals IT1, IT2, and IT3 based on the delay amount data ID.

The transmission data generation section 64 generates transmission data including information of the delay amounts of the delay sections 33A to 33C of the transmitting section 11A to supply the transmission data to the transmitting section 11A, generates transmission data including information of the delay amounts of the delay sections 33A to 33C of the transmitting section 12A to supply the transmission data to the transmitting section 12A, and generates transmission data including information of the delay amounts of the delay sections 33A to 33C of the transmitting section 13A to supply the transmission data to the transmitting section 13A, based on the delay amount data DD.

With this configuration, the transmitting sections 11A, 12A, and 13A each transmit data with use of the packet PCT1 (FIG. 2) in the normal operation mode, and each transmit data with use of a packet PCT2 that is different from the packet PCT1, in the calibration mode.

FIG. 20 illustrates a configuration example of the packet PCT2. The SoT part P1 includes a synchronization mode P13 specific to the calibration mode in place of the synchronization code P12 in the normal operation mode. In addition, the payload part P3 includes delay amount data P31 that indicates the delay amounts of the delay sections 33A to 33C of the transmitting section transmitting the packet PCT2 out of the transmitting sections 11A, 12A, and 13A.

The receiver 70 includes receiving sections 71 to 73 and a delay amount data transmitting section 77. The receiving section 71 receives the signals SIG1A, SIG1B, and SIG1C and generates delay amount data ID1. The receiving section 72 receives the signals SIG2A, SIG2B, and SIG2C and generates delay amount data ID2. The receiving section 73 receives the signals SIG3A, SIG3B, and SIG3C and generates delay amount data ID3.

FIG. 21 illustrates a configuration example of the receiving section 71. Note that the same applies to the receiving sections 72 and 73. The receiving section 71 is configured by omitting the delay sections 50A, 50B, and 50C and the control section 48, and replacing the pattern detection section 47 with the pattern detection section 79 in the receiving section 21 (FIG. 7) according to the first embodiment. The pattern detection section 79 detects whether the synchronization code in the SoT part P1 of the received packet is the synchronization code P12 or P13 by pattern comparison. When the detected synchronization code is the synchronization code P13, the pattern detection section 79 determines that the received packet is the packet PCT2, and acquires the delay amount data P31 from the payload part P3 to output the delay amount data P31 as the delay amount data ID1.

The delay amount data transmitting section 77 transmits the delay amount data ID1, ID2, and ID3 supplied from the respective receiving sections 71 72, and 73, to the transmitter 60 as the delay amount data ID. The delay amount data ID may be transmitted through a prepared dedicated signal line. In addition, for example, the delay amount data ID may be transmitted through unused data lane out of the data lanes DL1 to DL3.

FIG. 22 illustrates an operation example of the communication system 2.

First, the control section 67 of the transmitter 60 sets the operation mode to the calibration mode (step S11).

Then, the control section 67 sets the delay amounts of the delay sections 33A, 33B, and 33C in each of the transmitting sections 11A, 12A, and 13A to minimum (step S12).

Next, the transmitter 60 transmits data (step S13). Specifically, first, the control section 67 generates the delay amount data DD that includes information about the delay amounts of the delay sections 33A, 33B, and 33C of the transmitting section 11A, information about the delay amounts of the delay sections 33A, 33B, and 33C of the transmitting section 12A, and information about the delay amounts of the delay sections 33A, 33B, and 33C of the transmitting section 12C. Then, the transmission data generation section 64 generates the transmission data including the information of the delay amounts of the delay sections 33A, 33B, and 33C of the transmitting section 11A to supply the transmission data to the transmitting section 11A, generates the transmission data including the information of the delay amounts of the delay sections 33A, 33B, and 33C of the transmitting section 12A to supply the transmission data to the transmitting section 12A, and generates the transmission data including the information of the delay amounts of the delay sections 33A, 33B, and 33C of the transmitting section 13A to supply the transmission data to the transmitting section 13A, based on the delay amount data DD. Then, the transmitting section 11A transmits the data to the receiving section 71 through the data lane DL1, the transmitting section 11B transmits the data to the receiving section 72 through the data lane DL2, and the transmitting section 11C transmits the data to the receiving section 73 through the data lane DL3. In this way, the transmitting sections 11A, 12A, and 13A each transmit the data with use of the packet PCT2 illustrated in FIG. 20.

Next, the pattern detection section 79 in each of the receiving sections 71, 72, and 73 performs pattern detection (step S14). Specifically, each pattern detection section 79 detects whether the synchronization code in the SoT part P1 of the received packet is the synchronization code P12 or P13, by the pattern comparison. Then, when the detected synchronization code is the synchronization code P13, each pattern detection section 79 determines that the received packet is the packet PCT2, and acquires the delay amount data P31 from the payload part P3. Then, the pattern detection section 79 of the receiving section 71 outputs the delay amount data P31 as the delay amount data ID1, the pattern detection section 79 of the receiving section 72 outputs the delay amount data P31 as the delay amount data ID2, and the pattern detection section 79 of the output section 73 outputs the delay amount data P31 as the delay amount data ID3. Then, the delay amount data transmitting section 77 transmits the delay amount data ID1, ID2, and ID3 to the transmitter 60 as the delay amount data ID.

Next, the control section 67 of the transmitter 60 confirms whether all combinations of the delay amounts of the delay sections 33A, 33B, and 33C in each of the transmitting section 11A, 12A, and 13A have been set (step S15).

When it is not confirmed that all combinations of the delay amounts of the delay sections 33A, 33B, and 33C have been set at the step S15 ("N" at the step S15), the control section 67 sets the delay amount of unset combination out of all combinations of the delay amounts of the delay sections 33A, 33B, and 33C (step S16), and the process returns to the step S13. Then, the processes at the steps S13 to S16 are repeated until all combinations of the delay amounts of the delay sections 33A, 33B, and 33C are set. In other words, in this example, since the delay amount of each of the delay sections 33A, 33B, and 33C is set in four levels, the control section 67 performs the pattern comparison 64 times.

When it is confirmed that all combinations of the delay amounts of the delay sections 33A, 33B, and 33C have been set at the step S15 ("Y" at the step S15), the control section 67 determines the delay amounts of the delay sections 33A, 33B, and 33C in each of the transmitting sections 11A, 12A, and 13A (step S17). Specifically, the control section 67 determines the delay amounts of the delay sections 33A to 33C of the transmitting section 11A, determines the delay amounts of the delay sections 33A to 33C of the transmitting section 12A, and determines the delay amounts of the delay sections 33A to 33C of the transmitting section 13A, based on the delay amount data ID acquired at the steps S13 to S16. Then, the control section 67 instructs the delay sections 33A, 33B, and 33C in each of the transmitting sections 11A, 12A, and 13A to delay the input signals by the corresponding delay amount determined at the step S17, through the control signals IT1, IT2, and IT3.

Next, the control section 67 ends the calibration mode (step S18).

The flow is ended in this way. After that, the delay sections 33A, 33B, and 33C in each of the transmitting sections 11A, 12A, and 13A each delay the signal by the delay amount determined at the step S17. In this way, the skew adjustment is performed by the transmitting sections 11A, 11B, and 11C. As a result, it is possible to enhance communication performance in the communication system 2.

In the communication system 2, the packet PCT2 dedicated for the skew adjustment is provided. Therefore, for example, the delay amount data P31 is included in the payload part P3 of the packet PCT2, which makes it possible to enhance flexibility of the skew adjustment.

As described above, in the second embodiment, the packet dedicated for the skew adjustment is provided. Therefore, it is possible to enhance flexibility of the skew adjustment. Other effects are similar to those in the above-described first embodiment.

(Modification 2-1)

In the above-described embodiment, the control section 67 of the transmitter 60 determines the delay amounts of the delay sections 33A, 33B, and 33C in each of the transmitting sections 11A, 12A, and 13A based on the delay amount data ID. However, the configuration is not limited thereto. Alternatively, for example, the delay amount data transmitting section 77 of the receiver 70 may determine the delay amounts of the delay sections 33A, 33B, and 33C of the transmitting section 11A based on the delay amount data ID1, may determine the delay amounts of the delay sections 33A, 33B, and 33C of the transmitting section 11B based on the delay amount data ID2, and may determine the delay amounts of the delay sections 33A, 33B, and 33C of the transmitting section 11C based on the delay amount data ID3, and may transmit the determined delay amounts to the transmitter 60 as the delay amount data ID.

<3. Third Embodiment>

Next, a communication system 3 according to a third embodiment is described. In the third embodiment, the skew detection is performed by a method different from the pattern comparison. Note that like numerals are used to designate substantially like components of the communication systems 1 and 2 according to the above-described first embodiment and the like, and the description thereof is appropriately omitted.

FIG. 23 illustrates a configuration example of the communication system 3. The communication system 3 includes a transmitter 80 and a receiver 90.

The transmitter 80 includes a control section 87. The control section 87 receives phase information IP supplied from the receiver 90 in the calibration mode. The control section 87 generates the control signal IT1 that instructs the delay amounts of the delay sections 33A, 33B, and 33C of the transmitting section 11A, generates the control signal IT2 that instructs the delay amounts of the delay sections 33A, 33B, and 33C of the transmitting section 11B, and generates the control signal IT3 that instructs the delay amounts of the delay sections 33A, 33B, and 33C of the transmitting section 11C, based on the phase information IP.

The receiver 90 includes receiving sections 91, 92, and 93 and a phase information transmitting section 97. The receiving section 91 receives the signals SIG1A, SIG1B, and SIG1C, and generates phase information IP1. The receiving section 92 receives the signals SIG2A, SIG2B, and SIG2C, and generates phase information IP2. The receiving section 93 receives the signals SIG3A, SIG3B, and SIG3C, and generates phase information IP3.

FIG. 24 illustrates a configuration example of the receiving section 91. Note that the same applies to the receiving sections 92 and 93. The receiving section 91 is configured by omitting the pattern detection section 47, the control section 48, and the delay sections 50A, 50B, and 50C and adding a phase comparison circuit 130 in the receiving section 21 (FIG. 7) according to the first embodiment.

The phase comparison circuit 130 compares a phase of an output signal SAB of the amplifier 42A, a phase of an output signal SBC of the amplifier 42B, and a phase of an output signal SCA of the amplifier 42C in this example. The phase comparison circuit 130 includes flip-flops (F/Fs) 131 to 133 and 136 to 138, and AND circuits 134 and 139. A data input terminal of the flip-flop 131 is connected to the output terminal of the amplifier 42B, a clock terminal thereof is connected to the output terminal of the amplifier 42A, and an output terminal thereof is connected to a first input terminal of the AND circuit 134 and a data input terminal of the flip-flop 132. The data input terminal of the flip-flop 132 is connected to the output terminal of the flip-flop 131 and the first input terminal of the AND circuit 134, a clock input terminal thereof is connected to the output terminal of the amplifier 42A, and an output terminal thereof is connected to a second input terminal of the AND circuit 134 and a data input terminal of the flop-flop 133. The data input terminal of the flip-flop 133 is connected to the output terminal of the flip-flop 132 and the second input terminal of the AND circuit 134, a clock input terminal thereof is connected to the output terminal of the amplifier 42A, and an output terminal thereof is connected to a third input terminal of the AND circuit 134. The AND circuit 134 determines and outputs a logical product of the output signals of the flip-flops 131 to 133. A data input terminal of the flip-flop 136 is connected to the output terminal of the amplifier 42C, a clock terminal thereof is connected to the output terminal of the amplifier 42A, and an output terminal thereof is connected to a first input terminal of the AND circuit 139 and a data input terminal of the flip-flop 137. The data input terminal of the flip-flop 137 is connected to the output terminal of the flip-flop 136 and the first input terminal of the AND circuit 139, a clock input terminal thereof is connected to the output terminal of the amplifier 42A, and an output terminal thereof is connected to a second input terminal of the AND circuit 139 and a data input terminal of the flip-flop 138. The data input terminal of the flip-flop 138 is connected to the output terminal of the flip-flop 137 and the second input terminal of the AND circuit 139, a clock input terminal thereof is connected to the output terminal of the amplifier 42A, and an output terminal thereof is connected to a third input terminal of the AND circuit 139. The AND circuit 139 determines and outputs a logical product of the output signals of the flip-flops 136 to 138. The phase comparison circuit 130 outputs the output signals of the AND circuits 134 and 139 as the phase information IP1.

The phase information transmitting section 97 transmits the phase information IP1, IP2, and IP3 respectively supplied from the receiving sections 91, 92, and 93 to the transmitter 80 as the phase information IP. The phase information transmitting section 97 may include, for example, a selector that selects and outputs one of the phase information IP1, IP2, and IP3. The phase information IP is transmitted through a prepared dedicated signal line. Note that the configuration is not limited thereto, and for example, the phase information IP may be transmitted by parallel signals without providing the selector. Moreover, for example, the phase information transmitting section 97 may transmit the phase information IP through unused data lane out of the data lanes DL1 to DL3.

FIG. 25 illustrates an operation example of the communication system 3.

First, the control section 87 of the transmitter 80 sets the operation mode to the calibration mode (step S21).

Then, each of the transmitting sections 11A, 12A, and 13A alternately transmits the symbols "+x" and "−x" (step S22). Specifically, for example, the post code P51 of the packet PCT1 may be used. The post code P51 has a pattern in which the symbols "+x" and "−x" are alternately arranged, a pattern in which the symbols "+y" and "−y" are alternately arranged, or a pattern in which the symbols "+z" and "−z" are alternately arranged, depending on the last data of the footer part P4. Each of the transmitting sections 11A, 12A, and 13A may use, for example, such a post code P51 to alternately transmit the symbols "+x" and "−x".

Then, the control section 87 sequentially sets the delay amounts of the delay sections 33A and 33B in each of the transmitting sections 11A, 12A, and 13A to acquire the phase information IP (step S23).

FIGS. 26 to 28 illustrate phase comparison operation of the phase comparison circuit 130. FIG. 26 illustrates a case where the phase of the signal SIGA is substantially coincident with the phase of the signal SIGB, FIG. 27 illustrates a case where the phase of the signal SIGA is advanced as compared with the phase of the signal SIGB, and FIG. 28 illustrates a case where the phase of the signal SIGA is delayed from the phase of the signal SIGB. In FIGS. 26 to 28, (A) illustrates a waveform of the signal SIGA, (B) illustrates a waveform of the signal SIGB, (C) illustrates a waveform of the signal SIGC, (D) illustrates difference between the signal SIGA and the signal SIGB (SIGA−SIGB), (E) illustrates difference between the signal SIGB and the signal SIGC (SIGB−SIGC), (F) illustrates difference between the signal SIGC and the signal SIGA (SIGC−SIGA), (G) illustrates a waveform of the signal SAB, (H) illustrates a waveform of the signal SBC, and (I) illustrates a waveform of the signal SCA. As illustrated in FIGS. 26 to 28, when the symbols "+x" and "−x" are alternately transmitted, the signal SIGA becomes a signal in which the voltage is alternated between the high level voltage VH and the low level voltage VL, the signal SIGB becomes a signal obtained by inverting the signal SIGA, and the signal SIGC becomes a DC signal maintaining the middle level voltage VM.

As illustrated in FIG. 27, when the phase of the signal SIGA is advanced as compared with the phase of the signal SIGB, the signal SBC becomes high level ("1") ((H) of FIG. 27) and the signal SCA becomes low level ("0") ((I) of FIG. 27) at the rising timing of the signal SAB. Therefore, the flip-flop 131 of the phase comparison circuit 130 outputs a high level signal and the flip-flop 136 outputs a low level signal. As a result, the AND circuit 134 outputs a high level signal and the AND circuit 139 outputs a low level signal.

As illustrated in FIG. 28, when the phase of the signal SIGA is delayed from the phase of the signal SIGB, the signal SBC becomes low level ("0") ((H) of FIG. 28) and the signal SCA becomes high level ("1") ((I) of FIG. 28) at the rising timing of the signal SAB. Therefore, the flip-flop 131 of the phase comparison circuit 130 outputs a low level signal and the flip-flop 136 outputs a high level signal. As a result, the AND circuit 134 outputs a low level signal and the AND circuit 139 outputs a high level signal.

The phase information transmitting section 97 generates the phase information IP based on the output signal of the phase comparison circuit 130, and supplies the phase information IP to the control section 87 of the transmitter 80. Then, the control section 87 sequentially sets the delay amounts of the delay sections 33A and 33B in each of the transmitting sections 11A, 12A, and 13A to adjust the phase of the signal SIGA and the phase of the signal SIGB.

Then, the control section 87 determines the delay amounts of the delay sections 33A and 33B (step S24). Specifically, the control section 87 selects the delay amounts of the delay sections 33A and 33B that allows the phase of the signal SIGA and the phase of the signal SIGB to be substantially coincident with each other. In this way, in the communication system 3, the phase comparison is performed with use of the fact that the post code P51 is a known pattern in which two symbols (symbols "+x" and "−x" in this example) are alternately arranged. Then, the control section sequentially sets the delay amounts of the delay sections 33A and 33B based on the phase comparison result to allow the phase of the signal SIGA and the phase of the signal SIGB to be substantially coincident with each other.

Next, each of the transmitting sections 11A, 12A, and 13A alternately transmits the symbols "+z" and "−z" (step S25). Specifically, each of the transmitting sections 11A, 12A, and 13A uses, for example, the post code P51 to alternately transmit the symbols "+z" and "−z", similarly to the process at the step S22.

Then, the control section 87 sequentially sets the delay amounts of the delay sections 33A and 33C in each of the transmitting sections 11A, 12A, and 13A to acquire the phase information IP (step S26).

FIGS. 29 to 31 illustrate the phase comparison operation of the phase comparison circuit 130. FIG. 29 illustrates a case where the phase of the signal SIGA is substantially coincident with the phase of the signal SIGC, FIG. 30 illustrates a case where the phase of the signal SIGA is advanced as compared with the phase of the signal SIGC, and FIG. 31 illustrates a case where the phase of the signal SIGA is delayed from the phase of the signal SIGC. As illustrated in FIGS. 29 to 31, when the symbols "+z" and "−z" are alternately transmitted, the signal SIGA becomes a signal in which the voltage is alternated between the high level voltage VH and the low level voltage VL, the signal SIGB becomes a DC signal maintaining the middle level voltage VM, and the signal SIGC becomes a signal obtained by inverting the signal SIGA.

As illustrated in FIG. 30, when the phase of the signal SIGA is advanced as compared with the phase of the signal SIGC, the signal SBC becomes low level ("0") ((H) of FIG. 30) and the signal SCA becomes high level ("1") ((I) of FIG. 30) at the rising timing of the signal SAB. Therefore, the flip-flop 131 of the phase comparison circuit 130 outputs a low level signal and the flip-flop 136 outputs a high level signal. As a result, the AND circuit 134 outputs a low level signal and the AND circuit 139 outputs a high level signal.

As illustrated in FIG. 31, when the phase of the signal SIGA is delayed from the phase of the signal SIGC, the signal SBC becomes high level ("1") ((H) of FIG. 31) and the signal SCA becomes low level ("0") ((I) of FIG. 31) at the rising timing of the signal SAB. Therefore, the flip-flop 131 of the phase comparison circuit 130 outputs a high level signal and the flip-flop 136 outputs a low level signal. As a result, the AND circuit 134 outputs a high level signal and the AND circuit 139 outputs a low level signal.

The phase information transmitting section 97 generates the phase information IP based on the output signal of the phase comparison circuit 130 and supplies the phase information IP to the control section 87 of the transmitter 80. Then, the control section 87 sequentially sets the delay amounts of the delay sections 33A and 33C in each of the transmitting sections 11A, 12A, and 13A to adjust the phase of the signal SIGA and the phase of the signal SIGC.

Then, the control section 87 determines the delay amounts of the delay sections 33A and 33C (step S27). Specifically, the control section 87 determines the delay amounts of the delay sections 33A and 33C that allows the phase of the signal SIGA and the phase of the signal SIGB to be substantially coincident with each other.

Then, the control section 87 ends the calibration mode (step S28).

In this way, the flow is ended. After that, the delay sections 33A, 33B, and 33C in each of the transmitting sections 11A, 12A, and 13A delay the respective signals by the delay amount determined at the steps S24 and S27. In this way, the skew adjustment is performed by the transmitting sections 11A, 11B, and 11C. Accordingly, it is possible to enhance communication performance in the communication system 3.

In the communication system 3, the skew detection is performed by the phase comparison between the signals SIGA, SIGB, and SIGC. Therefore, it is possible to figure out the skew more directly as compared with the case where the skew detection is performed by the pattern comparison as with the case of the first embodiment and the like.

As described above, in the present embodiment, the skew detection is performed by the phase comparison between the signals SIGA, SIGB, and SIGC. Therefore, it is possible to figure out the skew directly. Other effects are similar to those in the above-described first embodiment.

<4. Application Example>

Next, application example of the communication system described in the above-described embodiments and the modifications will be described.

FIG. 32 illustrates an appearance of a smartphone 700 (multifunctional mobile phone) to which the communication system according to any of the above-described embodiments and the like is applied. Various devices are mounted on the smartphone 700, and the communication system according to any of the above-described embodiments and the like is applied to exchange data between the devices.

FIG. 33 illustrates a configuration example of an application processor 710 used in the smartphone 700. The application processor 710 includes a central processing unit (CPU) 711, a memory control section 712, a power control section 713, an external interface 714, a graphics processing unit (GPU) 715, a media processing section 716, a display control section 717, and a mobile industry processor interface (MIPI) interface 718. The CPU 711, the memory control section 712, the power control section 713, the external interface 714, the GPU 715, the media processing section 716, and the display control section 717 are connected to a system bus 719 and are allowed to exchange data with one another through the system bus 719 in this example.

The CPU 711 processes various information handled in the smartphone 700 according to programs. The memory control section 712 controls a memory 901 that is used in the information processing by the CPU 711. The power control section 713 controls a power source of the smartphone 700.

The external interface 714 is an interface used for communication with external devices, and is connected to a wireless communication section 902 and an image sensor 810 in this example. For example, the receiver according to any of the above-described embodiments and the like may be applied to the external interface 714. The wireless communication section 902 wirelessly communicate with a base station of a mobile phone, and may include a base band section, a radio frequency (RF) front end section, and the like. The image sensor 810 acquires an image and may include, for example, a CMOS censor.

The GPU 715 performs image processing. The media processing section 716 processes information such as audio, characters, and figures. The display control section 717 controls a display 904 through the MIPI interface 718. The MIPI interface 718 transmits an image signal to the display 904. Examples of the image signal may include a signal of YUV format and a signal of RGB format. For example, the transmitter according to any of the above-described embodiments and the like may be applied to the MIPI interface 718.

FIG. 34 illustrates a configuration example of the image sensor 810. The image sensor 810 includes a sensor section 811, an image signal processor (ISP) 812, a joint photographic experts group (JPEG) encoder 813, a CPU 814, a random access memory (RAM) 815, a read only memory (ROM) 816, a power control section 817, an inter-integrated circuit (PC) interface 818, and an MIPI interface 819. These blocks are each connected to a system bus 820 and are allowed to exchange data with one another through the system bus 820 in this example.

The sensor section 811 acquires an image and may be configured of, for example, a CMOS sensor. The ISP 812 performs predetermined processing on the image acquired by the sensor section 811. The JPEG encoder 813 encodes the image processed by the ISP 812 to generate an image of JPEG format. The CPU 814 controls each block of the image sensor 810 according to programs. The RAM 815 is a memory used in information processing by the CPU 814. The ROM 816 holds the programs executed by the CPU 814. The power control section 817 controls a power source of the image sensor 810. The FC interface 818 receives a control signal from the application processor 710. Although not illustrated, the image sensor 810 also receives a clock signal in addition to the control signal from the application processor 710. Specifically, the image sensor 810 is so configured as to operate based on clock signals of various frequencies. The MIPI interface 819 transmits an image signal to the application processor 710. Examples of the image signal may include a signal of YUV format and a signal of RGB format. For example, the transmitter according to any of the above-described embodiments and the like may be applied to the MIPI interface 819.

Hereinbefore, although the technology has been described with referring to the embodiments, the modifications, and the application example to the electronic unit, the technology is not limited thereto, and various modifications may be made.

For example, in the above-described embodiments, the transmitter 10 and the like may transmit the data to the receiver 20 and the like through the three data lanes DL1 to DL3. However, the configuration is not limited thereto, and alternatively, for example, two or less data lanes may be used or four or more data lanes may be used.

Moreover, for example, in the above-described embodiments, the three signals SIGA, SIGB, and SIGC may be transmitted in each of the data lanes DL1 to DL3. However, the configuration is not limited thereto, and four or more signals may be transmitted.

Moreover, for example, in the above-described embodiments, the control section 48E controls the delay amounts of the delay sections 50A, 50B, and 50C. However, the configuration is not limited thereto, and for example, the control section 48E may also control a phase of the clock RxCK as with a receiving section 21E illustrated in FIG. 35. The receiving section 21E includes the control section 48E and a clock generation section 43E. The control section 48E controls the delay amounts of the delay sections 50A, 50B, and 50C through the delay control signals CTLA, CTLB, and CTLC, and controls the phase of the clock RxCK through a phase control signal CTLCK. The clock generation section 43E has a function of switching the phase of the clock RxCK based on the phase control signal CTLCK. Accordingly, the receiving section 21E may sequentially set the delay amounts of the delay sections 50A, 50B, and 50C and may sequentially set the phase of the clock RxCK to determine appropriate setting, for example, in the calibration mode. Even with this configuration, effects similar to those in the above-described embodiments are obtainable.

Moreover, for example, in the above-described embodiments, the delay section 50A is disposed in a post-stage of the amplifier 42A, the delay section 50B is disposed in a post-stage of the amplifier 42B, and the delay section 50C is disposed in a post-stage of the amplifier 42C. However, the configuration is not limited thereto. Alternatively, for example, as with a receiving section 21F, a delay section 150A may be disposed in a pre-stage of the amplifier 42A, a delay section 150B may be disposed in a pre-stage of the amplifier 42B, and a delay section 150C may be disposed in a pre-stage of the amplifier 42C. The delay section 150A includes low pass filters 151 to 153, and a selector 154. The same applies to the delay sections 150B and 150C. Each of the low pass filters 151 to 153 may include, for example, a resistor and a capacitor. The selector 154 may include, for example, an analog switch. With this configuration, the delay sections 150A, 150B, and 150C switch over the number of stages of the low pass filters to adjust the delay amounts. Even with this configuration, effects similar to those in the above-described embodiments are obtainable.

Note that the effects described in the present specification are illustrative and non-limiting. Effects achieved by the technology may be effects other than those described above.

It is to be noted that the present technology is allowed to have the following configurations.

(1) A receiver comprising: a first receiving circuit configured to receive a first data including a first symbol transmitted using three signals over a first data lane, the first data lane including three signal lines respectively corresponding to the three signals, wherein the first receiving circuit includes a delay adjustment circuit configured to adjust a delay amount of at least one of the three signals.

(2) The receiver according to (1), wherein the delay adjustment circuit includes a pattern detection section configured to detect a relative delay amount of at least one of the three signals by using a synchronization code included in the first data.

(3) The receiver according to (1) or (2), wherein the first receiving circuit includes a first delay circuit, a second delay circuit, and a third delay circuit.

(4) The receiver according to (3), wherein the first receiving circuit further includes a first amplifier, a second amplifier, and a third amplifier, the first amplifier is configured to receive a first signal and a second signal of the three signals, and to output a first amplified signal to the first delay circuit, the second amplifier is configured to receive the second signal and a third signal of the three signals, and to output a second amplified signal to the second delay circuit, and the third amplifier is configured to receive the first signal and the third signal of the three signals, and to output a third amplified signal to the third delay circuit.

(5) The receiver according to (3) or (4), wherein the delay adjustment circuit includes a control section configured to adjust a delay amount of the first delay circuit using a first delay control signal, to adjust a delay amount of the second delay circuit using a second delay control signal, and to adjust a delay amount of the third delay circuit using a third delay control signal.

(6) The receiver according to any one of (1) to (5), further comprising a redundant receiving section configured to receive the first data over the first data lane, generate a first delay amount information, and output the first delay amount information to the delay adjustment circuit.

(7) The receiver according to any one of (1) to (6), wherein the first receiving circuit, in a calibration mode, is configured to: receive the first data including a delay amount data from a transmitter; perform a pattern detection to acquire the delay amount data from the first data; and determine a relative delay amount of at least one of the three signals.

(8) The receiver according to (7), wherein the first receiving circuit, in the calibration mode, is further configured to transmit the relative delay amount of at least one of the three signals to the transmitter.

(9) The receiver according to any one of (1) to (8), further comprising: a second receiving circuit configured to receive a second data including a second symbol transmitted using three signals over a second data lane, the second data lane including three signal lines respectively corresponding to the three signals; and a third receiving circuit configured to receive a third data including a third symbol transmitted using three signals over a third data lane, the third data lane including three signal lines respectively corresponding to the three signals.

(10) A transmitter comprising: a first transmitting circuit configured to transmit a first data including a first symbol transmitted using three signals over a first data lane, the first data lane including three signal lines respectively corresponding to the three signals, wherein the first transmitting circuit includes a delay adjustment circuit configured to adjust a delay amount of at least one of the three signals.

(11) The transmitter according to (10), wherein the first transmitting circuit includes a first delay circuit, a second delay circuit, and a third delay circuit.

(12) The transmitter according to (11), wherein the first transmitting circuit further includes a control section configured to control a delay amount of at least one of the first delay circuit, the second delay circuit, and the third delay circuit.

(13) The transmitter according to (12), wherein the control section is configured to receive a control signal from the delay adjustment circuit.

(14) The transmitter according to any one of (11) to (13), wherein the first transmitting circuit, in a calibration mode, is configured to: set respective delay amounts of the first delay circuit, the second delay circuit, and the third delay circuit to minimum values;
transmit the first data including a delay amount data to a receiver; receive the delay amount data from the receiver; and set the respective delay amounts of the first delay circuit, the second delay circuit, and the third delay circuit to corrected values based on the delay amount.

(15) The transmitter according to any one of (10) to (14), wherein the delay adjustment circuit is configured to adjust the delay amount in response to a delay amount information signal received from an origin external to the transmitter.

(16) The transmitter according to any one of (10) to (15), further comprising: a second transmitting circuit configured to transmit a second data including a second symbol transmitted using three signals over a second data lane, the second data lane including three signal lines respectively corresponding to the three signals; and a third transmitting circuit configured to transmit a third data including a third symbol transmitted using three signals over a third data lane, the third data lane including three signal lines respectively corresponding to the three signals.

(17) An imaging system comprising: a CMOS image sensor; and the transmitter according to any one of (10) to (16).

(18) A mobile communication device comprising: a wireless communication circuit; and the transmitter according to any one of (10) to (17).

(19) A communication system comprising: a transmitter including a first transmitting circuit configured to transmit a first data including a first symbol transmitted using three signals over a first data lane, the first data lane including three signal lines respectively corresponding to the three signals; a receiver including a first receiving circuit configured to receive the first data over the first data lane; and a delay adjustment circuit configured to adjust a delay amount of at least one of the three signals.

(20) The communication system according to (19), wherein the delay adjustment circuit is located in the receiver.

(21) The communication system according to (19) or (20), wherein the delay adjustment circuit is located in the transmitter.

(22) The communication system according to any one of (19) to (21), wherein the delay adjustment circuit includes a first delay adjustment section located in the receiver, and a second delay adjustment section located in the transmitter.

(23) The communication system according to any one of (19) to (22), wherein the first transmitting circuit includes a first delay circuit, a second delay circuit, and a third delay circuit

(24) The communication system according to (23), wherein, in a calibration mode:
the transmitter is configured to: set respective delay amounts of the first delay circuit, the second delay circuit, and the third delay circuit to minimum values, transmit the first data including a delay amount data to the receiver, receive a relative delay amount from the receiver; and set the respective delay amounts of the first delay circuit, the second delay circuit, and the third delay circuit to corrected values based on the delay amount; and the receiver is configured to: receive the first data from the transmitter, perform a pattern detection to acquire the delay amount data from the first data, determine a relative delay amount of at least one of the three signals, and transmit the relative delay amount of at least one of the three signals to the transmitter.

(25) A method of communicating data, comprising: communicating a first data including a first symbol transmitted using three signals over a first data lane, the first data lane including three signal lines respectively corresponding to the three signals; and adjusting a delay amount of at least one of the three signals.

Note that the technology may also be configured as follows.

(1)
A receiver including:
a first amplifier section configured to generate a first signal, a second signal, and a third signal, the first signal being generated based on difference between a first transmission signal and a second transmission signal, the second signal being generated based on difference between the second transmission signal and a third transmission signal, the third signal being generated based on difference between the third transmission signal and the first transmission signal, the first transmission signal, the second transmission signal, and the third transmission signal being transmitted from a transmitter;
a first delay section configured to delay each of the first signal, the second signal, and the third signal, and to change a delay amount of each of the first signal, the second signal, and the third signal; and a control section configured to set a delay amount of each of the first signal, the second signal, and the third signal in the first delay section, based on the delayed first signal, the delayed second signal, and the delayed third signal that are delayed by the first delay section.

(2)
The receiver according to (1), wherein
the transmitter uses the first transmission signal, the second transmission signal, and the third transmission signal to transmit a series of packets,
each of the packets includes a first part, a payload part, and a second part in order, and
the control section sequentially changes each of the delay amounts of the first delay section to determine one or a plurality of combinations of the delay amounts allowing a predetermined pattern included in the first part to be acquired, and sets each of the delay amounts based on the combinations.

(3)
The receiver according to (2), wherein the predetermined pattern indicates a synchronization code.

(4)
The receiver according to (2) or (3), wherein the control section determines one or a plurality of combinations of the delay amounts that allow the predetermined pattern to be acquired and not include an error in the first part.

(5)
The receiver according to any one of (1) to (4), further including:
a second amplifier configured to generate a fourth signal, a fifth signal, and a sixth signal, the fourth signal being generated based on the difference between the first transmission signal and the second transmission signal, the fifth signal being generated based on the difference between the second transmission signal and the third transmission signal, and the sixth signal being generated based on the difference between the third transmission signal and the first transmission signal; and
a second delay section configured to delay each of the fourth signal, the fifth signal, and the sixth signal, and to change a delay amount of each of the fourth signal, the fifth signal, and the sixth signal, wherein
the control section adjusts each of the delay amounts in the first delay section, also based on the delayed fourth signal, the delayed fifth signal, and the delayed sixth signal that are delayed by the second delay section.

(6)
The receiver according to any one of (1) to (5), further including
a skew information generation section configured to generate skew information based on the first signal, the second signal, and the third signal, the skew information indicating skew between the first transmission signal, the second transmission signal, and the third transmission signal, wherein
the transmitter is configured to adjust the skew between the first transmission signal, the second transmission signal, and the third transmission signal.

(7)
The receiver according to any one of (1) to (6), further including
a clock generation section configured to generate a clock signal and to adjust a phase of the clock signal to output the adjusted clock signal, the clock signal being generated based on the delayed first signal, the delayed second signal, and the delayed third signal that are delayed by the first delay section, wherein the control section sets an adjustment amount of the phase of the clock signal in the clock generation section, based on the delayed first signal, the delayed second signal, and the delayed third signal that are delayed by the first delay section.

(8)

The receiver according to any one of (1) to (7), wherein the first transmission signal, the second transmission signal, and the third transmission signal have voltage levels different from one another.

(9)

A receiver including:

a receiving section configured to receive three or more transmission signals that are transmitted from a transmitter, the transmitter being configured to adjust skew between the three or more transmission signals having voltage levels different from one another; and a skew information generation section configured to generate skew information indicating the skew between the three or more transmission signals based on a reception result of the receiving section, and to supply the skew information to the transmitter.

(10)

The receiver according to (9), wherein the transmitter uses the three or more transmission signals to transmit a series of packets, each of the packets includes a first part, a payload part, and a second part in order, and when the receiving section acquires a predetermined pattern included in the first part of one of the series of packets, the skew information generation section generates the skew information based on the payload part of the one of the packets.

(11)

The receiver according to (10), wherein a packet including the predetermined pattern in the first part, out of the series of packets, includes setting information in the payload part, the setting information indicating setting of the skew in the transmitter.

(12)

The receiver according to (11), wherein the receiving section acquires the setting information from each of the plurality of packets, and the skew information generation section supplies the plurality of pieces of setting information as the skew information to the transmitter.

(13)

The receiver according to (11), wherein the receiving section acquires the setting information from each of the plurality of packets, and the skew information generation section supplies one of the plurality of pieces of setting information as the skew information to the transmitter.

(14)

The receiver according to (9), wherein the three or more transmission signals include a first transmission signal, a second transmission signal, and a third transmission signal, and the receiving section includes a first amplifier section configured to generate a first signal, a second signal, and a third signal, the first signal being generated based on difference between the first transmission signal and the second transmission signal, the second signal being generated based on difference between the second transmission signal and the third transmission signal, and the third signal being generated based on difference between the third transmission signal and the first transmission signal, and a comparison section configured to compare transition timings of the first signal, the second signal, and the third signal.

(15)

The receiver according to (14), wherein the transmitter uses the three or more transmission signals to transmit a series of packets, each of the packets includes a first part, a payload part, and a second part in order, and the skew information generation section generates the skew information, based on a comparison result by the comparison section, the comparison result being obtained by comparison between the transition timings of signal parts corresponding to the second parts, of the first signal, the second signal, and the third signal.

(16)

The receiver according to (15), wherein the second part in each of two of the first transmission signal, the second transmission signal, and the third transmission signal transits alternately between two voltage levels.

(17)

A receiver including:

a first delay section configured to delay each of three or more transmission signals transmitted from a transmitter, and to change a delay amount of each of the three or more transmission signals, the three or more transmission signals having voltage levels different from one another; and a control section configured to set the delay amount of each of the three or more transmission signals in the first delay section, based on the three or more delayed transmission signals that are delayed by the first delay section.

(18)

A transmitter including:

a transmitting section including a plurality of delay sections corresponding to three or more transmission signals, and configured to generate the three or more transmission signals based on signals delayed by the plurality of delay sections, the three or more transmission signals having voltage levels different from one another; and a skew information acquiring section configured to acquire skew information indicating skew between the three or more transmission signals, the skew information being transmitted from a receiver receiving the three or more transmission signals, wherein the transmitting section sets a delay amount in each of the delay sections based on the skew information.

(19)

The transmitter according to (18), wherein a plurality of operation modes including a calibration mode are provided, and the transmitting section sequentially changes the delay amount of each of the delay sections to generate the three or more transmission signals in the calibration mode.

(20)

The transmitter according to (19), wherein the transmitting section uses the three or more transmission signals to transmit a series of packets, each of the packets includes a first part, a payload part, and a second part, and one of the series of packets includes a predetermined pattern in the first part and includes information about the delay amount of each of the delay sections in the payload part (21)

A communication system provided with a transmitter and a receiver, the receiver including:

a first amplifier section configured to generate a first signal, a second signal, and a third signal, the first signal being generated based on difference between a first transmission signal and a second transmission signal, the second signal being generated based on difference between the second transmission signal and a third transmission signal, the third signal being generated based on difference between the third transmission signal and the first transmission signal, and the first transmission signal, the second transmission signal, and the third transmission signal being transmitted from the transmitter;

a first delay section configured to delay each of the first signal, the second signal, and the third signal, and to change a delay amount of each of the first signal, the second signal, and the third signal; and a control section configured to set a delay amount of each of the first signal, the second signal, and the third signal in the first delay section, based on the delayed first signal, the delayed second signal, and the delayed third signal that are delayed by the first delay section.

(22)

The communication system according to (21), wherein the transmitter is an image sensor acquiring and transmitting image data, and the receiver is a processor that receives the image data and performs predetermined processing based on the image data.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST 1 to 3, 1A, 1C Communication system
7A to 7C, 8A to 8C, 9A to 9C Transmission path
10, 10A, 60, 80, 200 Transmitter
11 to 13, 11A to 13A Transmitting section
14, 64 Transmission data generation section
15 Signal generation section
16 Flip-flop (F/F)
17A Delay amount information receiving section
20, 20A, 20C, 70, 90 Receiver
21 to 23, 21A to 23A, 21C to 23C, 21D to 23D, 21E to 23E, 21F to 23F, 71 to 73, 91 to 93 Receiving section
27A Delay amount information transmitting section
28C Receiving section
30, 30A Output section
31 Output control section
32A, 32B, 32C Driver
33A to 33C Delay section
39 Control section
41A to 41C Resistor
42A to 42C Amplifier
43, 43E Clock generation section
44, 45 Flip-flop (F/F)
46 Signal generation section
47, 79 Pattern detection section
48, 48A, 48C, 48D, 48E, 58C Control section
50A to 50C, 150A to 150C Delay section
51 to 53 Delay buffer
54 Selector
55A to 55C Selector
67 Control section
77 Delay amount data transmitting section
87 Control section
97 Phase information transmitting section
100 Printed circuit board
101 Pattern wiring
102 Connector
110, 120 Chip
130 Phase comparison circuit
131 to 133, 136 to 138 Flip-flop (F/F)
134, 139 AND circuit
CH1 to CH5 Channel
CN, NS Symbol
CTLA to CTLC Delay control signal
CTLCK Phase control signal
DD Delay amount data
DET, SIGA to SIGC, SIG1A to SIG1C, SIG2A to SGI2C, SIG3A to SIG3C, RxF, RxR, RxP, S1, S2, TxF, TxR, TxP Signal
DL1 to DL3 Data lane
ID, ID1 to ID3 Delay amount data
IP, IP1 to IP3 Phase information
IS, IS1 to IS3 Delay amount information
IT1 to IT3 Control signal
P1 SoT part
P2 Header part
P3 Payload part
P4 Footer part
P5 EoT part
P11 Preamble
P12, P13 Synchronization code
P21 Error detection code
P31 Delay amount data
P41 Error detection code
P42 Filler
P51 Post code
PCT1, PCT2 Packet
RxCK, TxCK Clock
SEL Data lane selection signal
TinA, TinB, TinC Input terminal
ToutA, ToutB, ToutC Output terminal
VH High level voltage
VM Middle level voltage
VL Low level voltage

The invention claimed is:

1. A receiver comprising:

a first receiving circuit configured to receive a first data including a first symbol transmitted using three signals over a first data lane, the first data lane including three signal lines respectively corresponding to the three signals, wherein the first receiving circuit includes a first delay circuit, a second delay circuit, and a third delay circuit, and wherein the first receiving circuit includes:
a first amplifier configured to receive a first signal and a second signal of the three signals, and to output a first amplified signal to the first delay circuit,
a second amplifier configured to receive the second signal and a third signal of the three signals, and to output a second amplified signal to the second delay circuit, and
a third amplifier configured to receive the first signal and the third signal of the three signals, and to output a third amplified signal to the third delay circuit.

2. The receiver according to claim 1, wherein the first receiving circuit includes a delay adjustment circuit configured to adjust a delay amount of at least one of the three signals, and the delay adjustment circuit includes a pattern detection section configured to detect a relative delay amount of at least one of the three signals by using a synchronization code included in the first data.

3. The receiver according to claim 1, wherein
the first receiving circuit includes a delay adjustment circuit configured to adjust a delay amount of at least one of the three signals, and
the delay adjustment circuit includes a control section configured to adjust a delay amount of the first delay circuit using a first delay control signal, to adjust a delay amount of the second delay circuit using a second delay control signal, and to adjust a delay amount of the third delay circuit using a third delay control signal.

4. The receiver according to claim 1, wherein
the first receiving circuit includes a delay adjustment circuit configured to adjust a delay amount of at least one of the three signals, and
the receiver further comprises a redundant receiving section configured to receive the first data over the first data lane, generate a first delay amount information, and output the first delay amount information to the delay adjustment circuit.

5. The receiver according to claim 1, wherein the first receiving circuit, in a calibration mode, is configured to:
receive the first data including a delay amount data from a transmitter;
perform a pattern detection to acquire the delay amount data from the first data; and
determine a relative delay amount of at least one of the three signals.

6. The receiver according to claim 5, wherein the first receiving circuit, in the calibration mode, is further configured to transmit the relative delay amount of at least one of the three signals to the transmitter.

7. The receiver according to claim 1, further comprising:
a second receiving circuit configured to receive a second data including
a second symbol transmitted using three signals over a second data lane, the second data lane including three signal lines respectively corresponding to the three signals; and
a third receiving circuit configured to receive a third data including a third symbol transmitted using three signals over a third data lane, the third data lane including three signal lines respectively corresponding to the three signals.

8. A transmitter comprising:
a first transmitting circuit configured to transmit a first data including a first symbol transmitted using three signals over a first data lane, the first data lane including three signal lines respectively corresponding to the three signals,
wherein the first transmitting circuit includes a first delay circuit, a second delay circuit, and a third delay circuit, and
wherein the first transmitting circuit includes:
a first amplifier configured to receive a first signal and a second signal of the three signals, and to output a first amplified signal to the first delay circuit,
a second amplifier configured to receive the second signal and a third signal of the three signals, and to output a second amplified signal to the second delay circuit, and
a third amplifier configured to receive the first signal and the third signal of the three signals, and to output a third amplified signal to the third delay circuit.

9. The transmitter according to claim 8, wherein the first transmitting circuit further includes a control section configured to control a delay amount of at least one of the first delay circuit, the second delay circuit, and the third delay circuit.

10. The transmitter according to claim 9, wherein
the first transmitting circuit includes a delay adjustment circuit configured to adjust a delay amount of at least one of the three signals, and
the control section is configured to receive a control signal from the delay adjustment circuit.

11. The transmitter according to claim 8, wherein the first transmitting circuit, in a calibration mode, is configured to:
set respective delay amounts of the first delay circuit, the second delay circuit, and the third delay circuit to minimum values;
transmit the first data including a delay amount data to a receiver;
receive the delay amount data from the receiver; and
set the respective delay amounts of the first delay circuit, the second delay circuit, and the third delay circuit to corrected values based on the delay amount.

12. The transmitter according to claim 8, wherein
the first transmitting circuit includes a delay adjustment circuit configured to adjust a delay amount of at least one of the three signals, and
the delay adjustment circuit is configured to adjust the delay amount in response to a delay amount information signal received from an origin external to the transmitter.

13. The transmitter according to claim 8, further comprising:
a second transmitting circuit configured to transmit a second data including a second symbol transmitted using three signals over a second data lane, the second data lane including three signal lines respectively corresponding to the three signals; and
a third transmitting circuit configured to transmit a third data including a third symbol transmitted using three signals over a third data lane, the third data lane including three signal lines respectively corresponding to the three signals.

14. An imaging system comprising:
a CMOS image sensor; and
the transmitter according to claim 8.

15. A mobile communication device comprising:
a wireless communication circuit; and
the transmitter according to claim 8.

16. A communication system comprising:
a transmitter including a first transmitting circuit configured to transmit a first data including a first symbol transmitted using three signals over a first data lane, the first data lane including three signal lines respectively corresponding to the three signals; and
a receiver including a first receiving circuit configured to receive the first data over the first data lane
wherein the first transmitting circuit and/or the first receiving circuit respectively includes a first delay circuit, a second delay circuit, and a third delay circuit, and
wherein the first transmitting circuit and/or the first receiving circuit respectively includes:
a first amplifier configured to receive a first signal and a second signal of the three signals, and to output a first amplified signal to the first delay circuit, a second amplifier configured to receive the second signal and a third signal of the three signals, and to output a second amplified signal to the second delay circuit, and a third amplifier configured to receive the first signal and the third signal of the three signals, and to output a third amplified signal to the third delay circuit.

17. The communication system according to claim 16, wherein the receiver includes a delay adjustment circuit configured to adjust a delay amount of at least one of the three signals.

18. The communication system according to claim 16, wherein the transmitter includes a delay adjustment circuit configured to adjust a delay amount of at least one of the three signals.

19. The communication system according to claim 16, wherein the receiver includes a first delay adjustment section configured to adjust a delay amount of at least one of the three signals, and the transmitter includes a second delay adjustment section configured to adjust the delay amount of at least one of the three signals.

20. The communication system according to claim 16, wherein, in a calibration mode:

the transmitter is configured to:
set respective delay amounts of the first delay circuit, the second delay circuit, and the third delay circuit to minimum values,
transmit the first data including a delay amount data to the receiver, receive a relative delay amount from the receiver; and
set the respective delay amounts of the first delay circuit, the second delay circuit, and the third delay circuit to corrected values based on the delay amount; and the receiver is configured to:
receive the first data from the transmitter,
perform a pattern detection to acquire the delay amount data from the first data,
determine a relative delay amount of at least one of the three signals, and
transmit the relative delay amount of at least one of the three signals to the transmitter.

* * * * *